US009496340B2

(12) United States Patent
Takeuchi et al.

(10) Patent No.: US 9,496,340 B2
(45) Date of Patent: *Nov. 15, 2016

(54) SEMICONDUCTOR DEVICE, ANTENNA SWITCH CIRCUIT, AND RADIO COMMUNICATION APPARATUS

(71) Applicant: Sony Corporation, Tokyo (JP)

(72) Inventors: Katsuhiko Takeuchi, Kanagawa (JP); Satoshi Taniguchi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/955,887

(22) Filed: Dec. 1, 2015

(65) Prior Publication Data

US 2016/0087038 A1 Mar. 24, 2016

Related U.S. Application Data

(63) Continuation of application No. 14/268,758, filed on May 2, 2014, now Pat. No. 9,264,998.

(30) Foreign Application Priority Data

May 8, 2013 (JP) .................................. 2013-098079
Oct. 30, 2013 (JP) .................................. 2013-225833

(51) Int. Cl.
| H04B 1/44 | (2006.01) |
| H01L 29/10 | (2006.01) |
| H01L 29/205 | (2006.01) |
| H01L 29/778 | (2006.01) |
| H04W 52/02 | (2009.01) |
| H01L 29/66 | (2006.01) |
| H01L 29/06 | (2006.01) |

(Continued)

(52) U.S. Cl.
CPC ....... *H01L 29/1029* (2013.01); *H01L 29/0692* (2013.01); *H01L 29/205* (2013.01); *H01L 29/41758* (2013.01); *H01L 29/66462* (2013.01); *H01L 29/7786* (2013.01); *H04B 1/44* (2013.01); *H04B 1/48* (2013.01); *H04W 52/0229* (2013.01)

(58) Field of Classification Search
CPC ............. H01L 29/0694; H01L 29/205; H01L 29/7796; H01L 29/7786; H01L 29/7783; H01L 29/1079; H01L 29/4232; H01L 29/6642; H01L 29/06926; H04B 1/44; H04W 52/0229
USPC ......................................................... 455/83
See application file for complete search history.

(56) References Cited

U.S. PATENT DOCUMENTS 6,365,925 B2 4/2002 Hase et al.
6,380,602 B1 4/2002 Fujisawa et al.
(Continued)

FOREIGN PATENT DOCUMENTS

JP 11-150264 6/1999

*Primary Examiner* — Marceau Milord
(74) *Attorney, Agent, or Firm* — Dentons US LLP

(57) ABSTRACT

A semiconductor device includes: a laminated body including a channel layer that is configured of a compound semiconductor; and at least one gate electrode that is provided on a top surface side of the laminated body, wherein the laminated body includes a first low-resistance region that is provided on the top surface side of the laminated body, the first low-resistance region facing the at least one gate electrode, and a second low-resistance region that is provided externally of the first low resistance region on the top surface side of the laminated body, the second low-resistance region being continuous with the first low-resistance region.

21 Claims, 56 Drawing Sheets

(51) Int. Cl.
*H01L 29/417* (2006.01)
*H04B 1/48* (2006.01)

(56) References Cited

U.S. PATENT DOCUMENTS

| | | | |
|---|---|---|---|
| 6,946,691 B2 | 9/2005 | Nakamoto | |
| 6,989,522 B2 | 1/2006 | Nishimura | |
| 7,706,756 B2 | 4/2010 | Sato et al. | |
| 8,354,674 B2 * | 1/2013 | Kimura | H01L 27/1214 257/51 |
| 8,421,069 B2 | 4/2013 | Yamazaki et al. | |
| 8,466,494 B2 | 6/2013 | Tamari | |
| 8,569,769 B2 | 10/2013 | Hwang et al. | |
| 8,624,245 B2 * | 1/2014 | Yamazaki | H01L 27/1225 257/59 |
| 8,698,202 B2 | 4/2014 | Mitsunaga et al. | |
| 8,803,142 B2 * | 8/2014 | Yamazaki | H01L 27/10873 257/295 |
| 8,803,272 B2 | 8/2014 | Yumoto et al. | |
| 8,809,850 B2 * | 8/2014 | Yamazaki | H01L 27/0688 257/43 |
| 8,896,028 B2 | 11/2014 | Mitsunaga et al. | |
| 8,927,349 B2 | 1/2015 | Yamazaki | |
| 9,012,918 B2 * | 4/2015 | Yamazaki | H01L 27/1225 257/53 |
| 9,117,916 B2 * | 8/2015 | Hatano | H01L 29/42384 |
| 9,202,923 B2 * | 12/2015 | Yamazaki | H01L 21/02554 |
| 2007/0284624 A1 | 12/2007 | Iwai | |
| 2010/0246750 A1 | 9/2010 | Kimura et al. | |
| 2013/0062664 A1 | 3/2013 | Takeuchi et al. | |

\* cited by examiner

SEMICONDUCTOR DEVICE, ANTENNA SWITCH CIRCUIT, AND RADIO COMMUNICATION APPARATUS

CROSS REFERENCE TO RELATED APPLICATIONS

This application is a continuation of U.S. patent application Ser. No. 14/268,758 filed May 2, 2014, the entirety of which is incorporated herein by reference to the extent permitted by law. This application claims the benefits of Japanese Priority Patent Applications JP 2013-098079 filed on May 8, 2013 and JP 2013-225833 filed on Oct. 30, 2013, the entire contents of each of which are incorporated herein by reference.

BACKGROUND

The present technology relates to a semiconductor device, an antenna switch circuit, and a radio communication apparatus. More specifically, the present technology relates to a semiconductor device having a channel layer that is configured of a compound semiconductor, an antenna switch circuit that includes such a semiconductor device, and a radio communication apparatus that includes such an antenna switch circuit.

In recent years, in a mobile communication system such as a mobile phone, reduction in size and power consumption of a mobile communication terminal has been important considerations. To fulfill such considerations, for example, concerning an antenna switch, reduction in on-resistance Ron and off-capacitance Coff, and the like may be preferred. One of devices that have been currently put to practical use for such an antenna switch is a JPHEMT (Junction Pseudomorphic High Electron Mobility Transistor).

The JPHEMT is a semiconductor device that performs current modulation utilizing a p-n junction and a heterojunction. Such a semiconductor device includes a heterojunction with a channel layer made of, for example, InGaAs and a barrier layer (AlGaAs) made of, for example, AlGaAs that is wider than the channel layer (InGaAs) in a bandgap. Inside the barrier layer (AlGaAs), a first low-resistance region containing reverse-conductivity impurities is provided on a surface layer on the opposite side of the channel layer, and a gate electrode is connected with this first low-resistance region. Further, inside the barrier layer (AlGaAs), a carrier supply region containing impurities that serve as carriers is provided on the channel layer side that is away from the first low-resistance region. Furthermore, a source electrode and a drain electrode are ohmic-bonded to the barrier layer (AlGaAs) on both sides of the first low-resistance region and the gate electrode.

In the semiconductor device that is configured as described above, a two-dimensional electron gas layer in which electrons serving as carriers are confined in a high concentration is formed at an interface on the side of the barrier layer in the channel layer. By applying a voltage to the gate electrode to control the concentration of the two-dimensional electron gas layer, a current is modulated that flows between the source electrode and the drain electrode via a channel layer portion on the lower side of the first low-resistance region (for example, see Japanese Unexamined Patent Application Publication No. H11-150264).

SUMMARY

In the above-described semiconductor device, an increase in the impurity concentration of the carrier supply region that is provided inside the barrier layer leads to an increase in the carrier concentration of the two-dimensional electron gas layer inside the channel layer, which makes it possible to reduce the on-resistance Ron. On the other hand, with an increase in the carrier concentration of the two-dimensional electron gas layer, it is less likely that a depletion layer will extend between the first low-resistance region inside the barrier layer and the channel layer, resulting in an increase in the off-capacitance Coff. Further, it is more likely that electric field concentration at a P-N junction will occur, resulting in a decrease in the breakdown voltage in an off state. That is, there is a trade-off relationship between on-operation (Ron) and off-operation (Coff, breakdown voltage). This has made it difficult to increase the carrier concentration inside the channel layer by increasing the impurity concentration of the carrier supply region.

It is desirable to provide a semiconductor device capable of reducing an off-capacitance, an antenna switch circuit that includes such a semiconductor device, and a radio communication apparatus that includes such an antenna switch circuit.

According to an embodiment of the present technology, there is provided a semiconductor device including: a laminated body including a channel layer that is configured of a compound semiconductor; and at least one gate electrode that is provided on a top surface side of the laminated body, wherein the laminated body includes a first low-resistance region that is provided on the top surface side of the laminated body, the first low-resistance region facing the at least one gate electrode, and a second low-resistance region that is provided externally of the first low resistance region on the top surface side of the laminated body, the second low-resistance region being continuous with the first low-resistance region.

In the semiconductor device according to the above-described embodiment of the present technology, the second low-resistance region is provided externally of the first low-resistance region, and is continuous with the first low-resistance region. Therefore, a carrier depletion region that is formed in the channel layer at the time of off-operation is extended to a region on the lower side of the second low-resistance region as well in addition to a region directly below the gate electrode. As a result, even when the carrier concentration inside the channel layer is increased to reduce the on-resistance Ron, a width of a depletion layer at the time of off-operation is increased to reduce the off-capacitance Coff.

According to an embodiment of the present technology, there is provided an antenna switch circuit including: a first terminal configured to receive a transmission signal as an input; a second terminal that is connected with an antenna; a third terminal configured to output a receiving signal that is received at the antenna; a first switching device that is connected between the first terminal and the second terminal; and a second switching device that is connected between the second terminal and the third terminal, wherein the first switching device is put in a condition state and the second switching device is put in a non-conduction state at the time of signal transmission, while the first switching device is put in a non-conduction state and the second switching device is put in a conduction state at the time of signal reception, and one or both of the first switching device and the second switching device include a laminated body including a channel layer that is configured of a compound semiconductor, and at least one gate electrode that is provided on a top surface side of the laminated body, wherein the laminated body includes a first low-resistance region that is provided on the top surface side of the laminated body, the first low-resistance region facing the at least one gate electrode, and a second low-resistance region that is provided externally of the first low resistance region on the top surface side of the laminated body, the second low-resistance region being continuous with the first low-resistance region.

In the antenna switch circuit according to the above-described embodiment of the present technology, at the time of signal transmission, the first switching device is put in a conduction state and the second switching device is put in a non-conduction state, and a transmitting signal is input from the first terminal to be output to the second terminal via the first switching device. At the time of signal reception, the first switching device is put in a non-conduction state and the second switching device is put in a conduction state, and a receiving signal that is received at the antenna is input from the second terminal to be output to the third terminal via the second switching device.

According to an embodiment of the present technology, there is provided a radio communication apparatus provided with an antenna and an antenna switch circuit configured to perform switching of input of a transmitting signal to the antenna or output of a receiving signal that is received at the antenna, the antenna switch circuit including: a first terminal configured to receive a transmission signal as an input; a second terminal that is connected with an antenna; a third terminal configured to output a receiving signal that is received at the antenna; a first switching device that is connected between the first terminal and the second terminal; and a second switching device that is connected between the second terminal and the third terminal, wherein the first switching device is put in a condition state and the second switching device is put in a non-conduction state at the time of signal transmission, while the first switching device is put in a non-conduction state and the second switching device is put in a conduction state at the time of signal reception, and one or both of the first switching device and the second switching device include a laminated body including a channel layer that is configured of a compound semiconductor, and at least one gate electrode that is provided on a top surface side of the laminated body, wherein the laminated body includes a first low-resistance region that is provided on the top surface side of the laminated body, the first low-resistance region facing the at least one gate electrode, and a second low-resistance region that is provided externally of the first low resistance region on the top surface side of the laminated body, the second low-resistance region being continuous with the first low-resistance region.

In the radio communication apparatus according to the above-described embodiment of the present technology, input of a transmitting signal to the antenna or output of a receiving signal that is received at the antenna is switched by the antenna switch circuit.

According to the semiconductor device of the above-described embodiment of the present technology, the second low-resistance region is provided externally of the first low-resistance region, and is continuous with the first low-resistance region. Thus, it is possible to increase a width of the depletion layer at the time of off-operation, thereby allowing the off-capacitance Coff to be reduced.

According to the antenna switch circuit and the radio communication apparatus of the above-described respective embodiments of the present technology, one or both of the first switching device and the second switching device in the antenna switch circuit are configured of the semiconductor device according to the above-described embodiment of the present technology, which leads to reduction in the off-capacitance Coff and excellence in the harmonic distortion characteristics of the first switching device or the second switching device. As a result, it is possible to reduce in size and power consumption of the radio communication apparatus.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the present technology.

Figure 7:
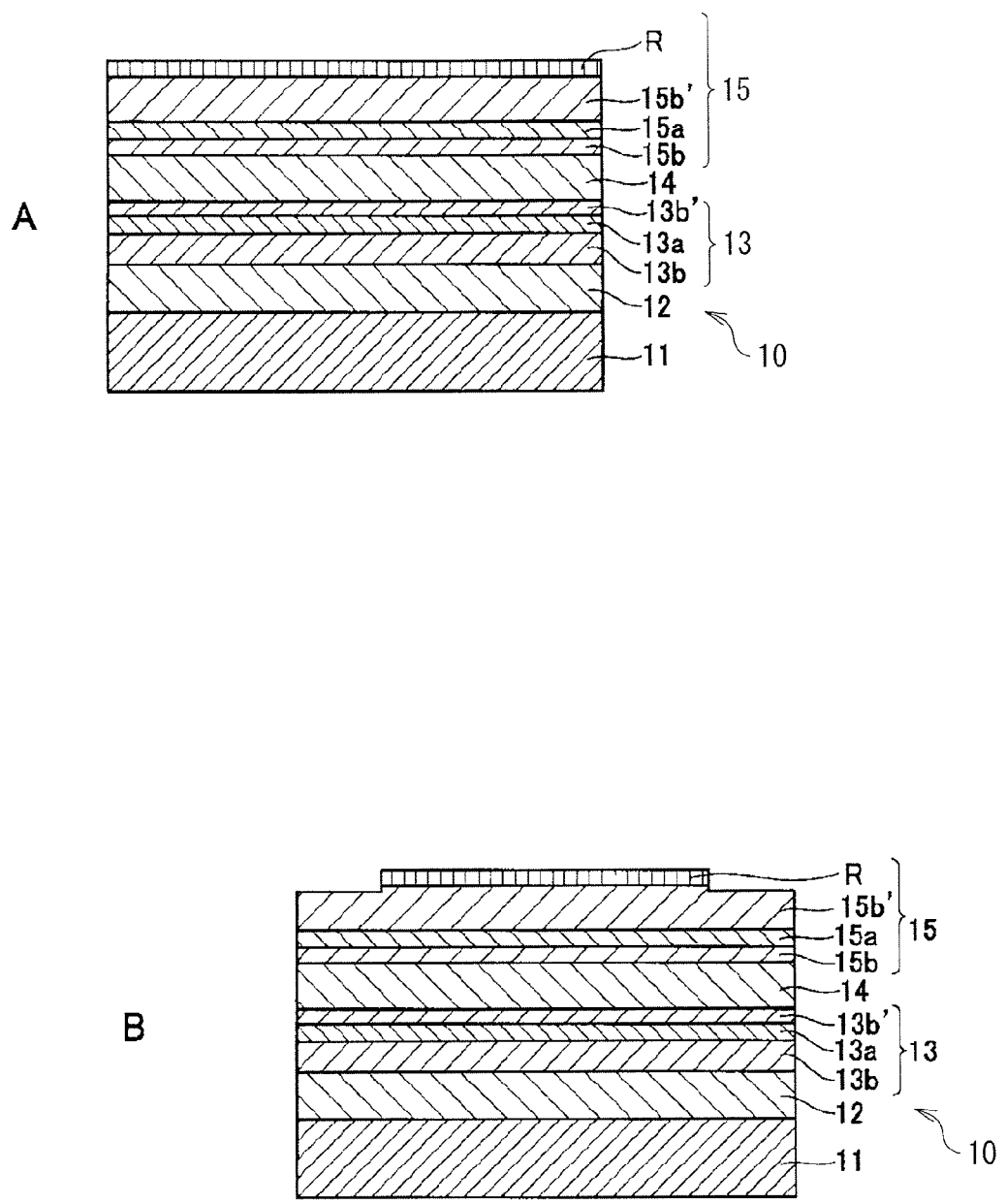

A and B of FIG. 7 are each a cross-sectional process diagram (Part 1) showing manufacturing procedures of the semiconductor device according to the first embodiment of the present technology.

Figure 8:
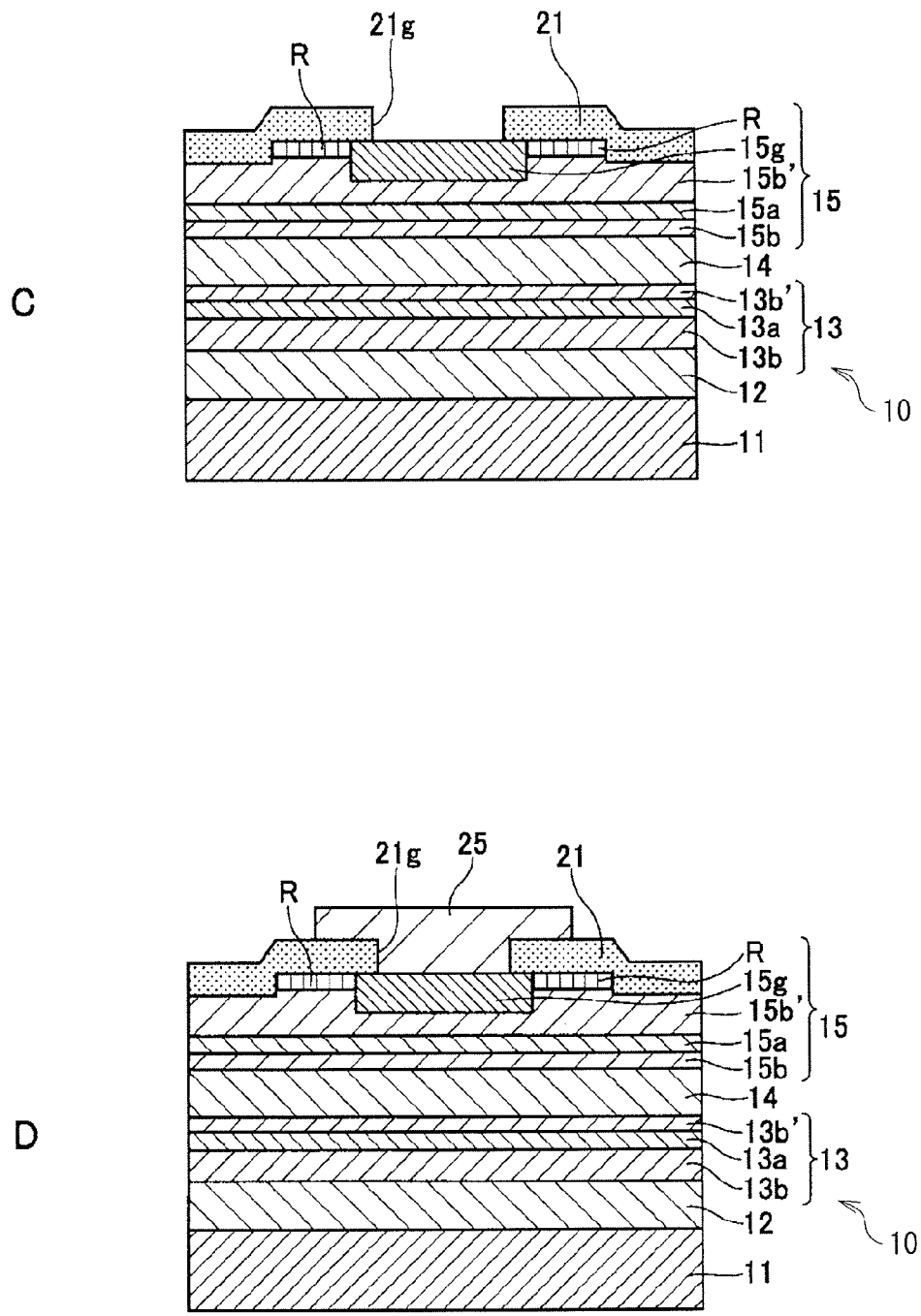

C and D of FIG. 8 are each a cross-sectional process diagram (Part 2) showing manufacturing procedures of the semiconductor device according to the first embodiment of the present technology.

Figure 9:
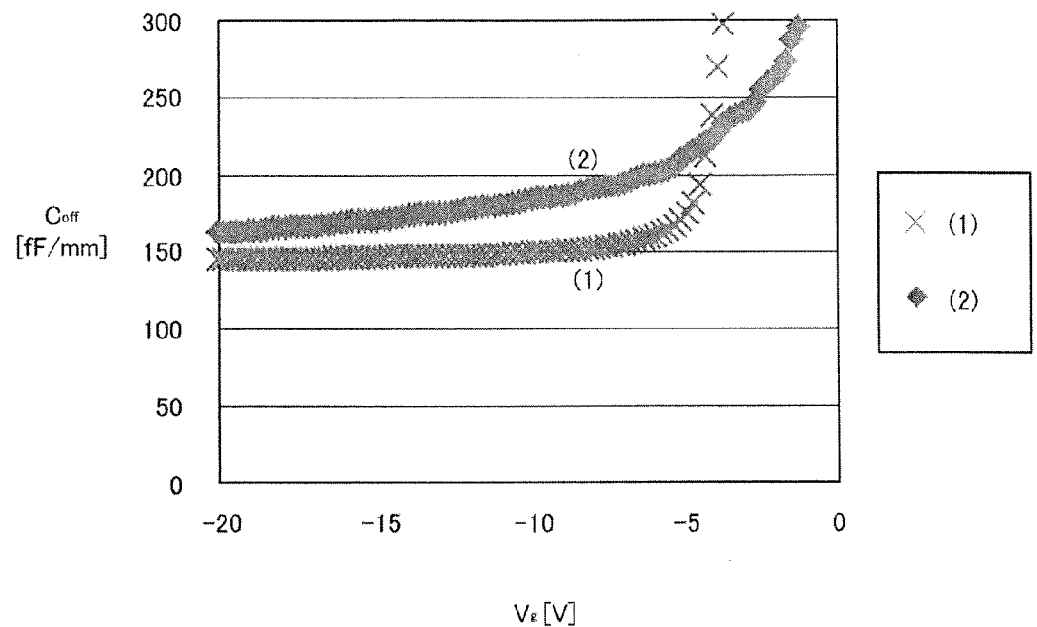

FIG. 9 is a graphic chart showing a result of simulation for gate voltage Vg versus off-capacitance Coff that is carried out for the semiconductor device according to the first embodiment of the present technology and a semiconductor device adopting an existing configuration.

Figure 10:
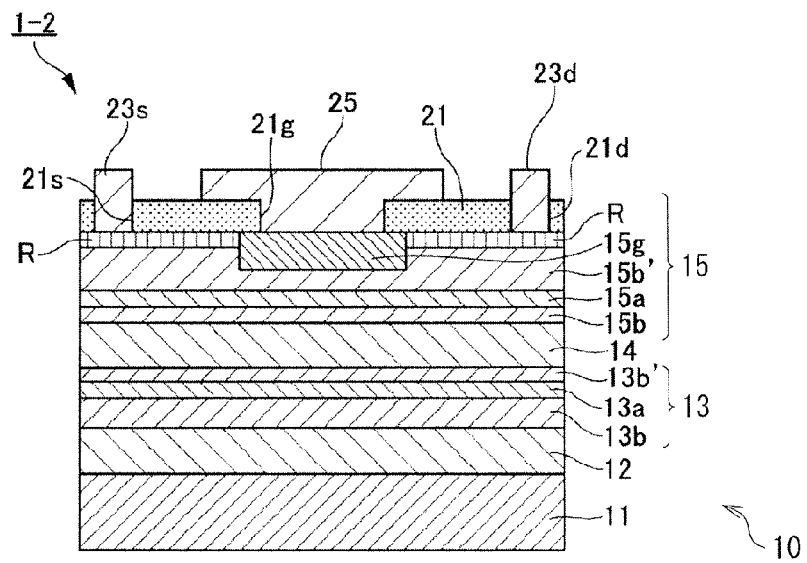

FIG. 10 is a cross-sectional view showing a configuration of a substantial part of a semiconductor device according to a second embodiment of the present technology.

Figure 11:
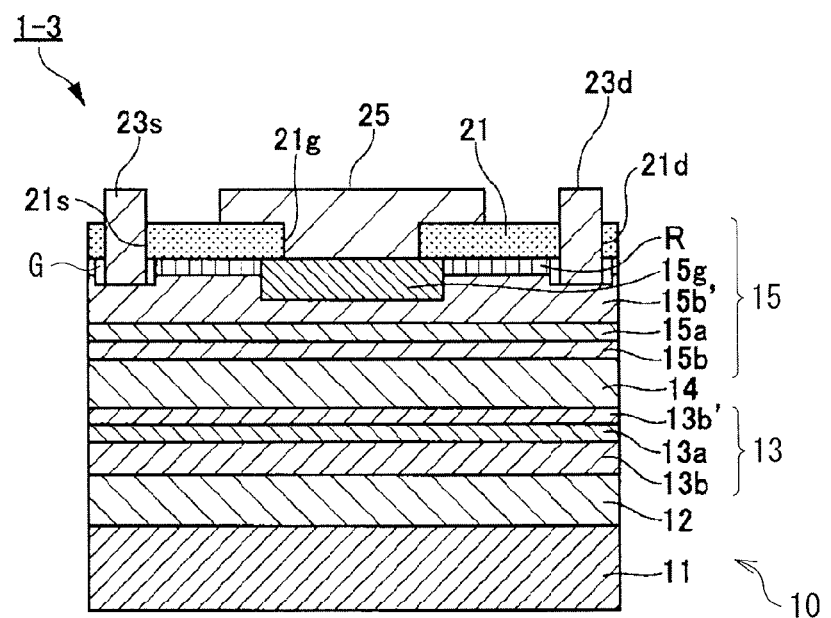

FIG. 11 is a cross-sectional view showing a configuration of a substantial part of a semiconductor device according to a third embodiment of the present technology.

Figure 12:
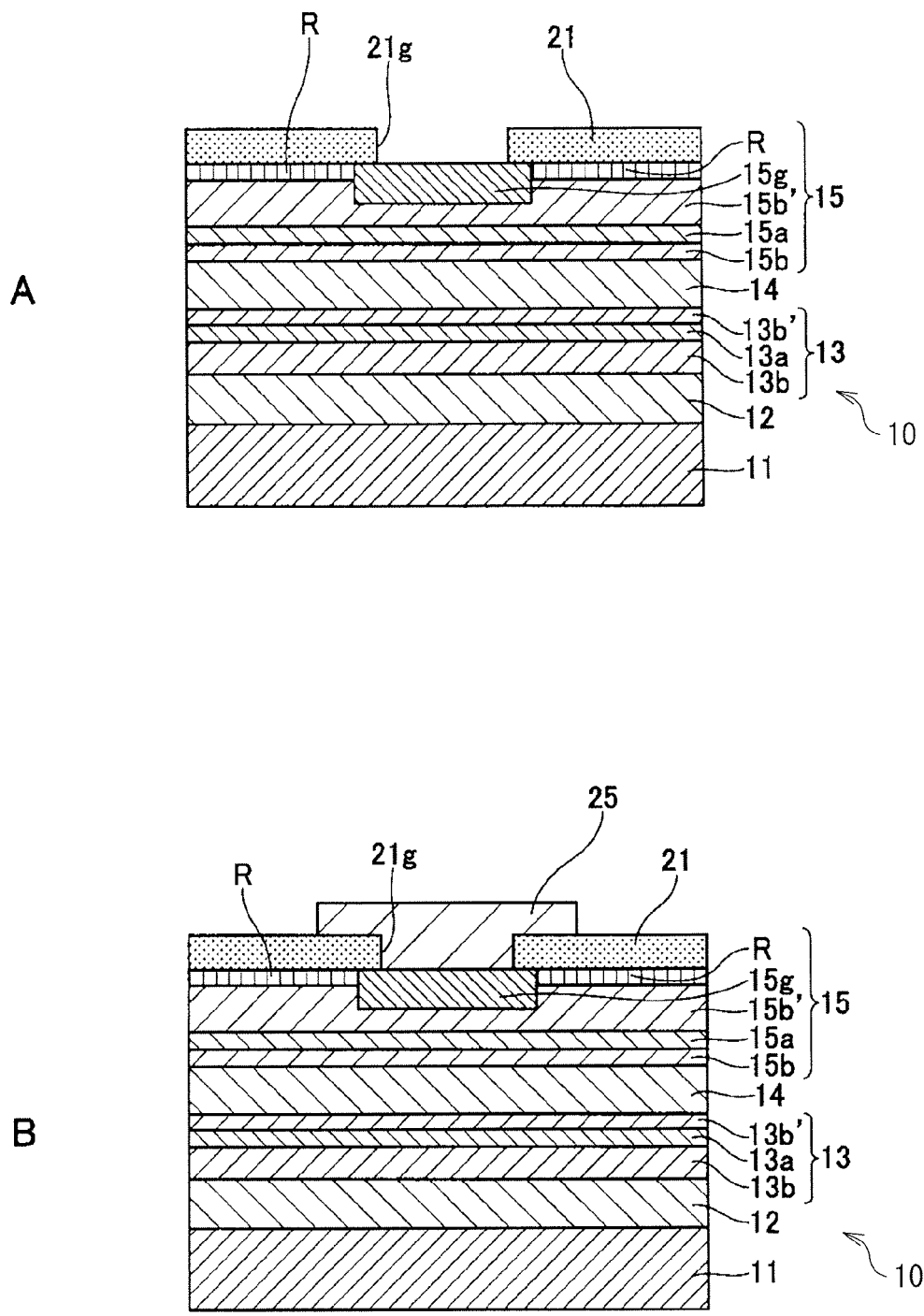

A and B of FIG. 12 are each a cross-sectional process diagram (Part 1) showing manufacturing procedures of the semiconductor device according to the third embodiment of the present technology.

Figure 13:
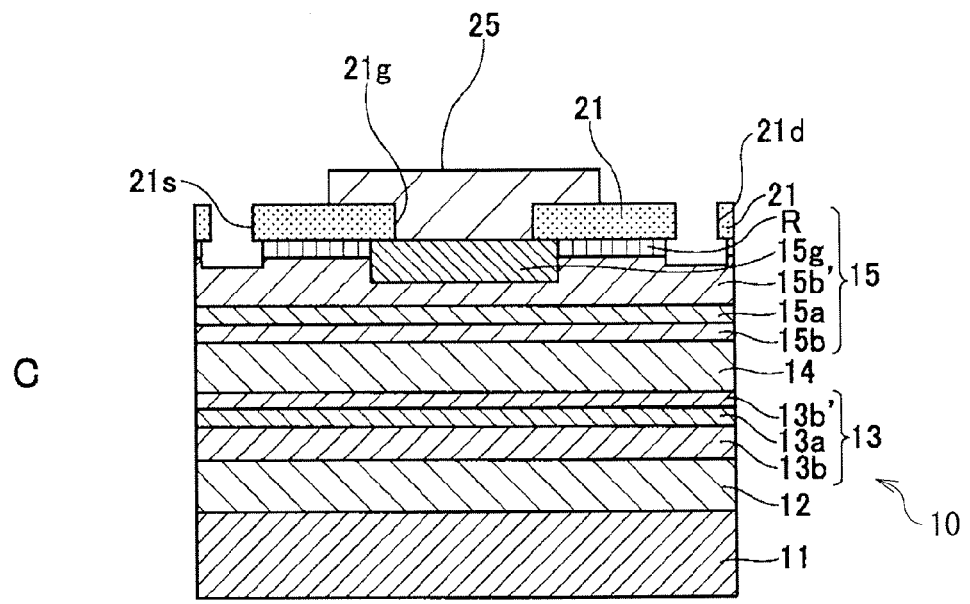

C of FIG. 13 is a cross-sectional process diagram (Part 2) showing manufacturing procedures of the semiconductor device according to the third embodiment of the present technology.

Figure 14:
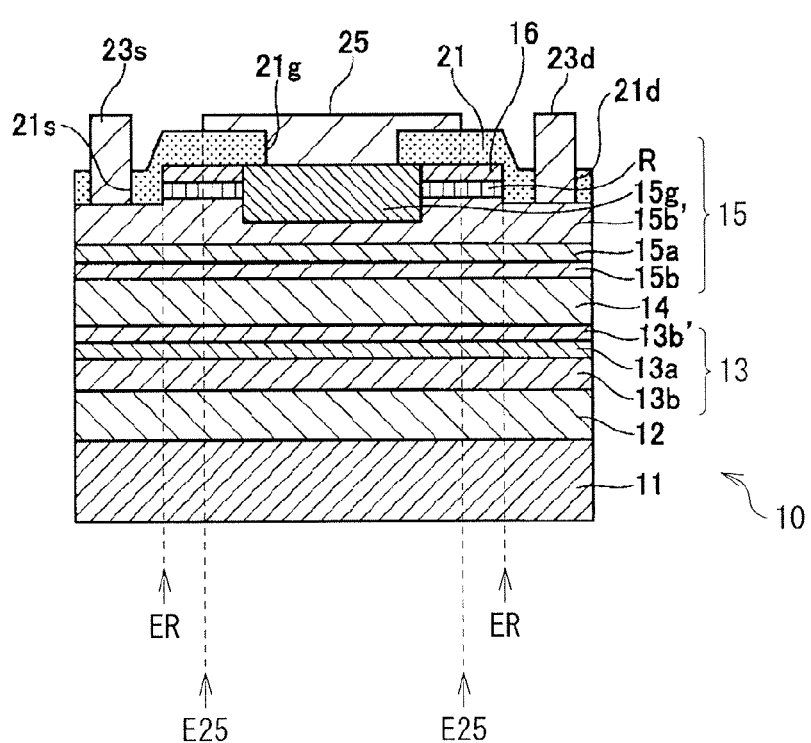

FIG. 14 is a cross-sectional view showing a configuration of a substantial part of a semiconductor device according to a fourth embodiment of the present technology.

Figure 15:
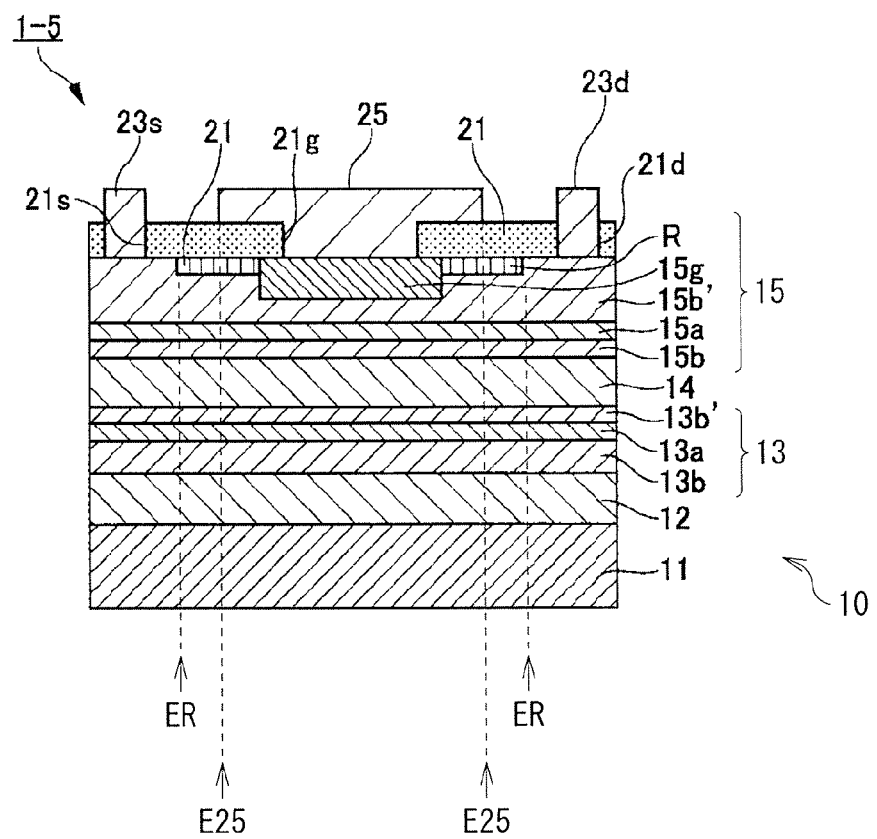

FIG. 15 is a cross-sectional view showing a configuration of a substantial part of a semiconductor device according to a fifth embodiment of the present technology.

Figure 16:
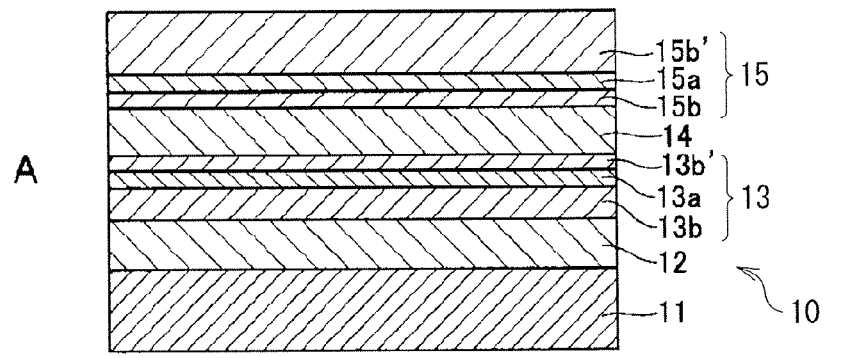
Figure 16:
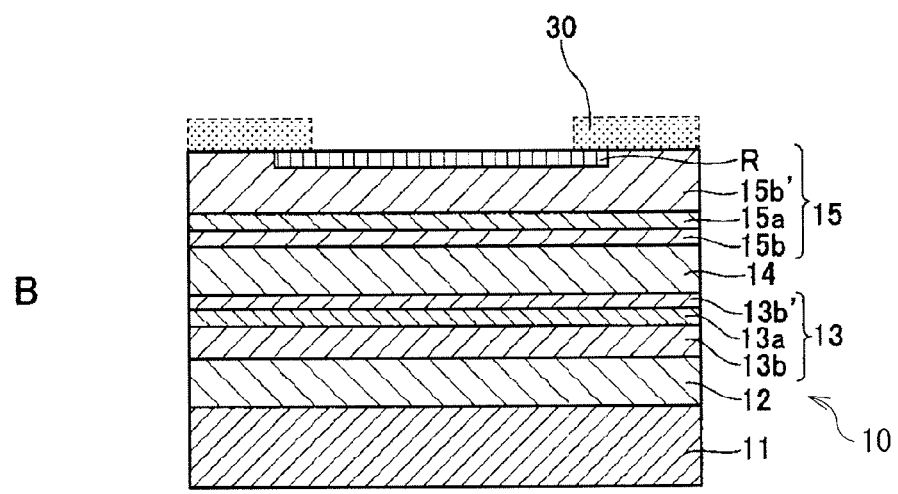

A and B of FIG. 16 are each a cross-sectional process diagram (Part 1) showing manufacturing procedures of the semiconductor device according to the fifth embodiment of the present technology.

Figure 17:
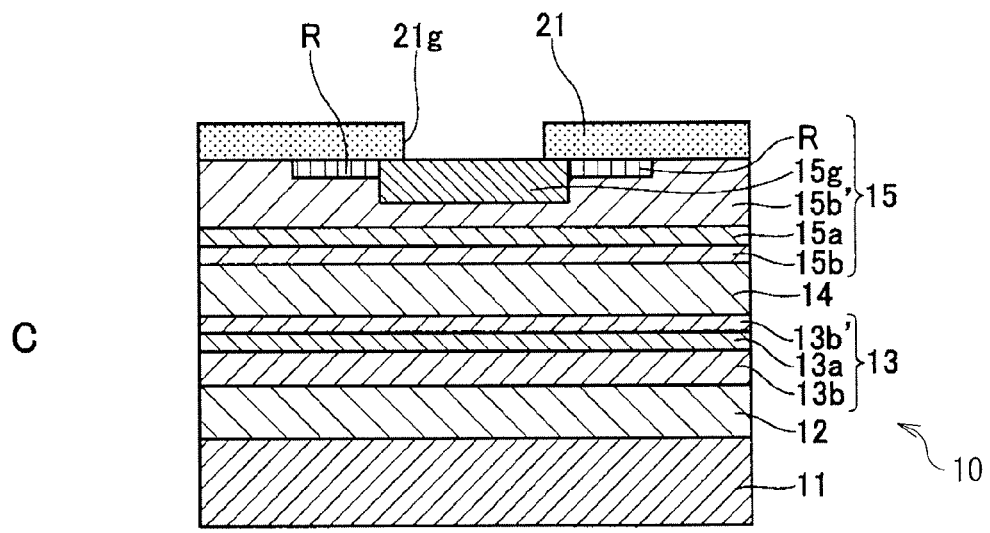
Figure 17:
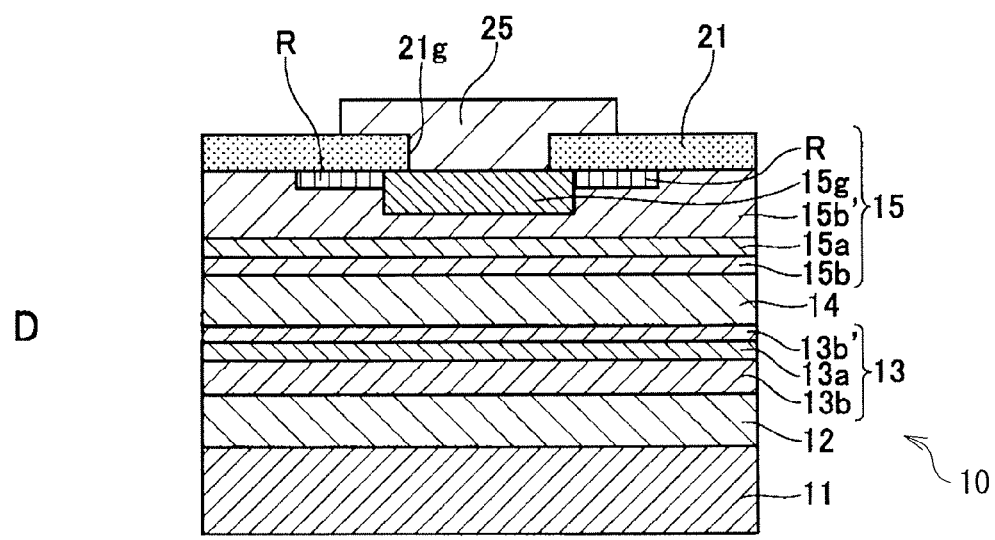

C and D of FIG. 17 are each a cross-sectional process diagram (Part 2) showing manufacturing procedures of the semiconductor device according to the fifth embodiment of the present technology.

Figure 18:
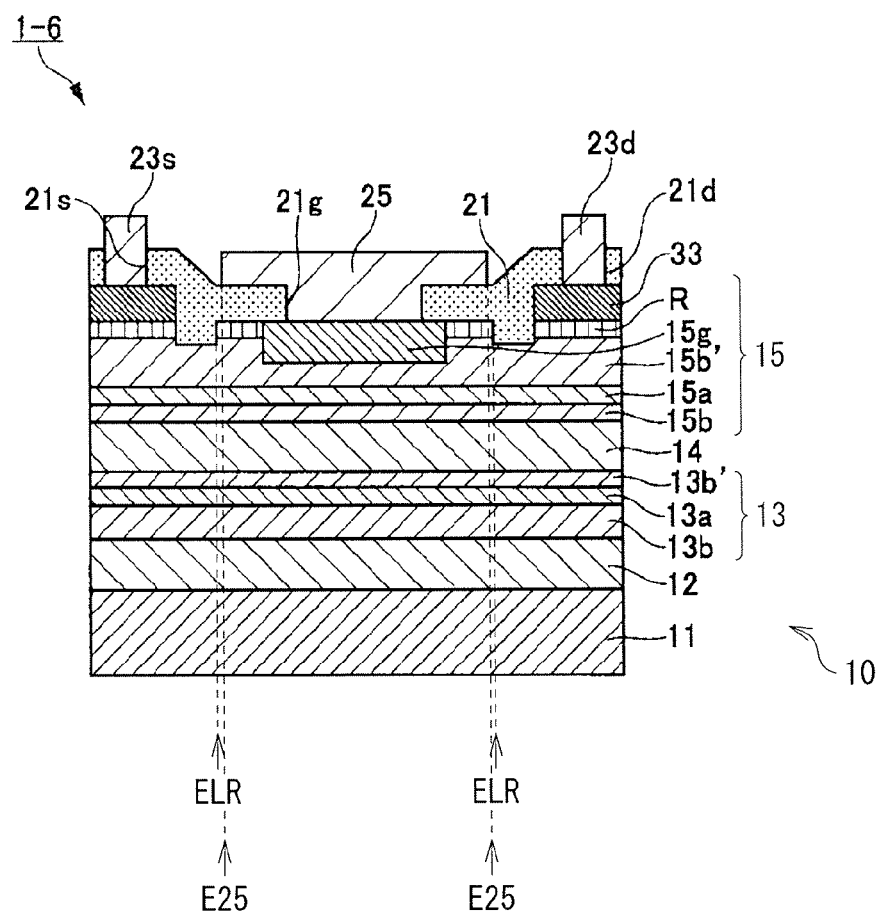

FIG. 18 is a cross-sectional view showing a configuration of a substantial part of a semiconductor device according to a sixth embodiment of the present technology.

Figure 19:
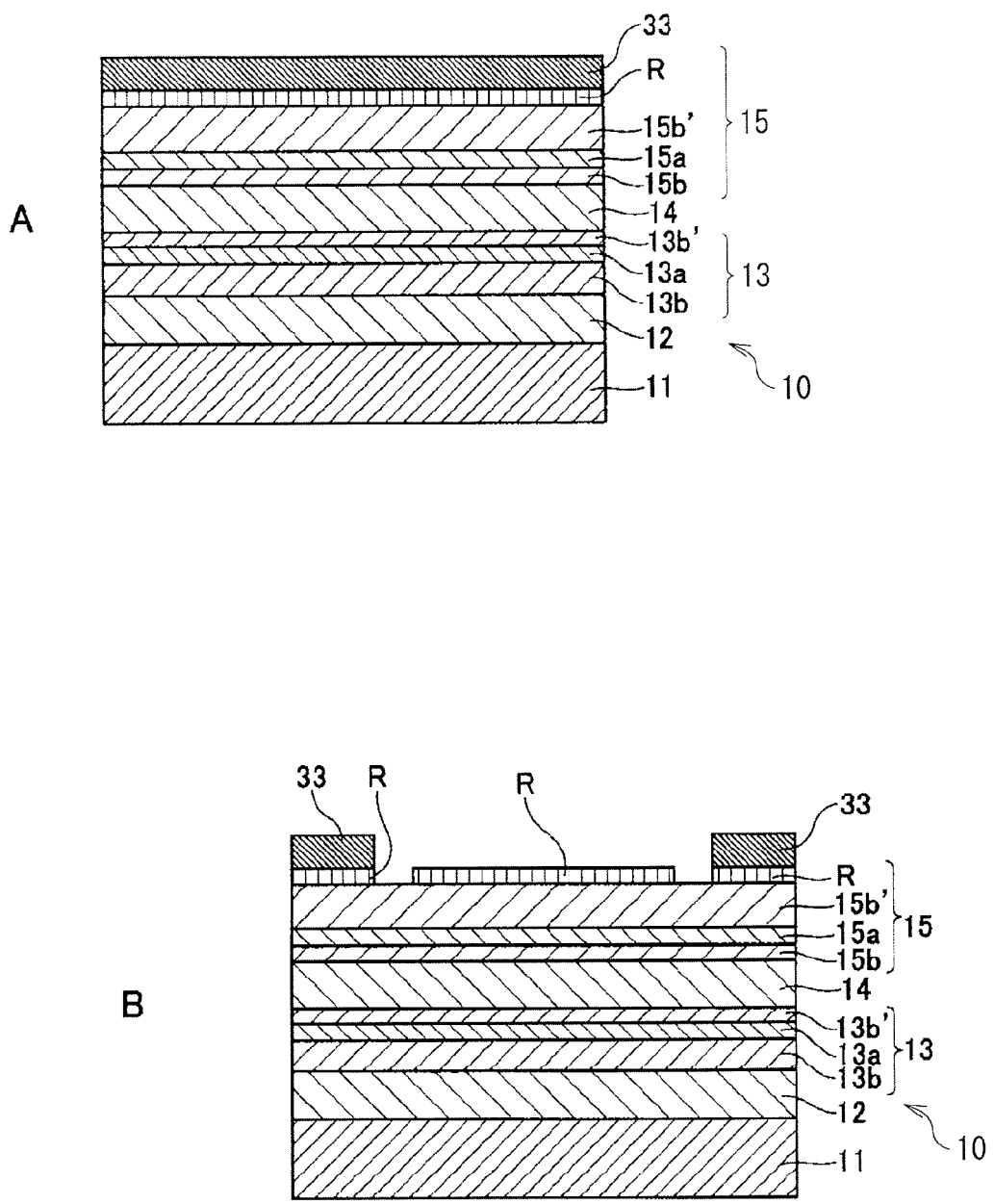

A and B of FIG. 19 are each a cross-sectional process diagram (Part 1) showing manufacturing procedures of the semiconductor device according to the sixth embodiment of the present technology.

Figure 20:
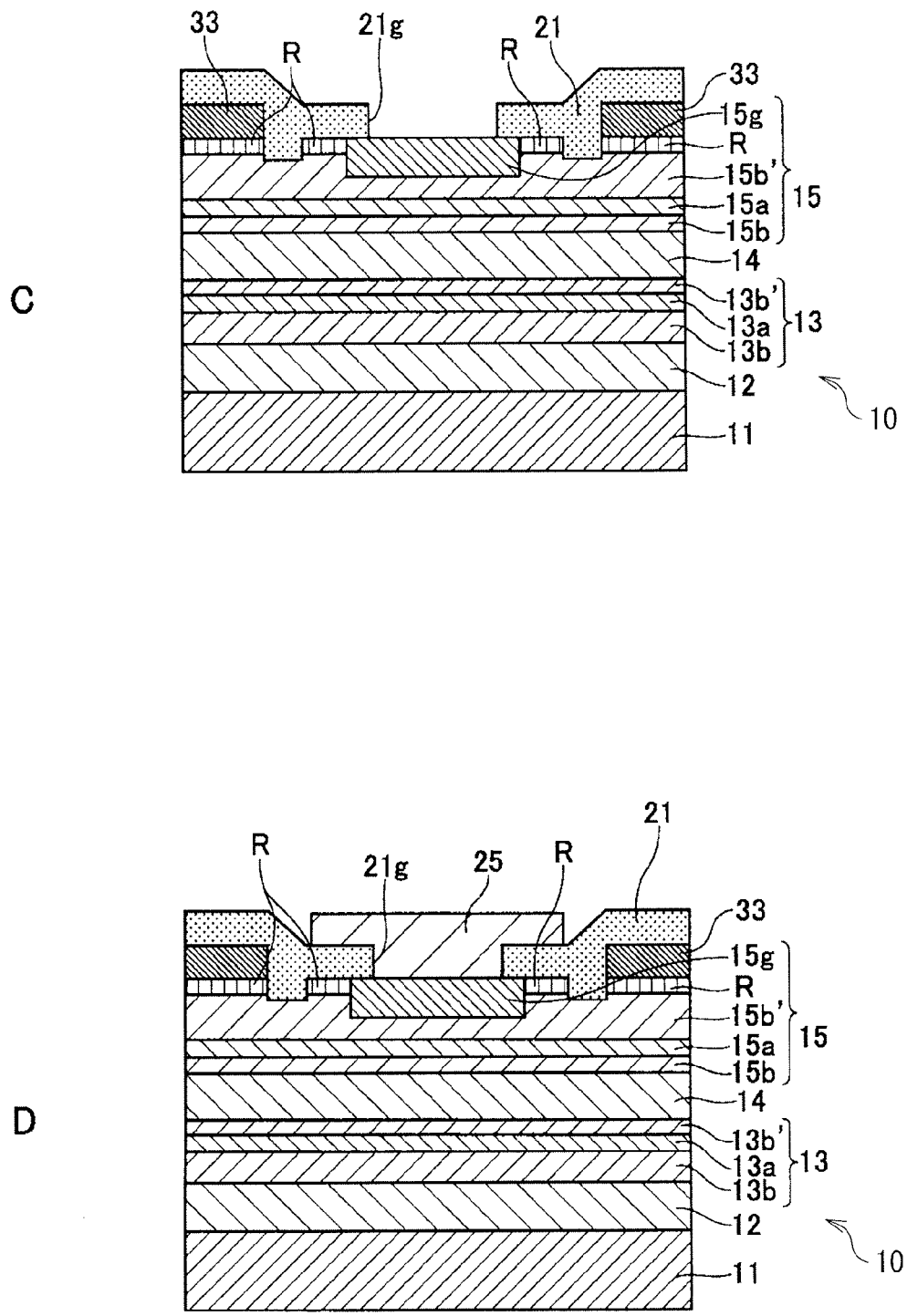

C and D of FIG. 20 are each a cross-sectional process diagram (Part 2) showing manufacturing procedures of the semiconductor device according to the sixth embodiment of the present technology.

Figure 21:
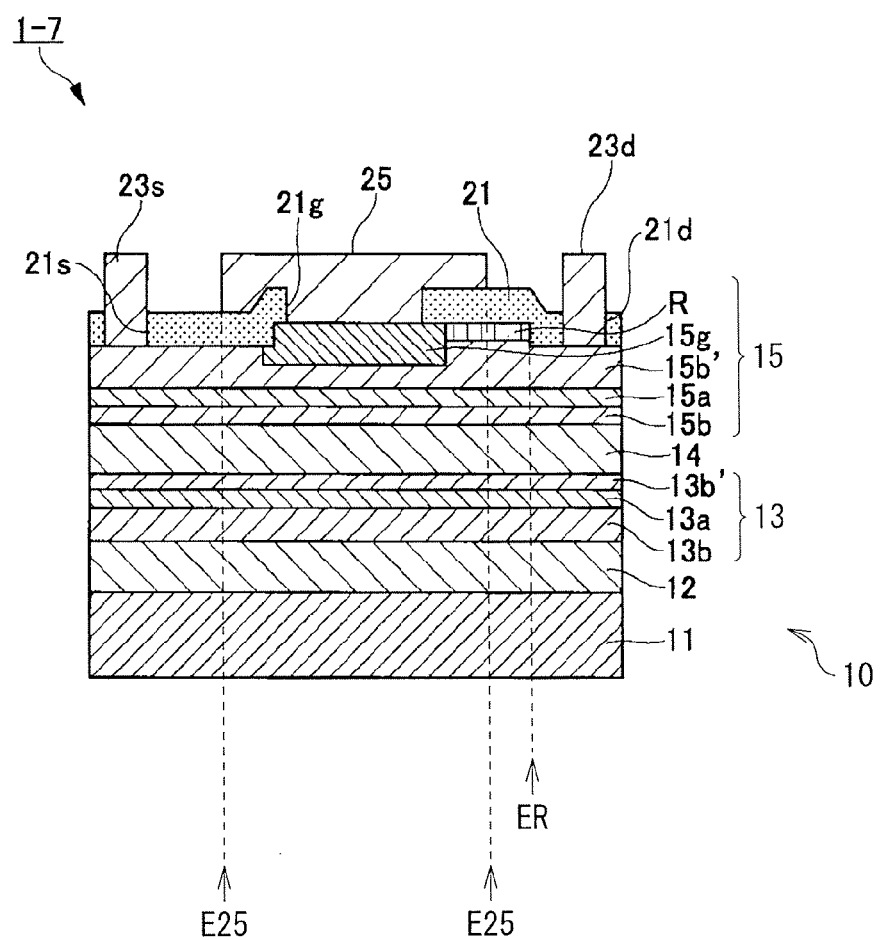

FIG. 21 is a cross-sectional view showing a configuration of a substantial part of a semiconductor device according to a seventh embodiment of the present technology.

Figure 22:
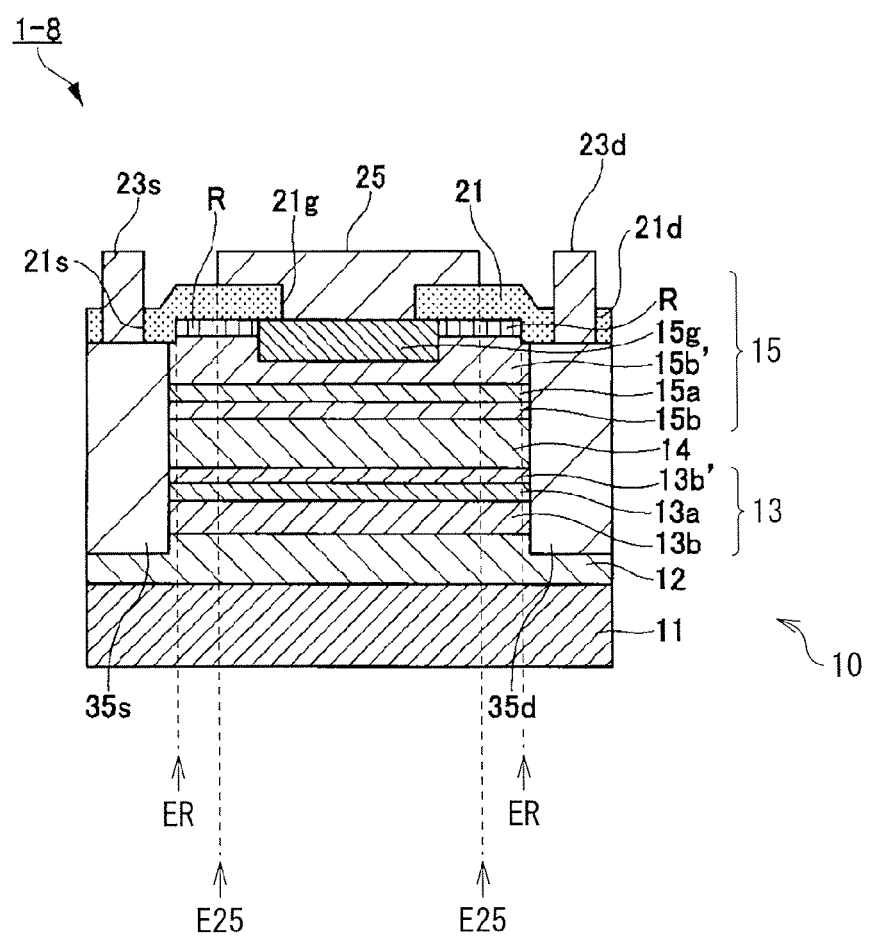

FIG. 22 is a cross-sectional view showing a configuration of a substantial part of a semiconductor device according to an eighth embodiment of the present technology.

Figure 23:
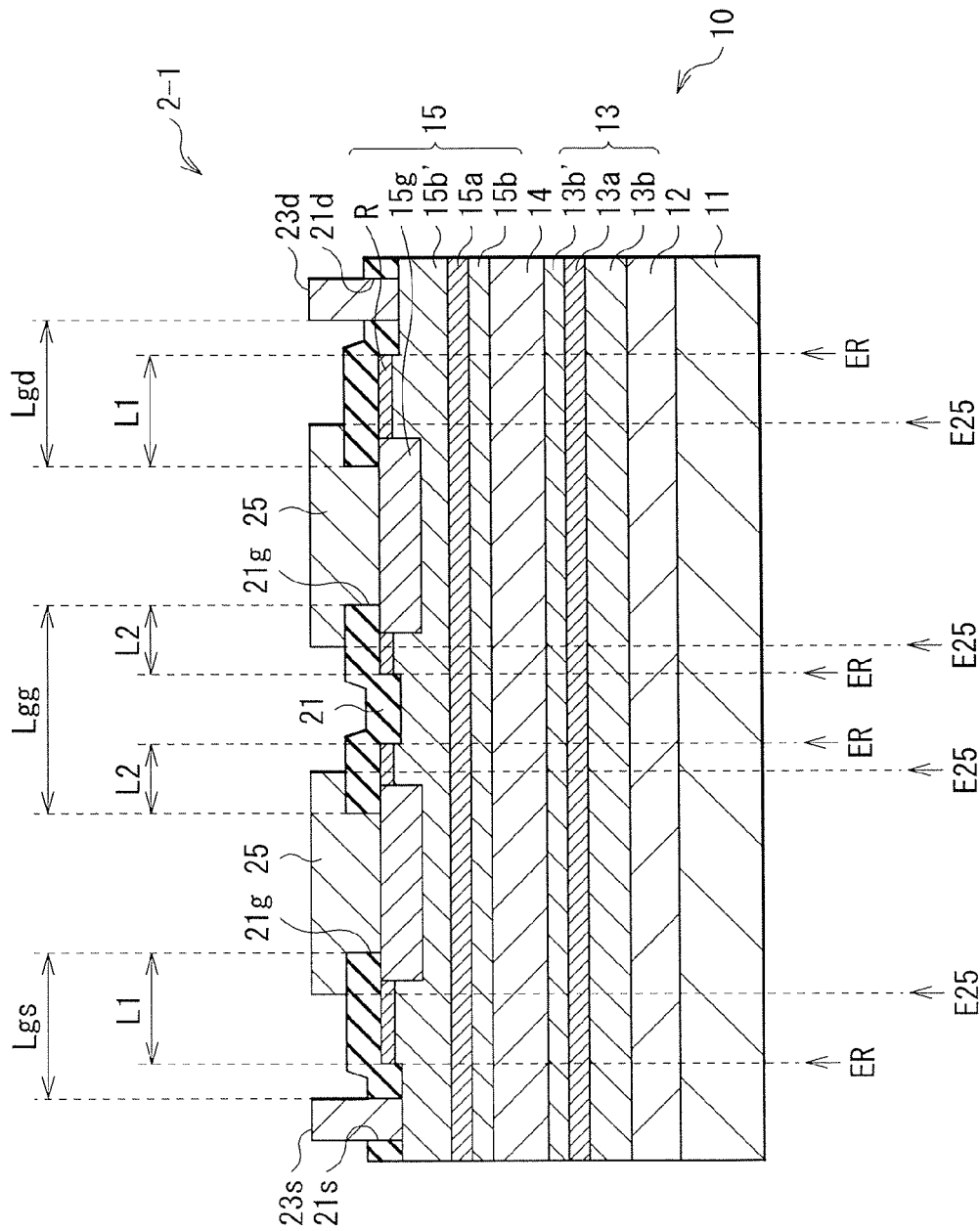

FIG. 23 is a cross-sectional view showing a configuration of a substantial part of a semiconductor device according to a ninth embodiment of the present technology.

Figure 24:
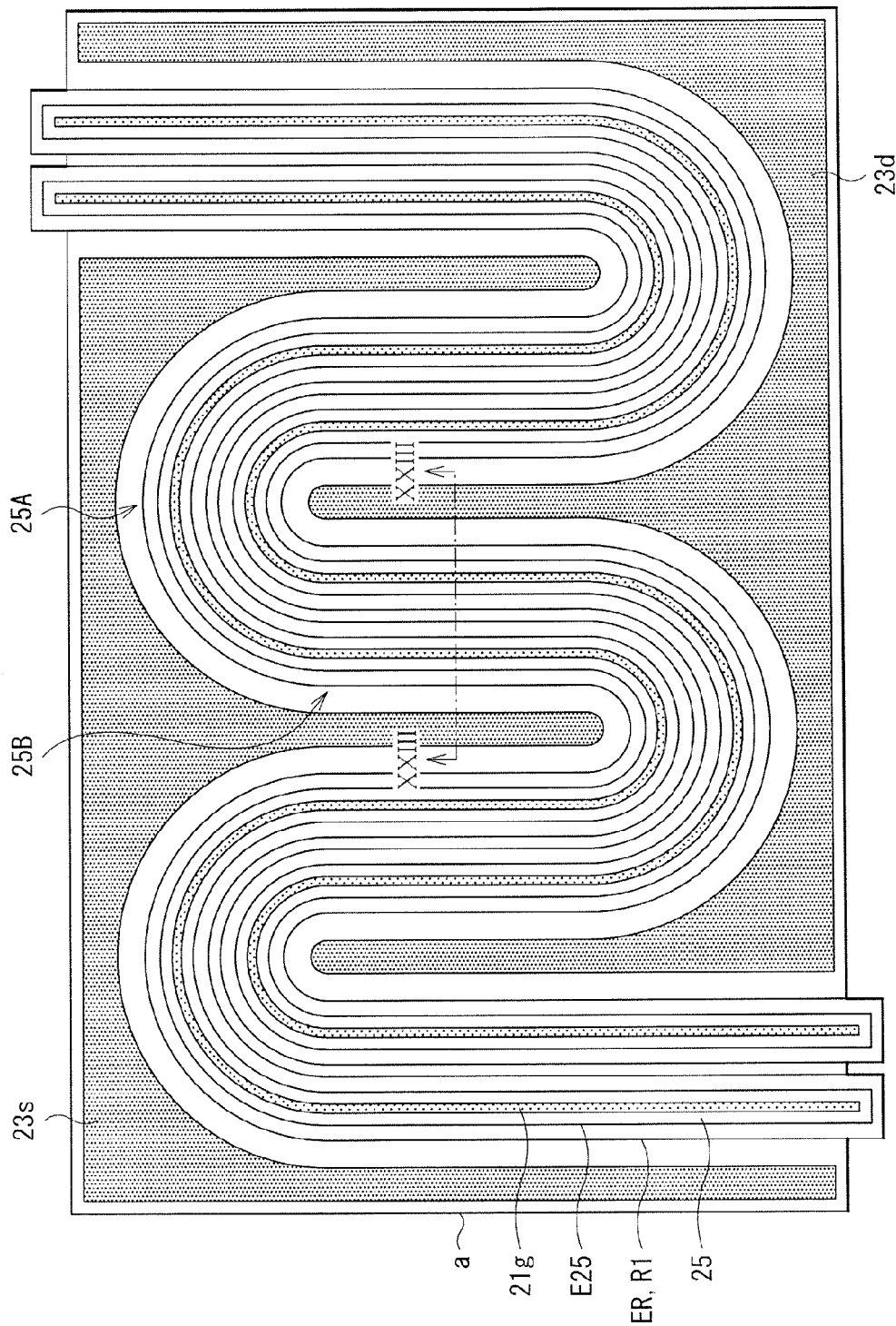

FIG. 24 is a schematic top view of the semiconductor device according to the ninth embodiment of the present technology.

Figure 25:
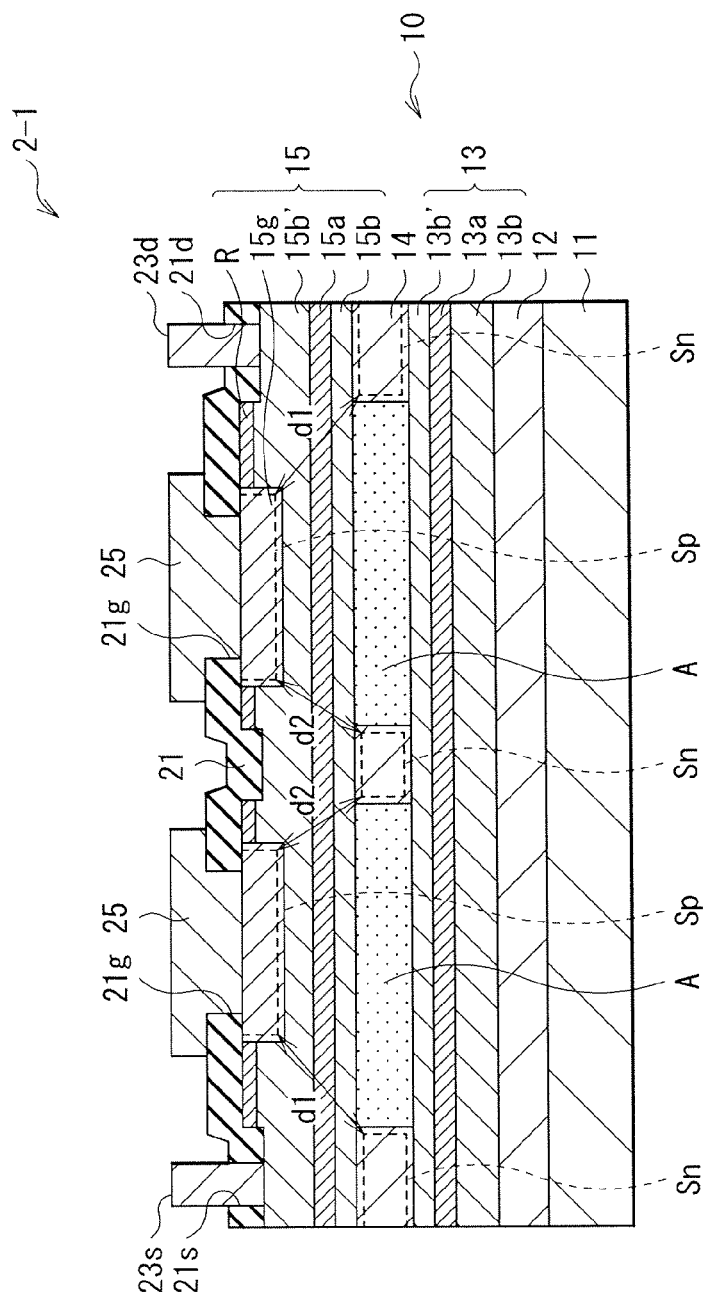

FIG. 25 is a cross-sectional view showing formation of a carrier depletion region at the time of off-operation of the semiconductor device according to the ninth embodiment of the present technology.

Figure 26:
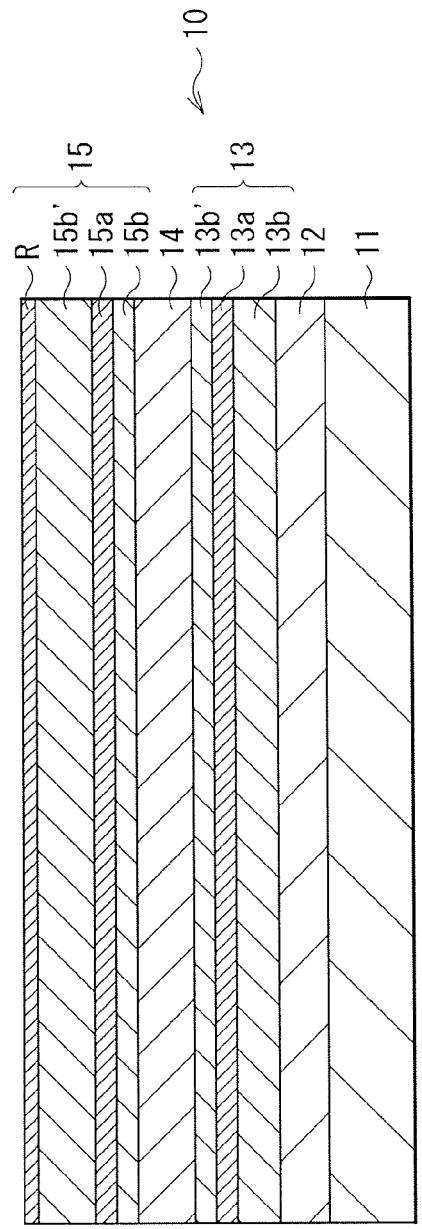

FIG. 26 is a cross-sectional view showing a method of manufacturing the semiconductor device according to the ninth embodiment of the present technology in order of a manufacturing process.

Figure 27:
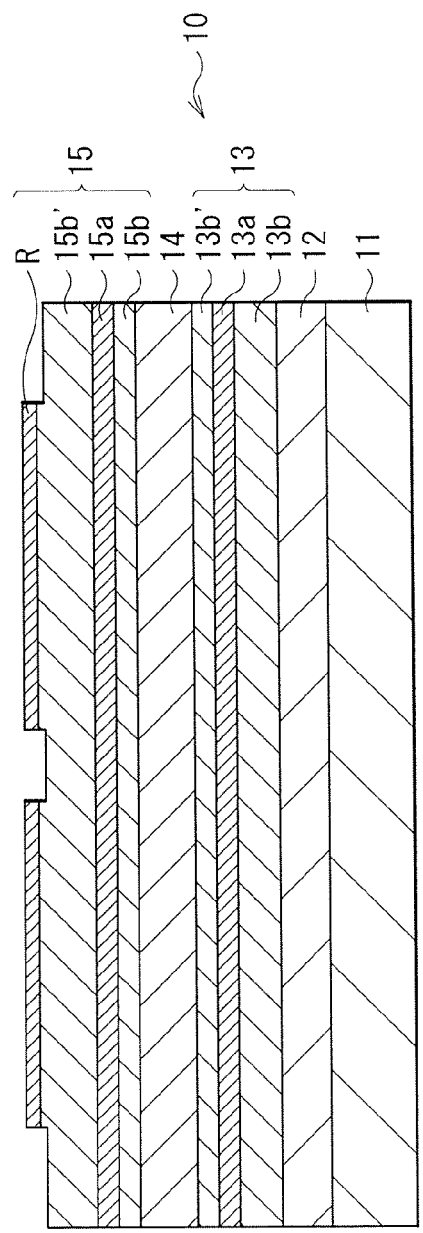

FIG. 27 is a cross-sectional view showing a process following on the process shown in FIG. 26.

Figure 28:
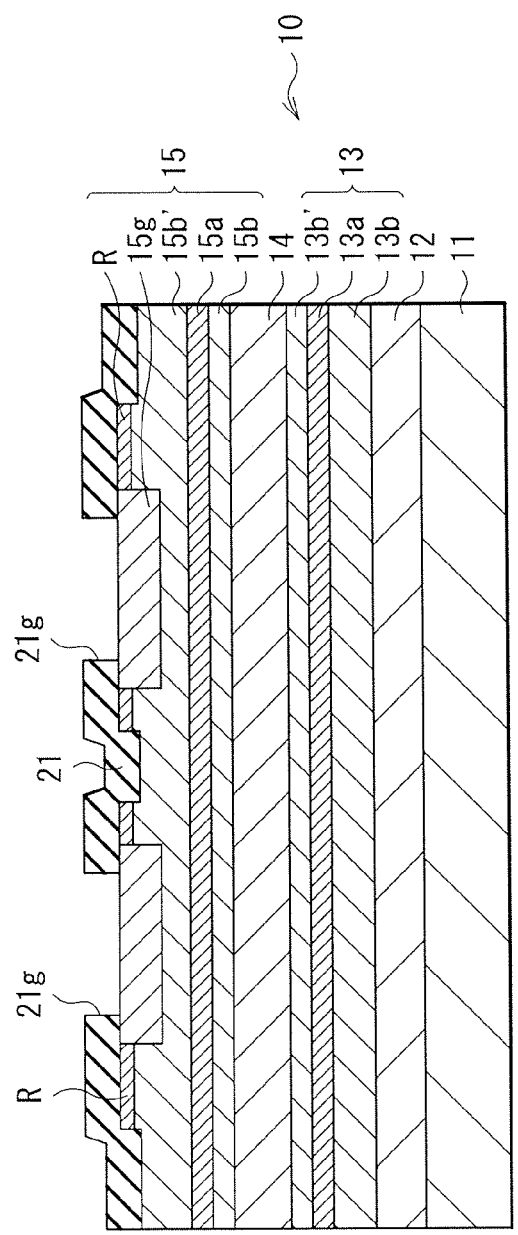

FIG. 28 is a cross-sectional view showing a process following on the process shown in FIG. 27.

Figure 29:
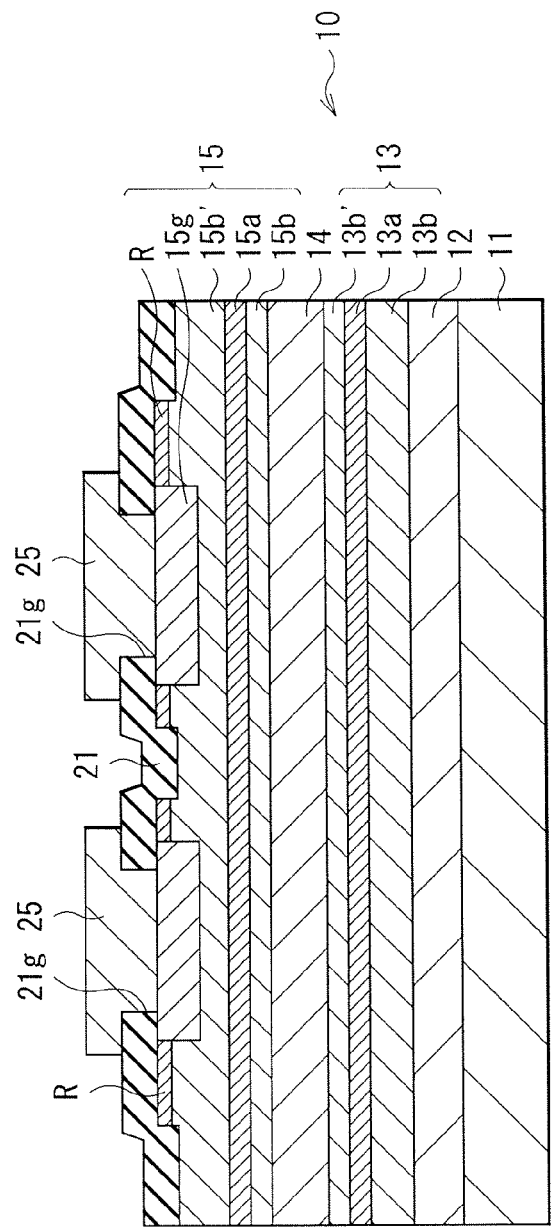

FIG. 29 is a cross-sectional view showing a process following on the process shown in FIG. 28.

Figure 30:
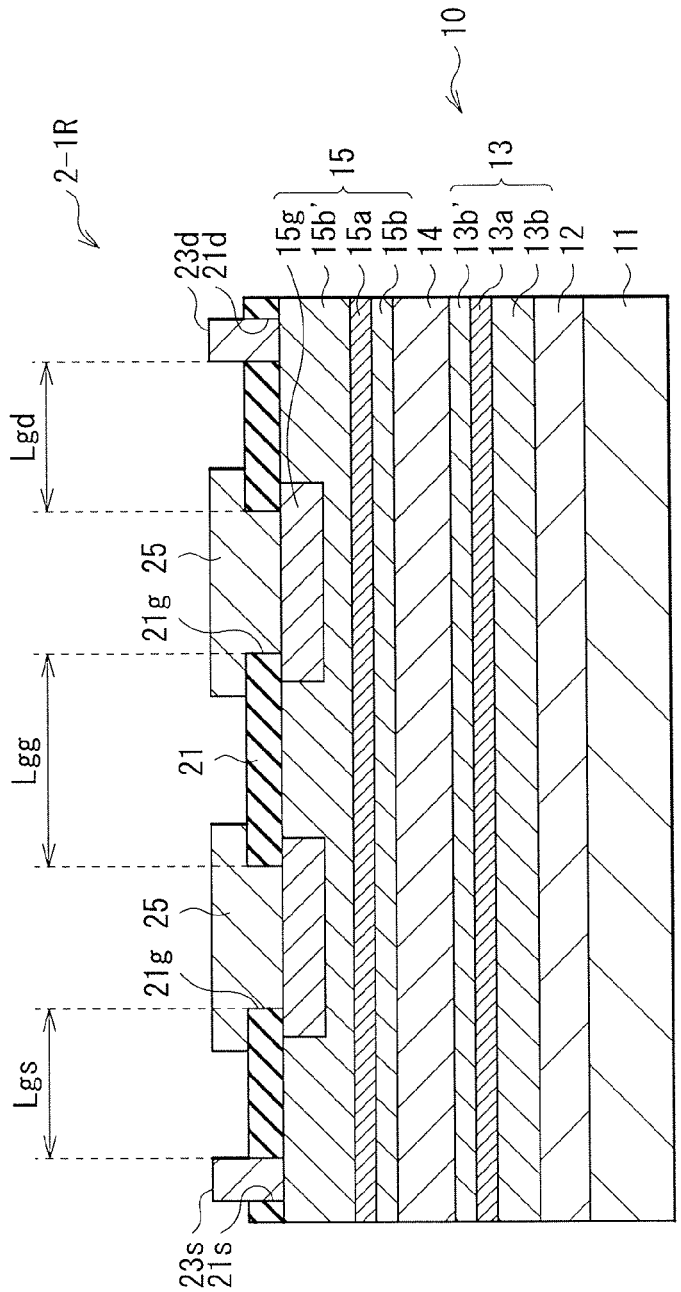

FIG. 30 is a cross-sectional view showing a configuration of a substantial part of a semiconductor device according to a reference example 1 of the ninth embodiment of the present technology.

Figure 31:
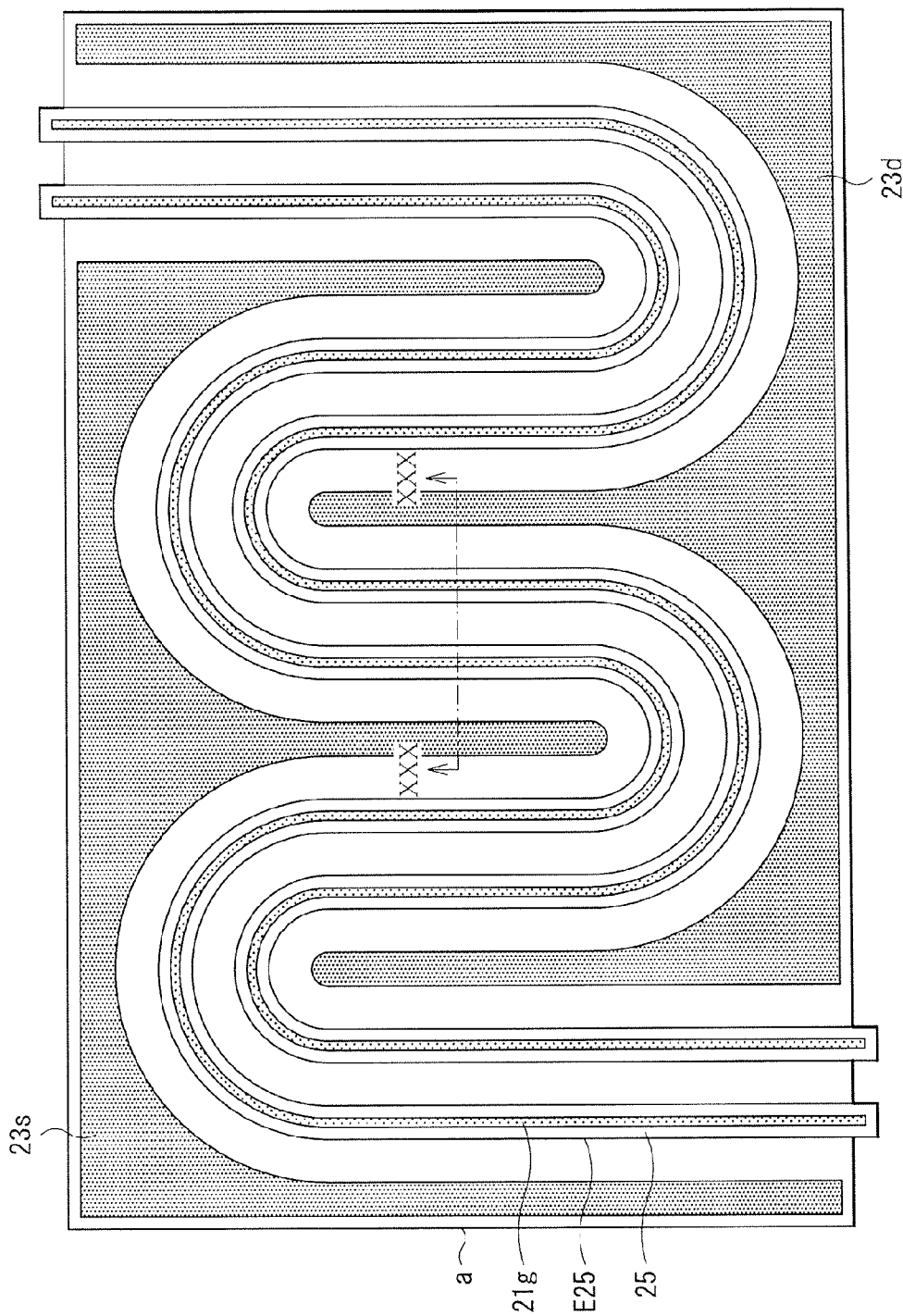

FIG. 31 is a schematic top view of the semiconductor device according to the reference example 1 of the ninth embodiment of the present technology.

Figure 32:
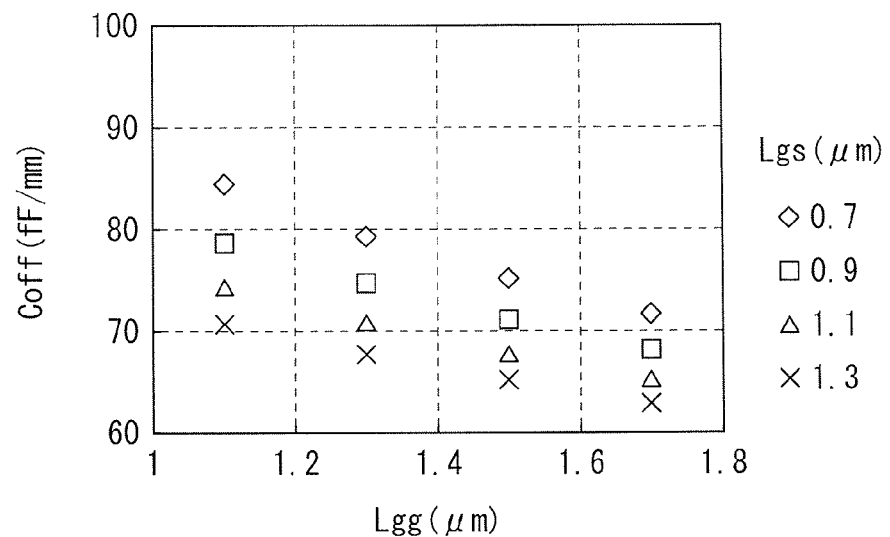

FIG. 32 is a graphic chart showing a calculation result of off-capacitance Coff when varying device parameters for the semiconductor device according to the ninth embodiment of the present technology.

Figure 33:
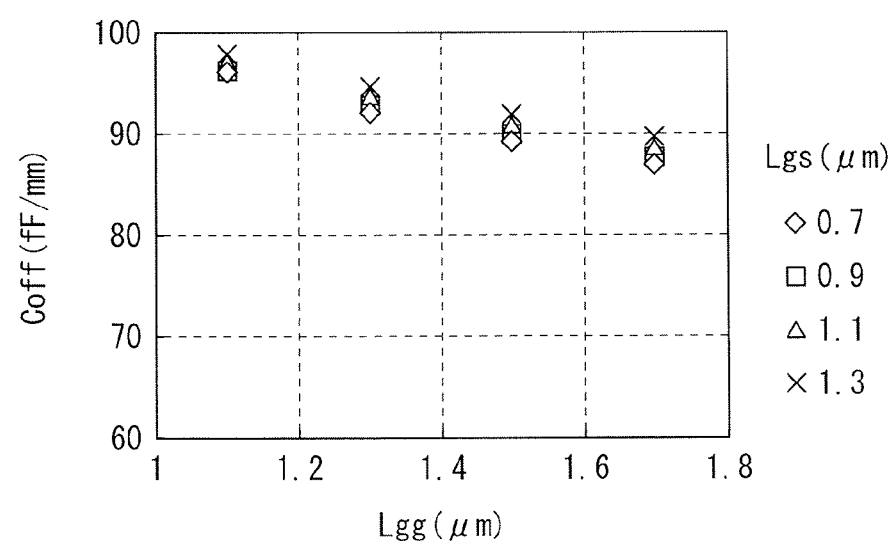

FIG. 33 is a graphic chart showing a calculation result of off-capacitance Coff when varying device parameters for the semiconductor device according to the reference example 1 of the ninth embodiment of the present technology.

Figure 34:
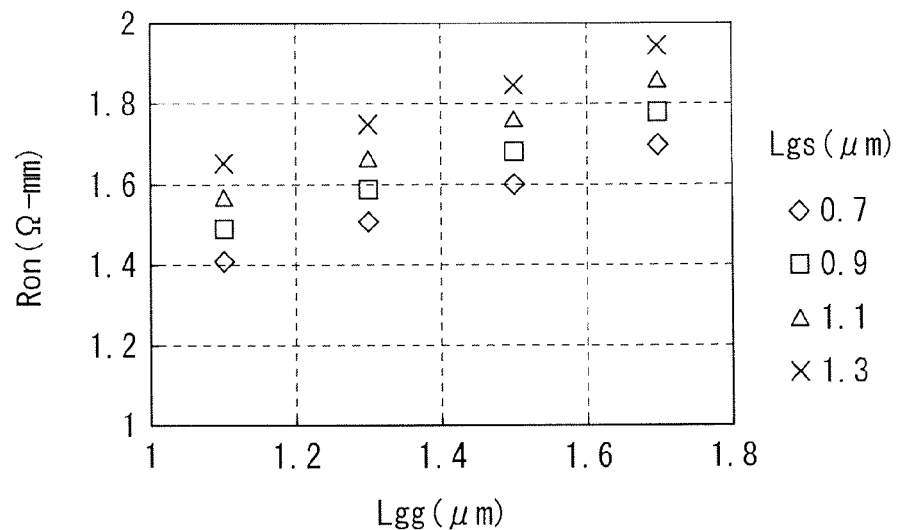

FIG. 34 is a graphic chart showing a calculation result of on-resistance Ron when varying device parameters for the semiconductor device according to the reference example 1 of the ninth embodiment of the present technology.

Figure 35:
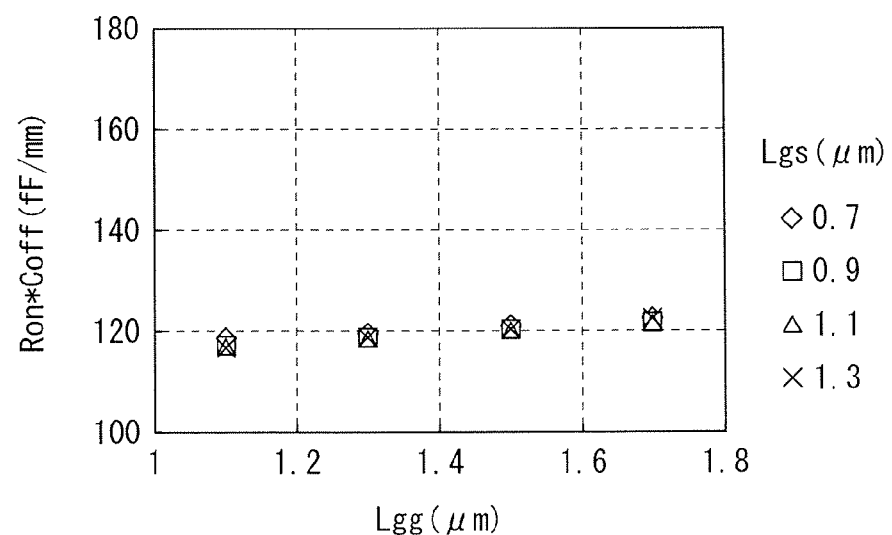

FIG. 35 is a graphic chart showing a calculation result of Ron*Coff when varying device parameters for the semiconductor device according to the ninth embodiment of the present technology.

Figure 36:
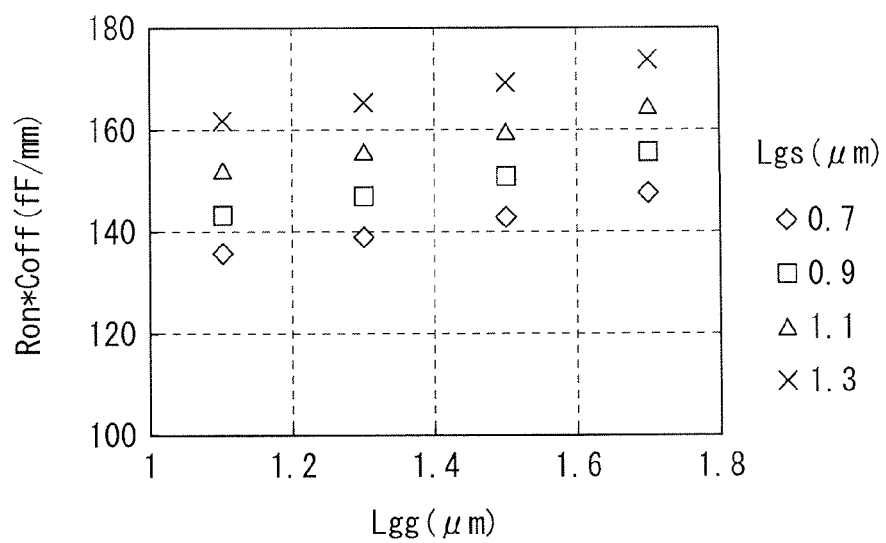

FIG. 36 is a graphic chart showing a calculation result of Ron*Coff when varying device parameters for the semiconductor device according to the reference example 1 of the ninth embodiment of the present technology.

Figure 37:
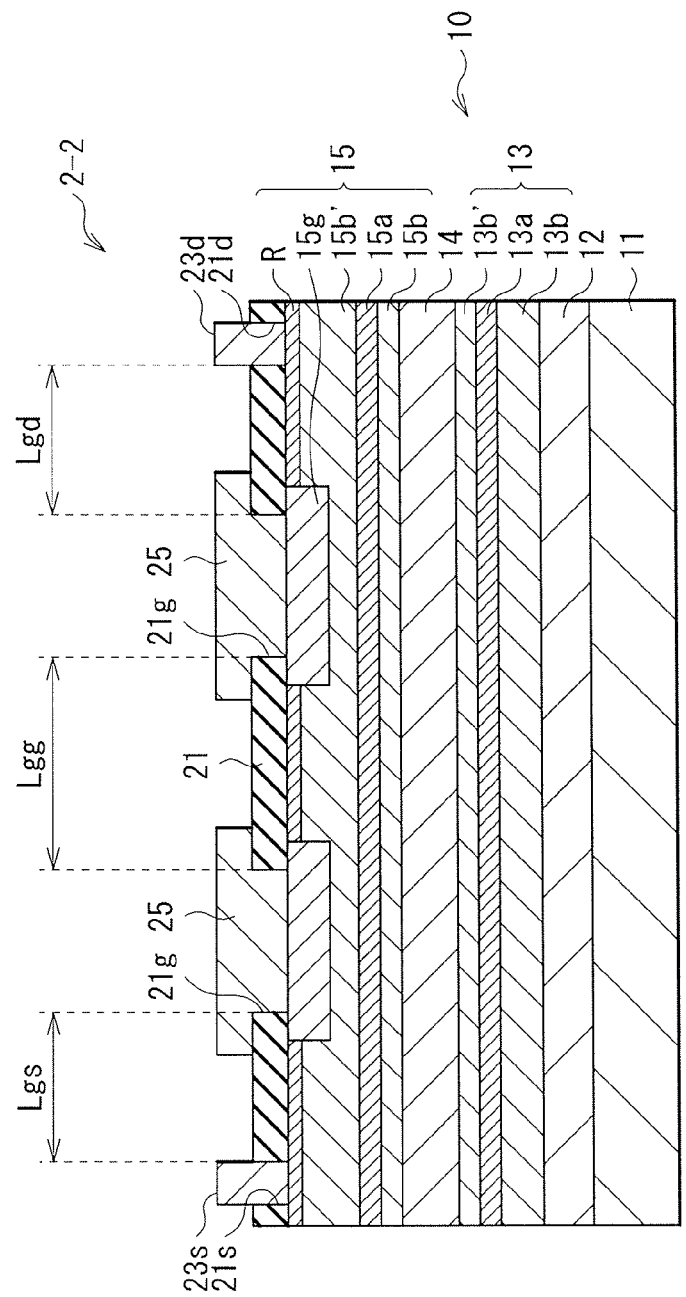

FIG. 37 is a cross-sectional view showing a configuration of a substantial part of a semiconductor device according to a tenth embodiment of the present technology.

Figure 38:
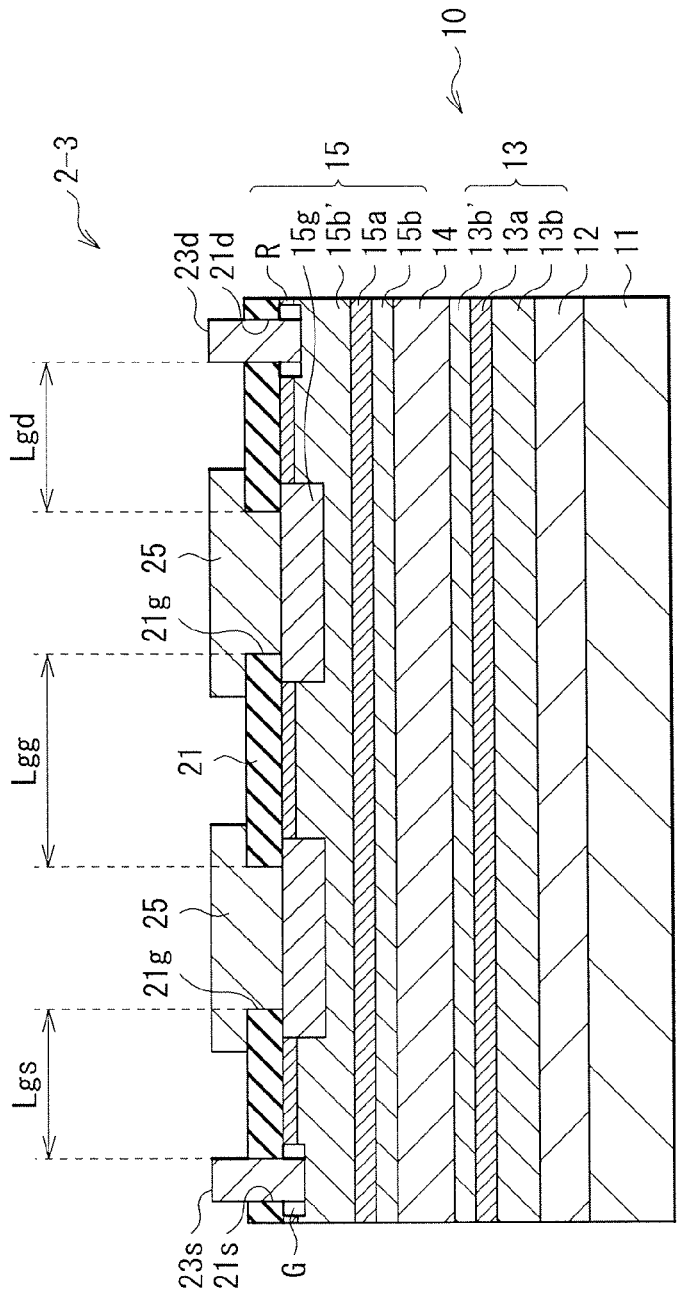

FIG. 38 is a cross-sectional view showing a configuration of a substantial part of a semiconductor device according to an eleventh embodiment of the present technology.

Figure 39:
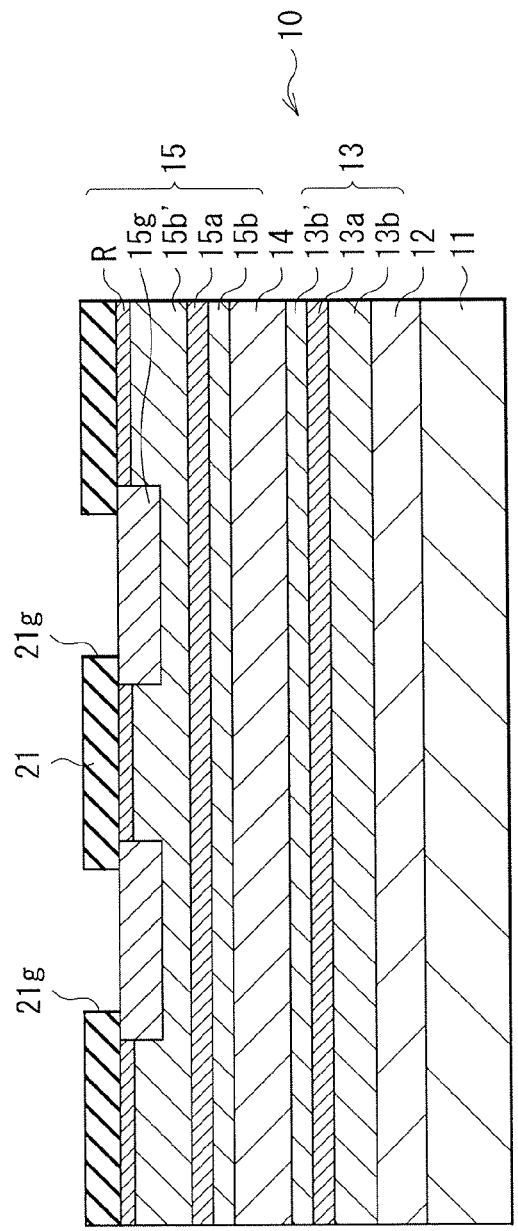

FIG. 39 is a cross-sectional view showing a method of manufacturing the semiconductor device according to the eleventh embodiment of the present technology in order of a manufacturing process.

Figure 40:
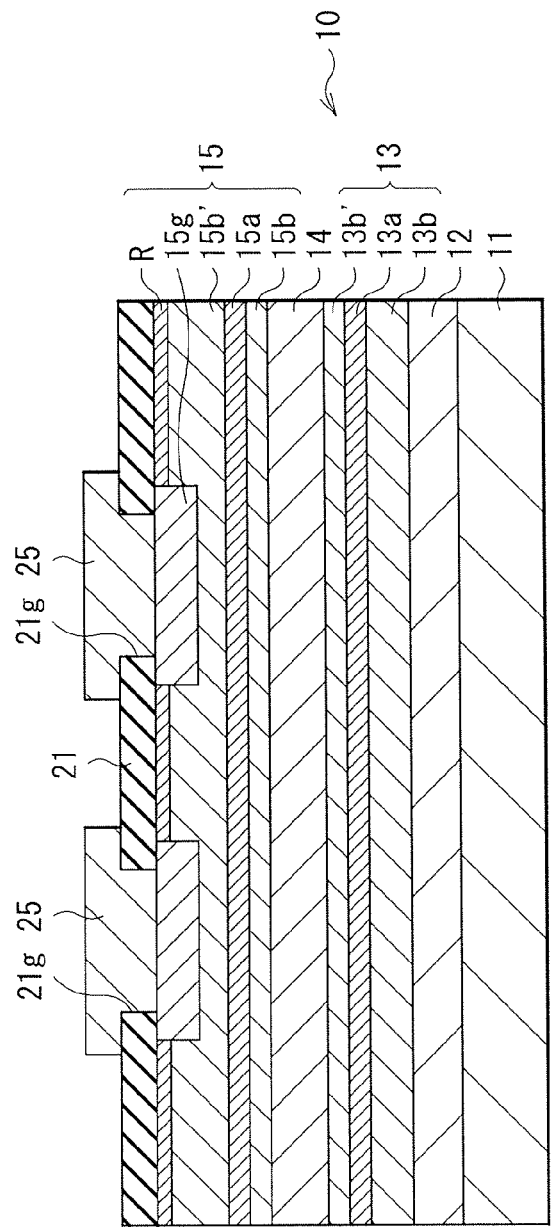

FIG. 40 is a cross-sectional view showing a process following on the process shown in FIG. 39.

Figure 41:
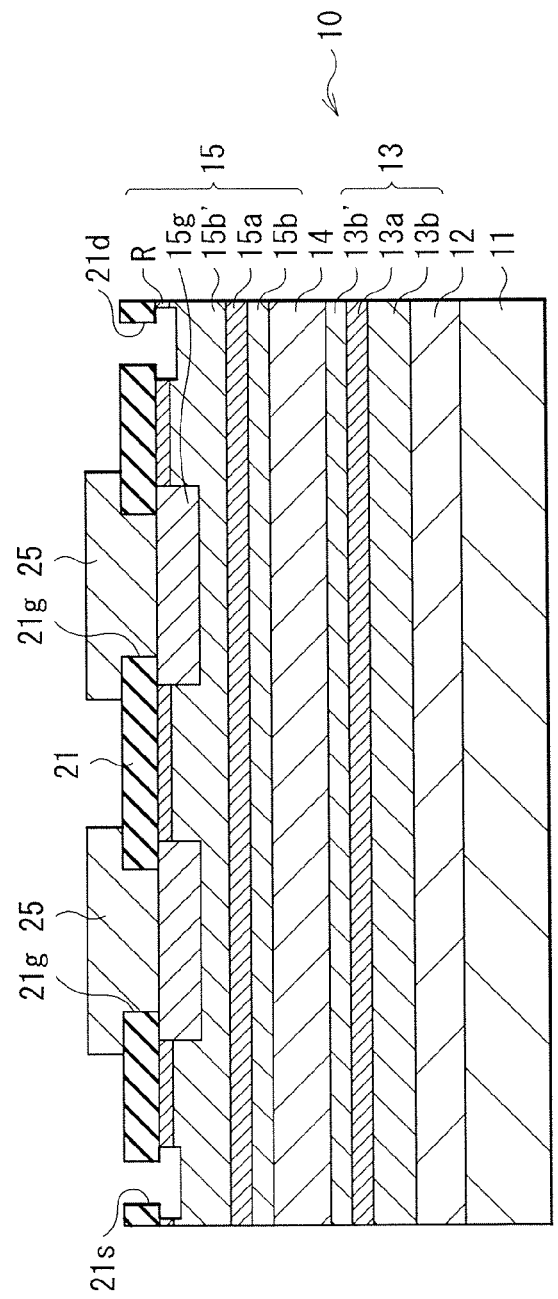

FIG. 41 is a cross-sectional view showing a process following on the process shown in FIG. 40.

Figure 42:
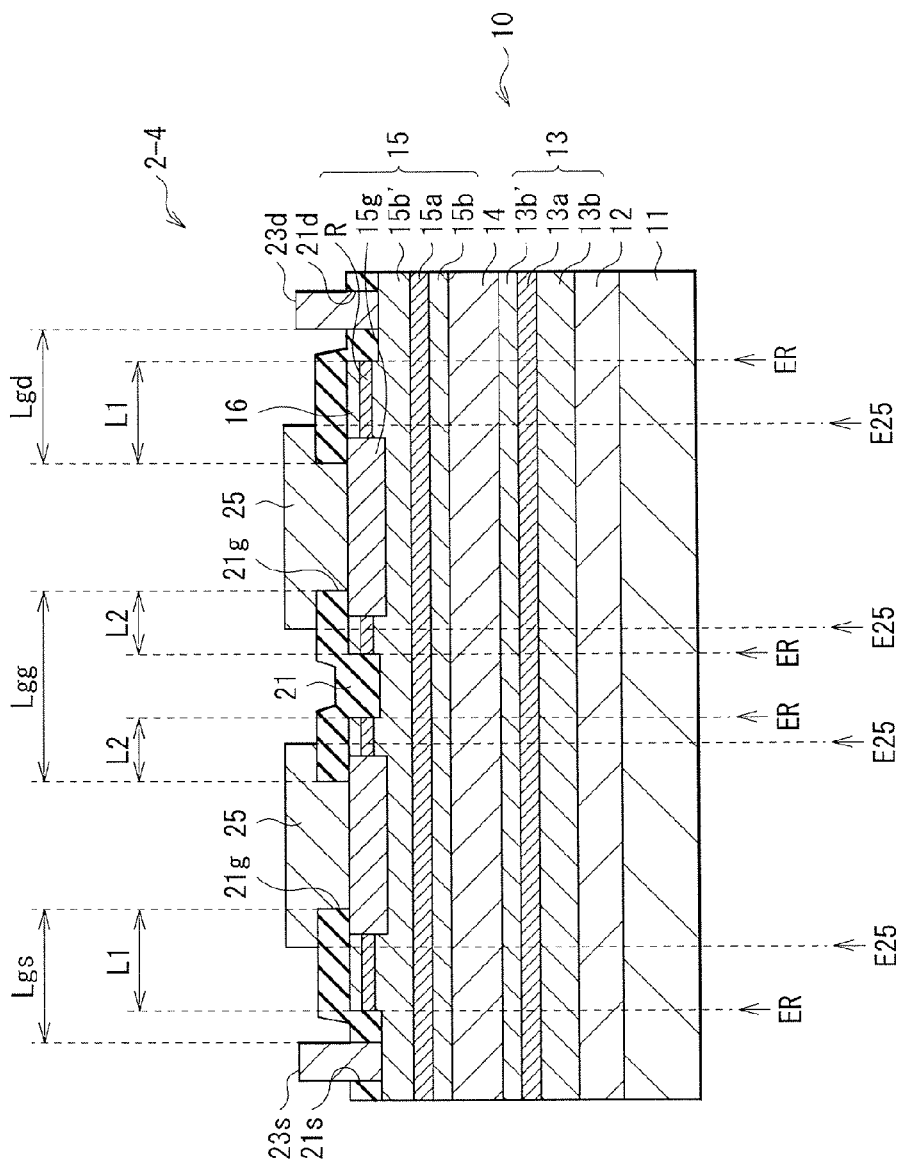

FIG. 42 is a cross-sectional view showing a configuration of a substantial part of a semiconductor device according to a twelfth embodiment of the present technology.

Figure 43:
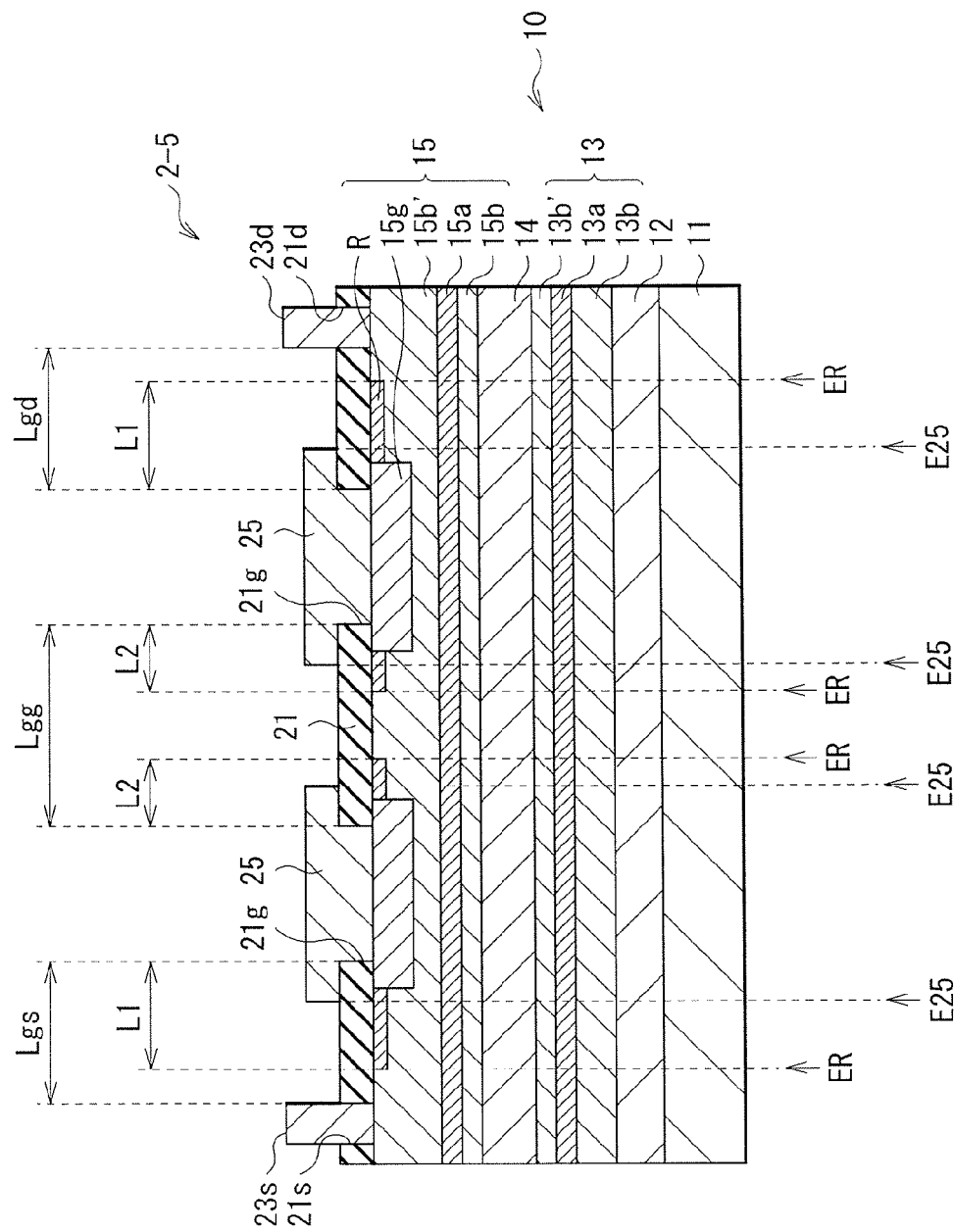

FIG. 43 is a cross-sectional view showing a configuration of a substantial part of a semiconductor device according to a thirteenth embodiment of the present technology.

Figure 44:
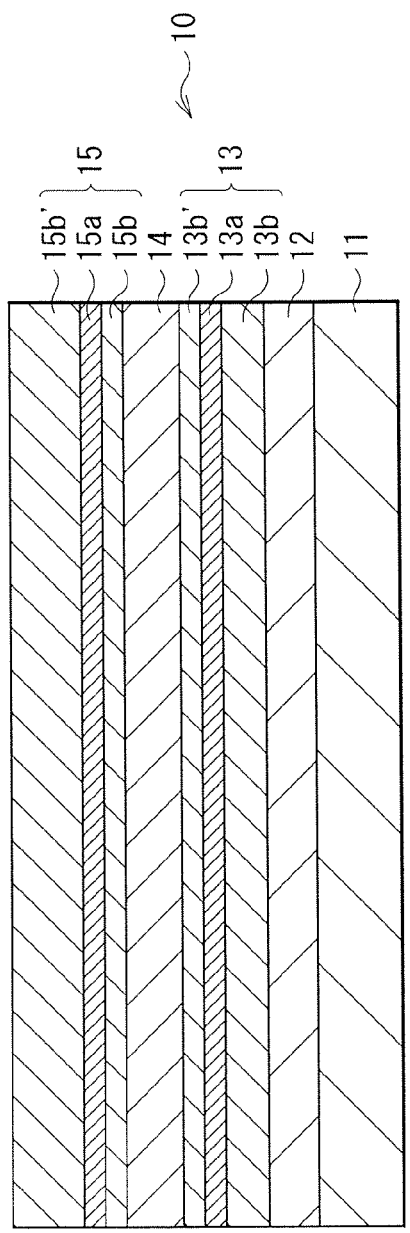

FIG. 44 is a cross-sectional view showing a method of manufacturing the semiconductor device according to the thirteenth embodiment of the present technology in order of a manufacturing process.

Figure 45:
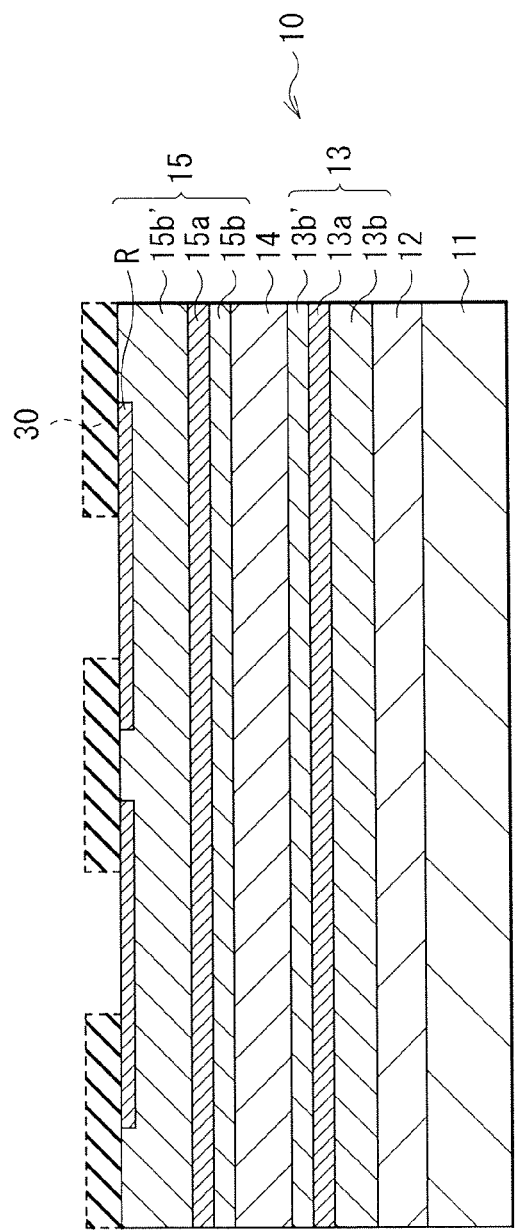

FIG. 45 is a cross-sectional view showing a process following on the process shown in FIG. 44.

Figure 46:
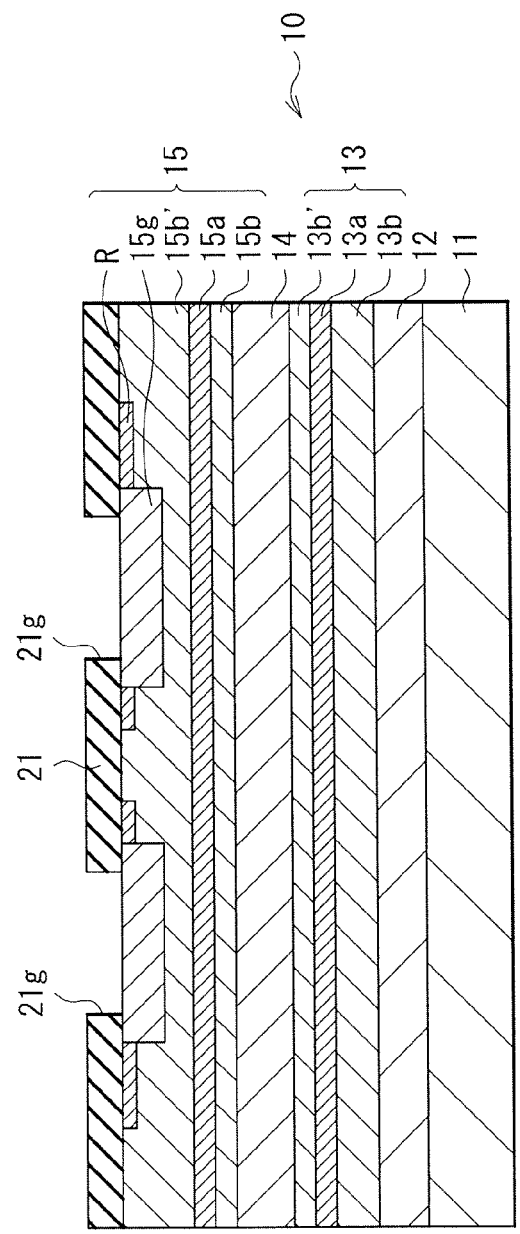

FIG. 46 is a cross-sectional view showing a process following on the process shown in FIG. 45.

Figure 47:
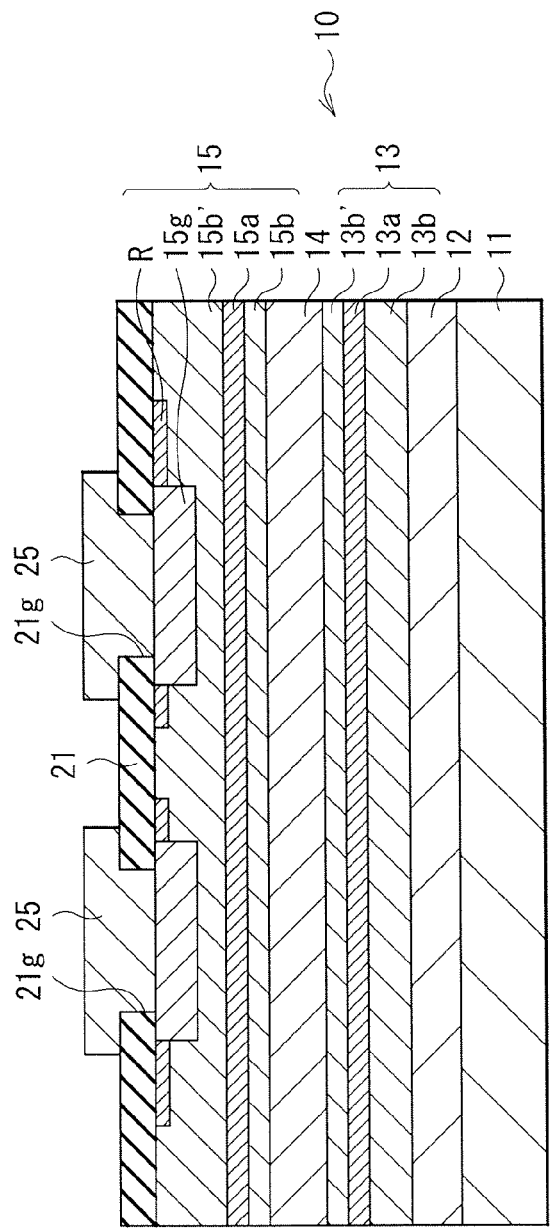

FIG. 47 is a cross-sectional view showing a process following on the process shown in FIG. 46.

Figure 48:
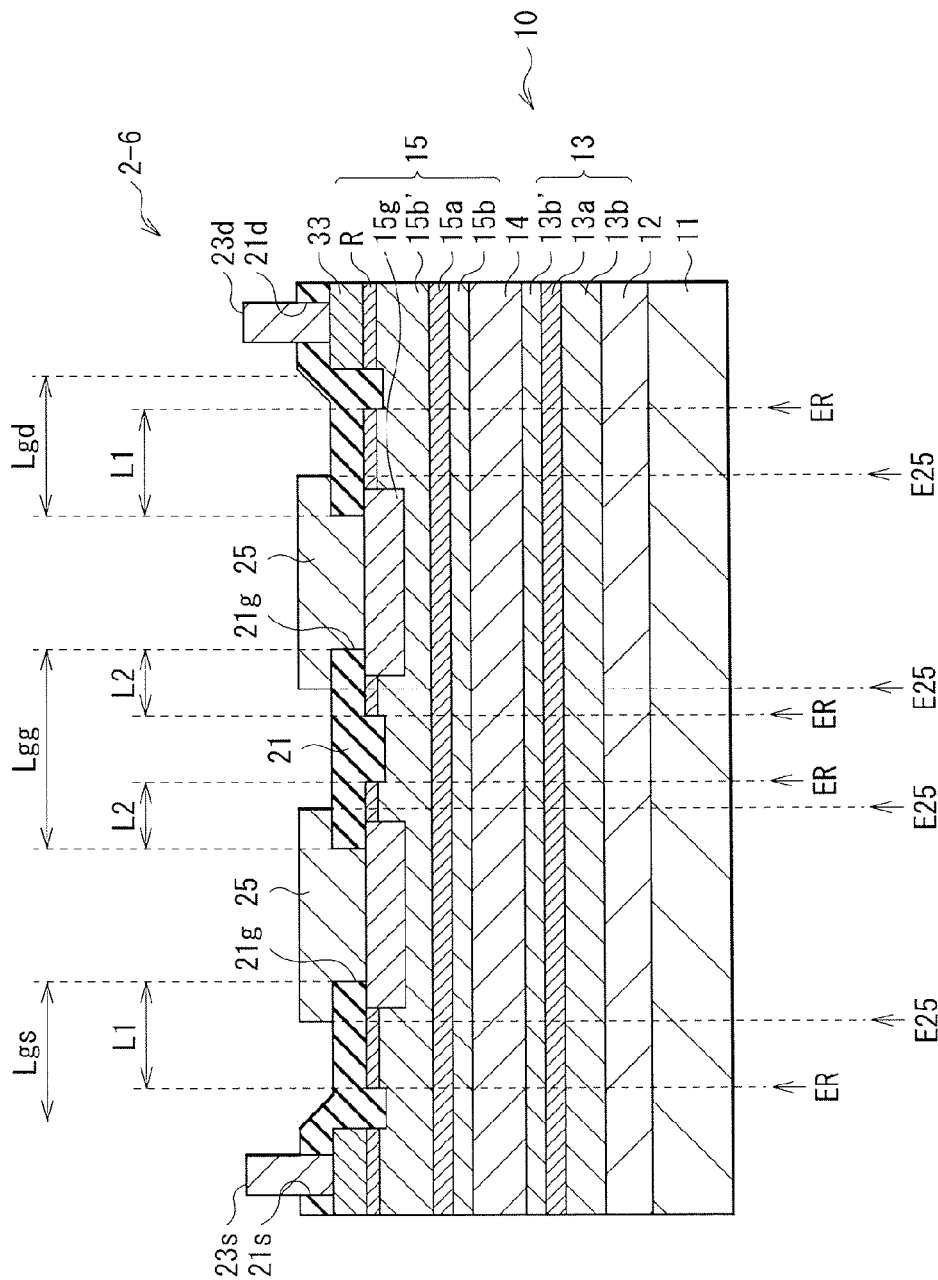

FIG. 48 is a cross-sectional view showing a configuration of a substantial part of a semiconductor device according to a fourteenth embodiment of the present technology.

Figure 49:
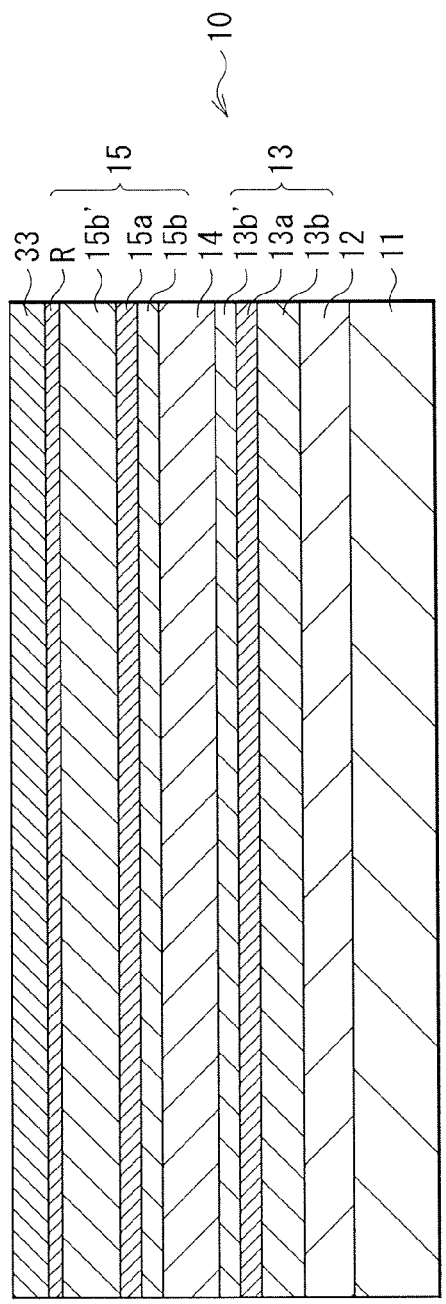

FIG. 49 is a cross-sectional view showing a method of manufacturing the semiconductor device according to the fourteenth embodiment of the present technology in order of a manufacturing process.

Figure 50:
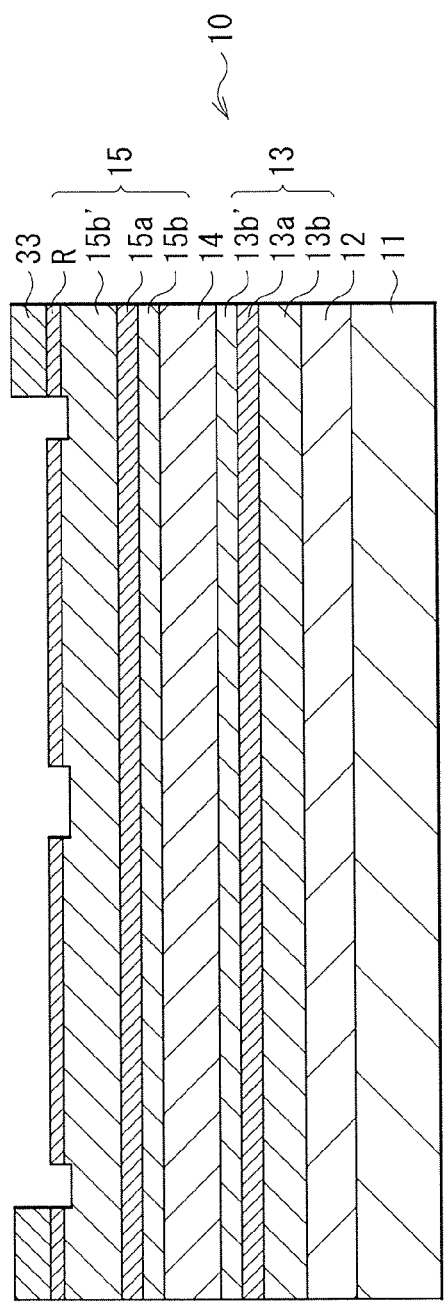

FIG. 50 is a cross-sectional view showing a process following on the process shown in FIG. 49.

Figure 51:
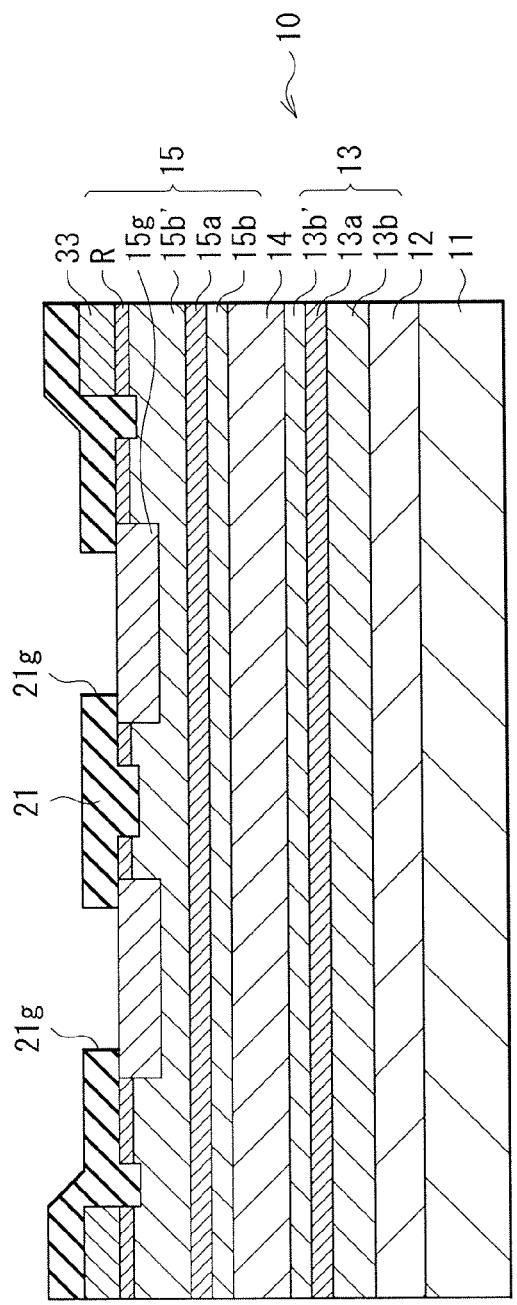

FIG. 51 is a cross-sectional view showing a process following on the process shown in FIG. 50.

Figure 52:
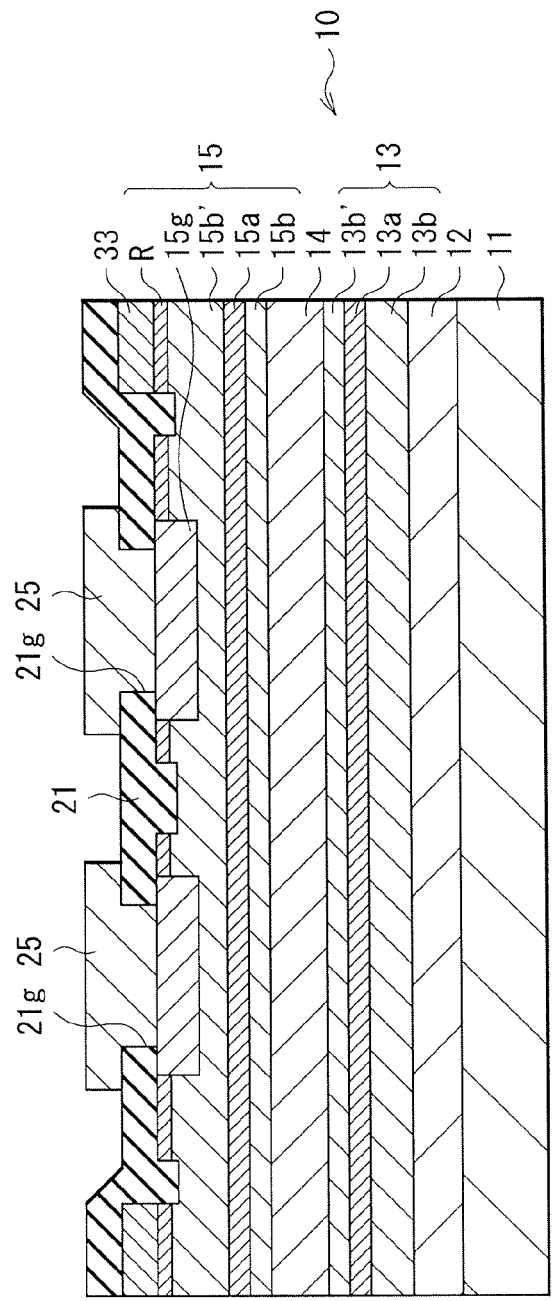

FIG. 52 is a cross-sectional view showing a process following on the process shown in FIG. 51.

Figure 53:
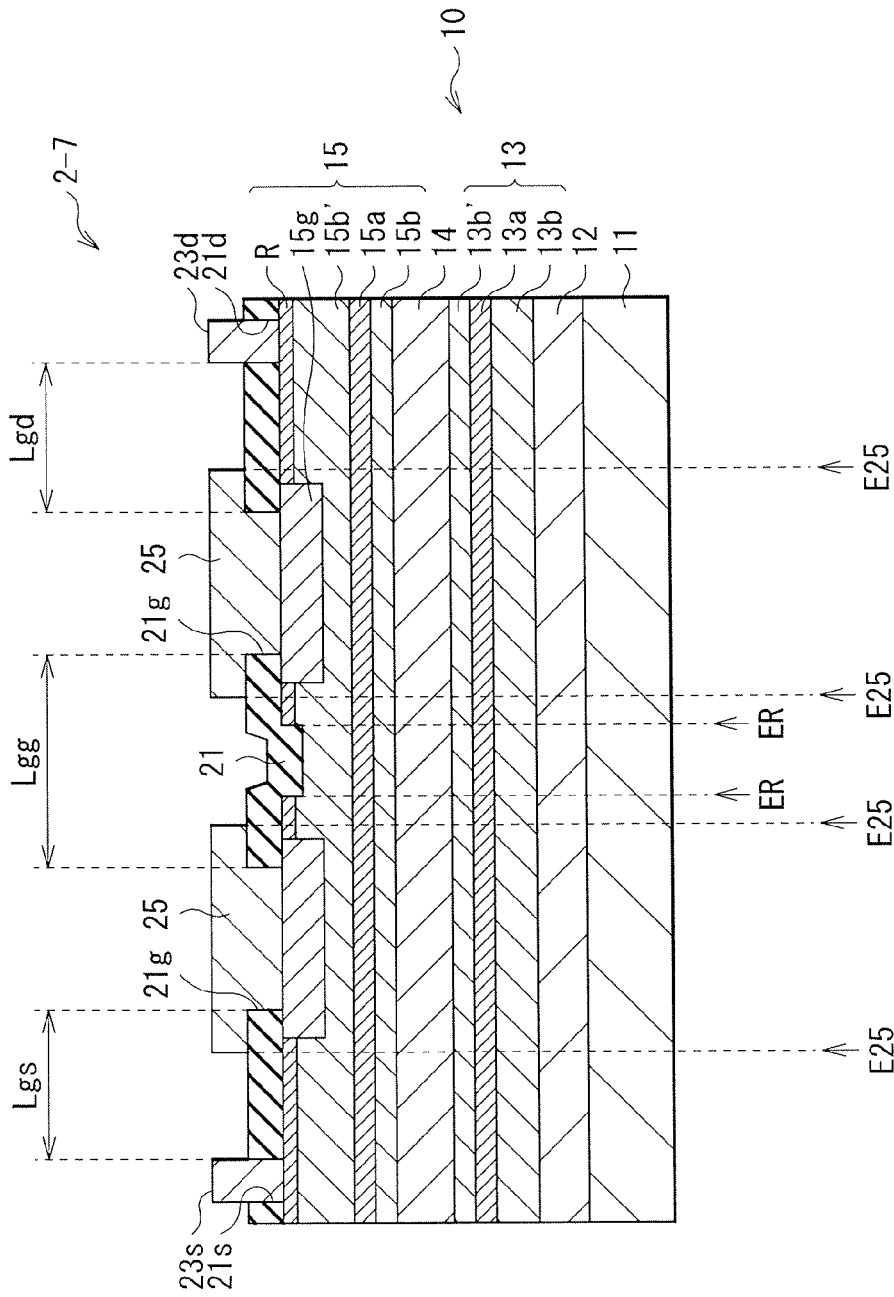

FIG. 53 is a cross-sectional view showing a configuration of a substantial part of a semiconductor device according to a fifteenth embodiment of the present technology.

Figure 54:
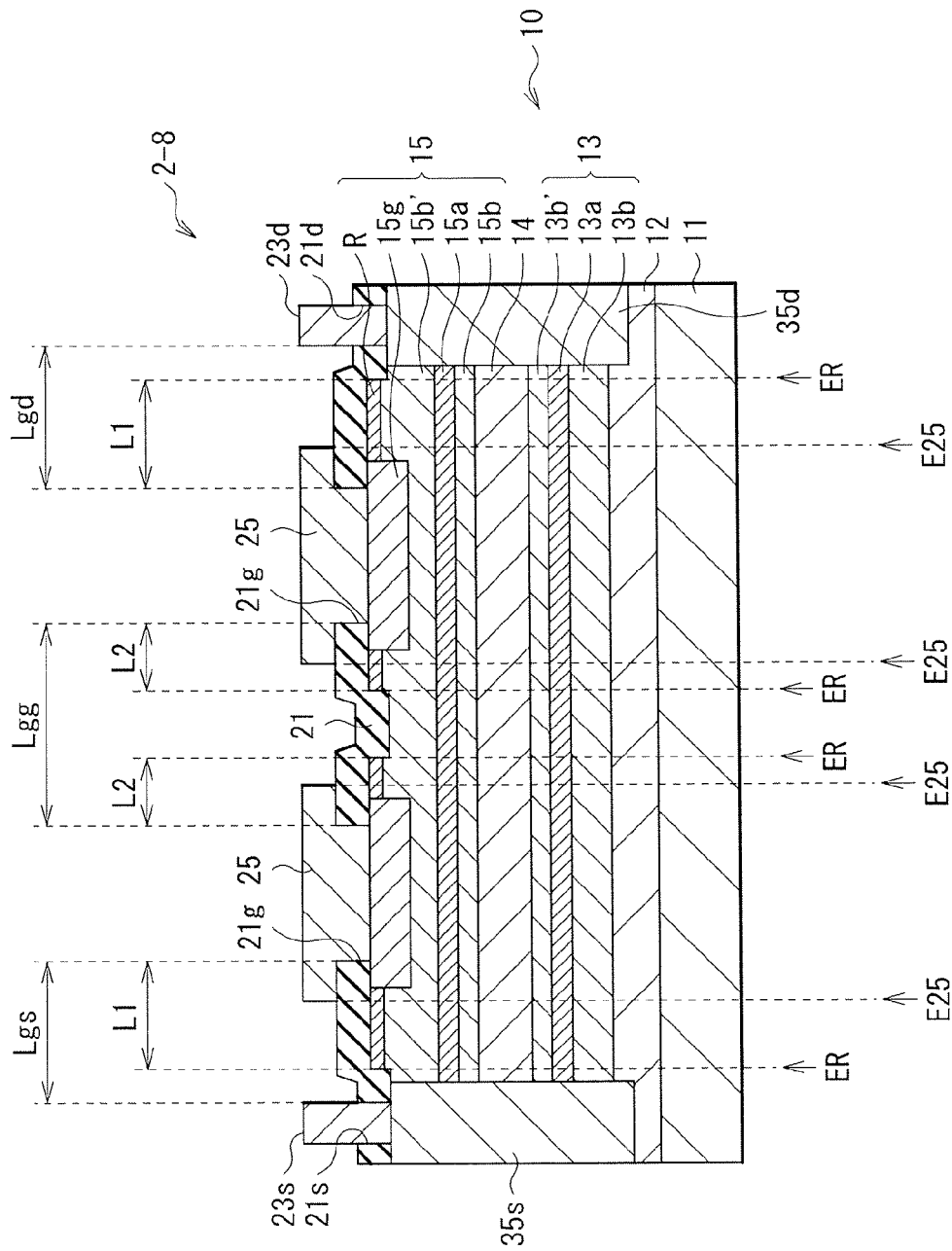

FIG. 54 is a cross-sectional view showing a configuration of a substantial part of a semiconductor device according to a sixteenth embodiment of the present technology.

Figure 55:
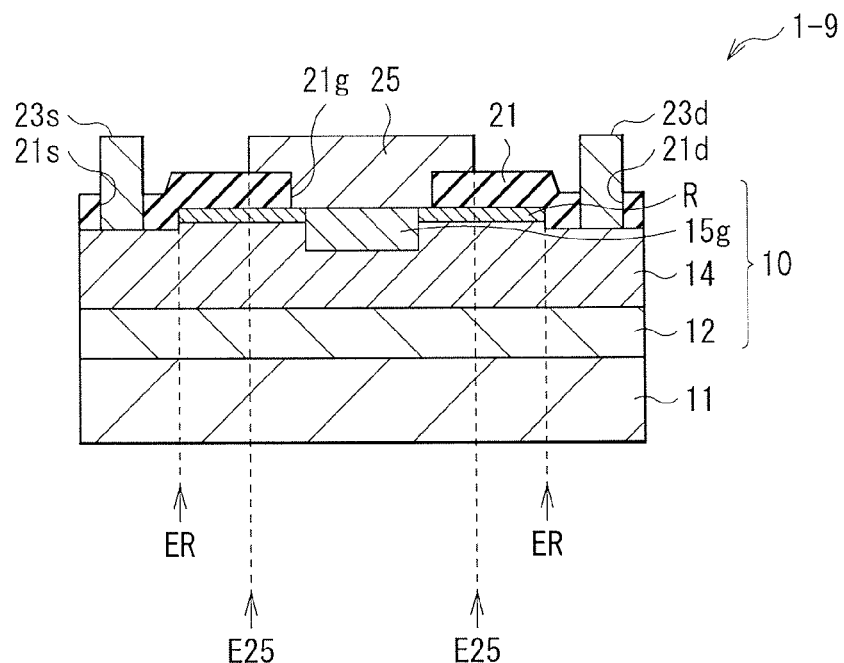

FIG. 55 is a cross-sectional view showing an example of a configuration of a substantial part of a semiconductor device according to a modification example 2.

Figure 56:
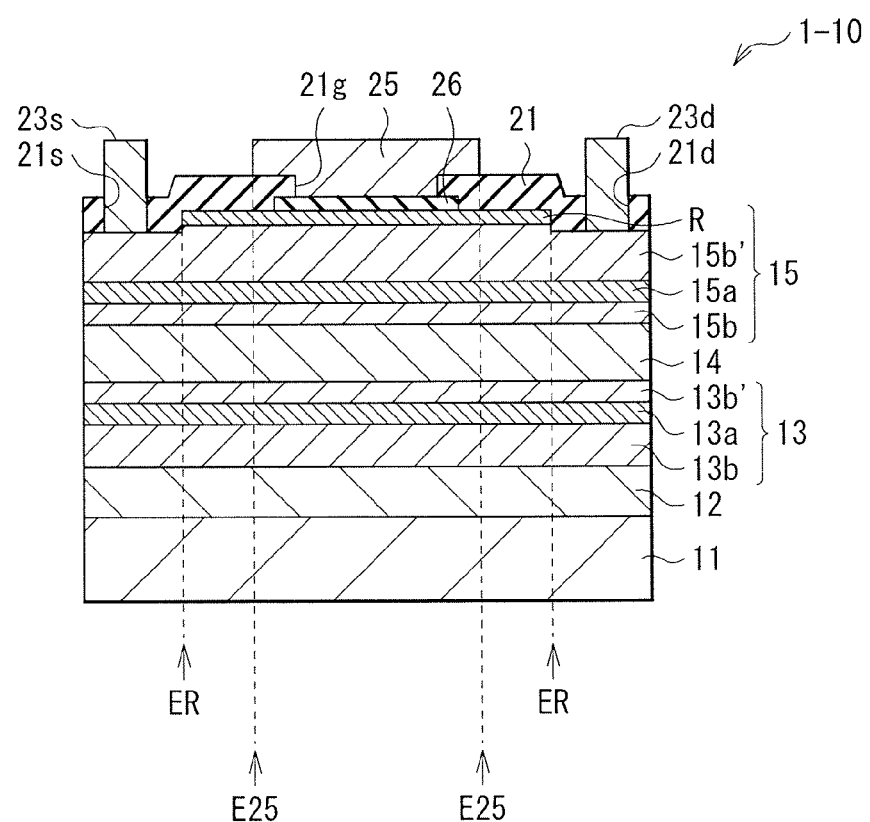

FIG. 56 is a cross-sectional view showing another example of a configuration of a substantial part of the semiconductor device according to the modification example 2.

Figure 57:
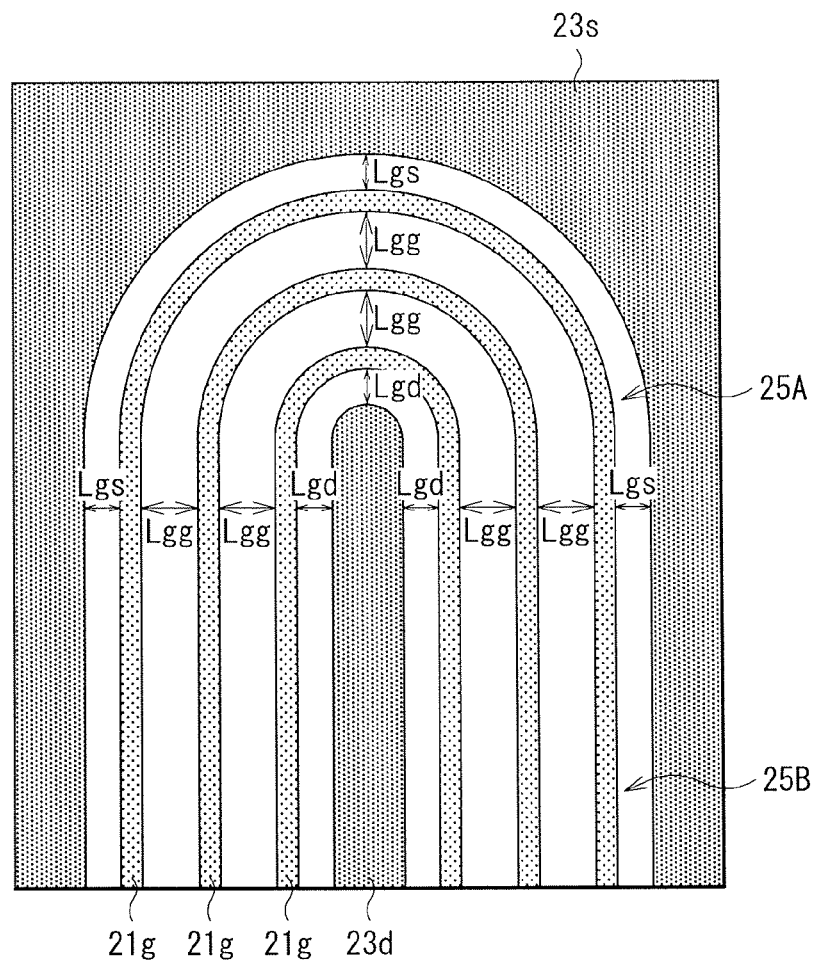

FIG. 57 is a schematic plan view showing an enlarged view of a folded-back part in the semiconductor device according to the ninth embodiment of the present technology.

Figure 58:
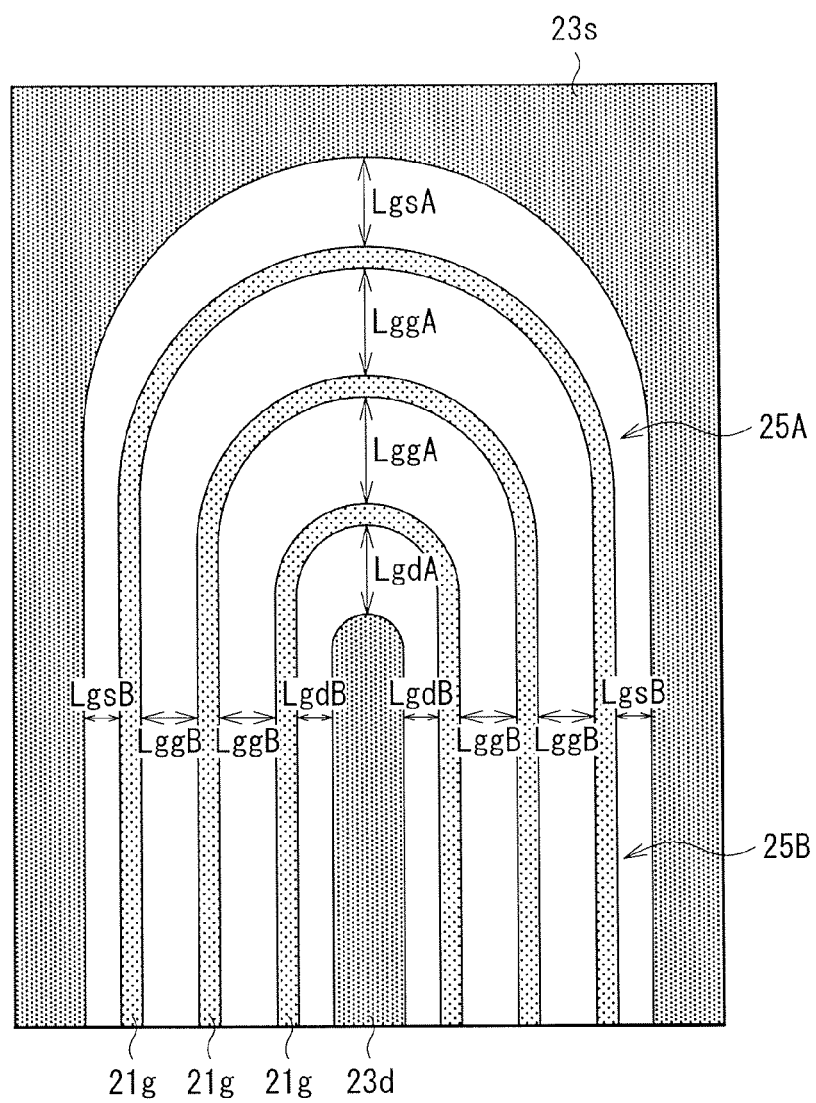

FIG. 58 is a schematic plan view showing an enlarged view of a folded-back part in a semiconductor device according to modification example 3.

Figure 59:
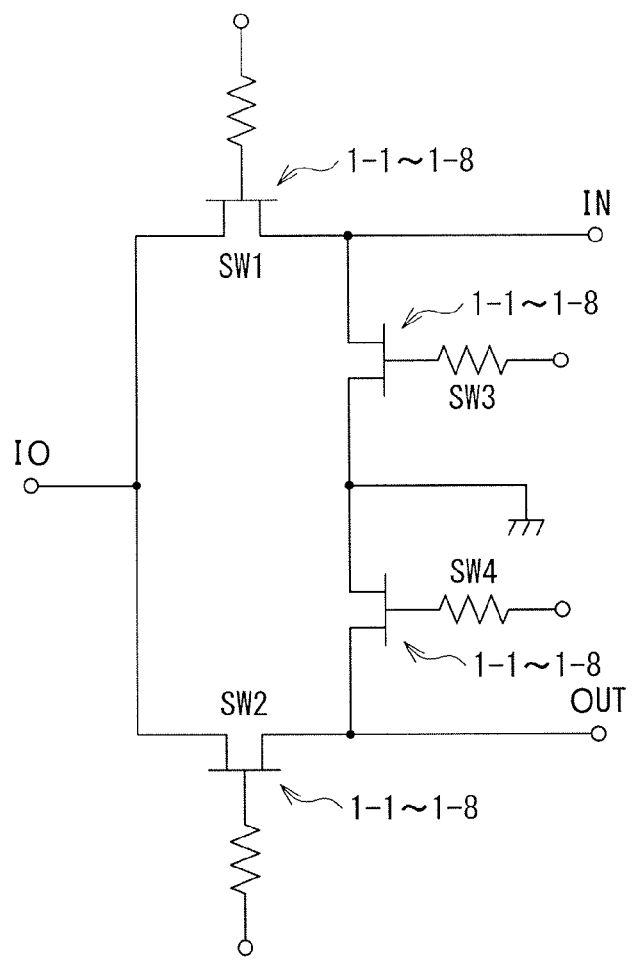

FIG. 59 is a circuit diagram showing an example of an antenna switch circuit.

Figure 60:
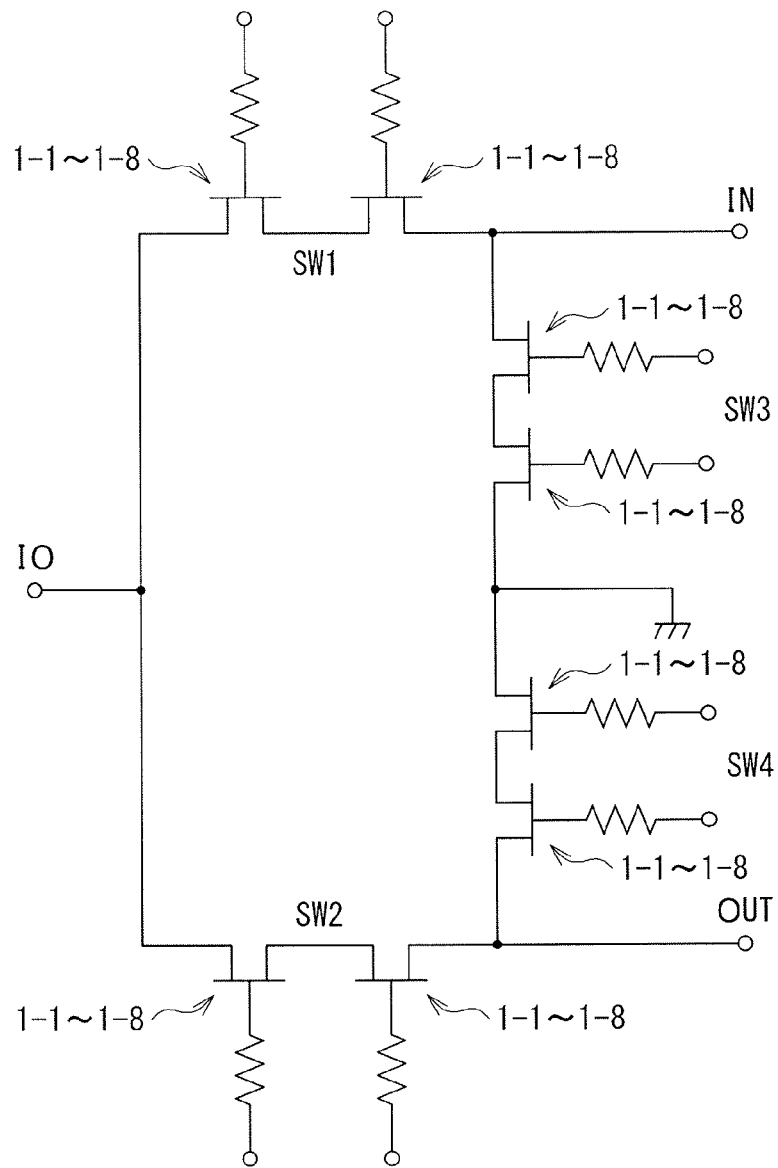

FIG. 60 is a circuit diagram showing another example of the antenna switch circuit.

Figure 61:
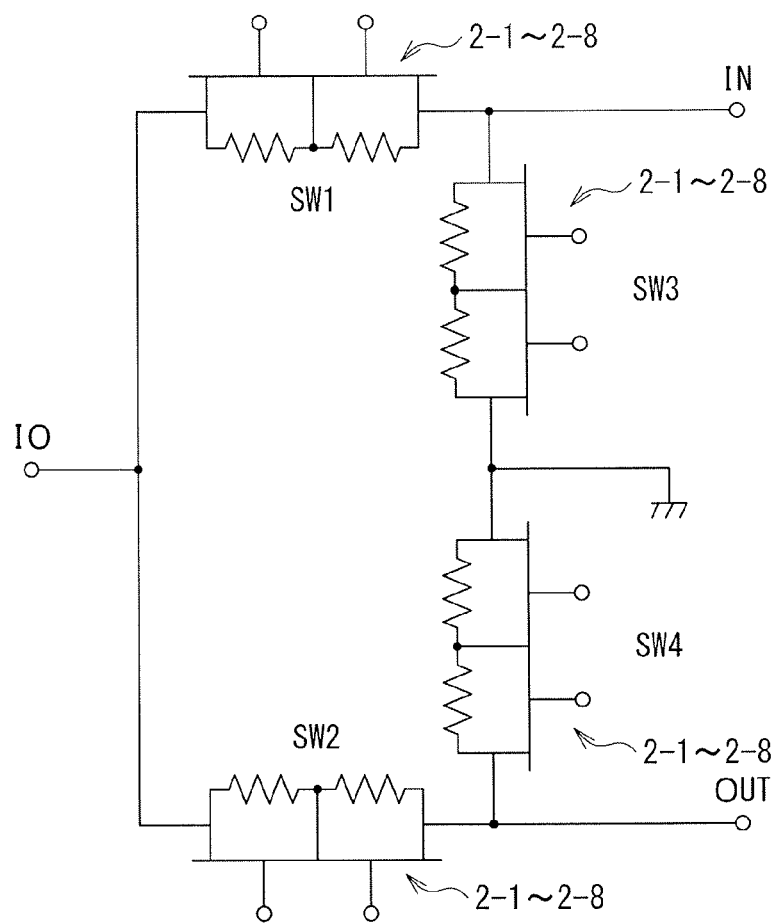

FIG. 61 is a circuit diagram showing still another example of the antenna switch circuit.

Figure 62:
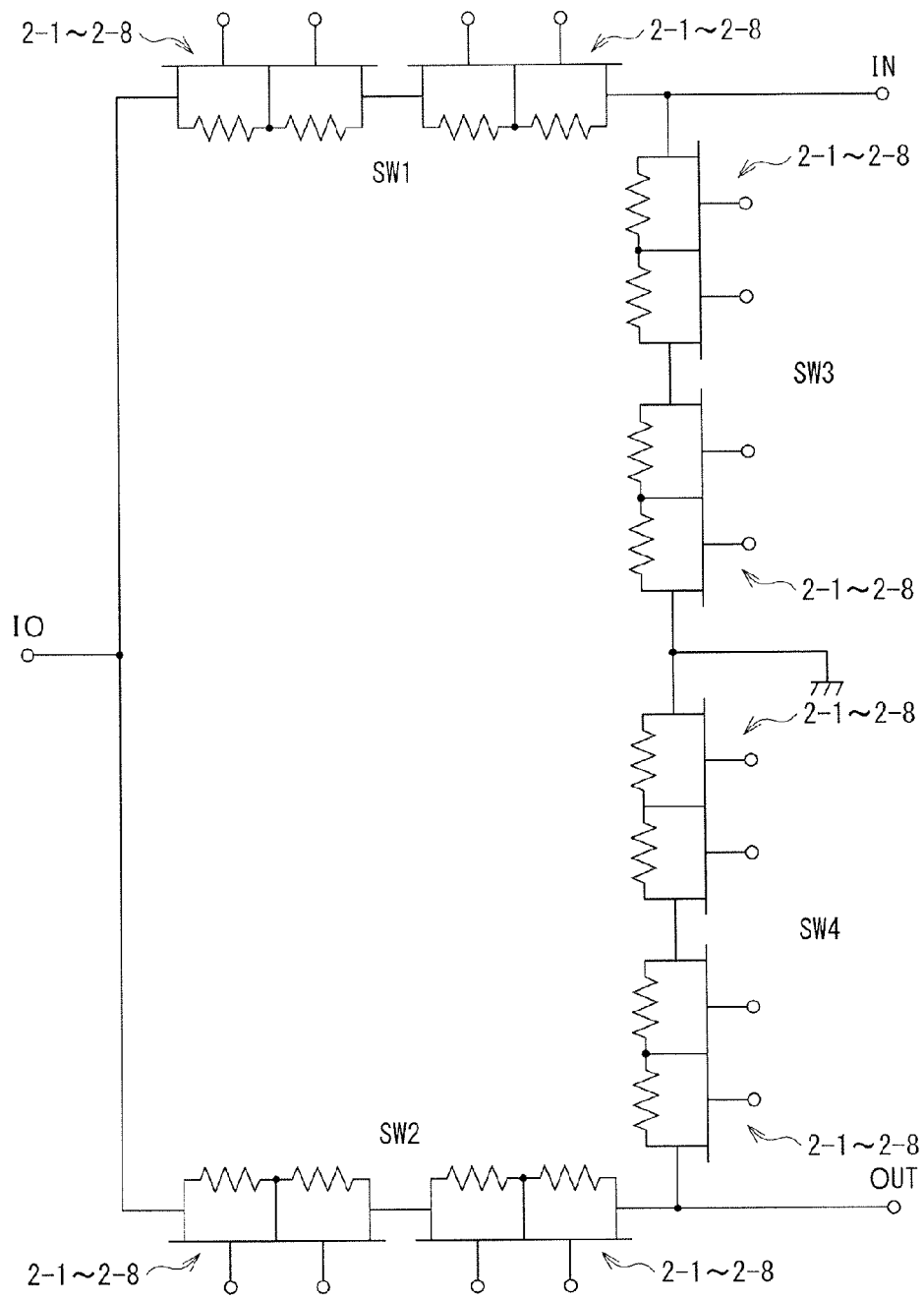

FIG. 62 is a circuit diagram showing further still another example of the antenna switch circuit.

Figure 63:
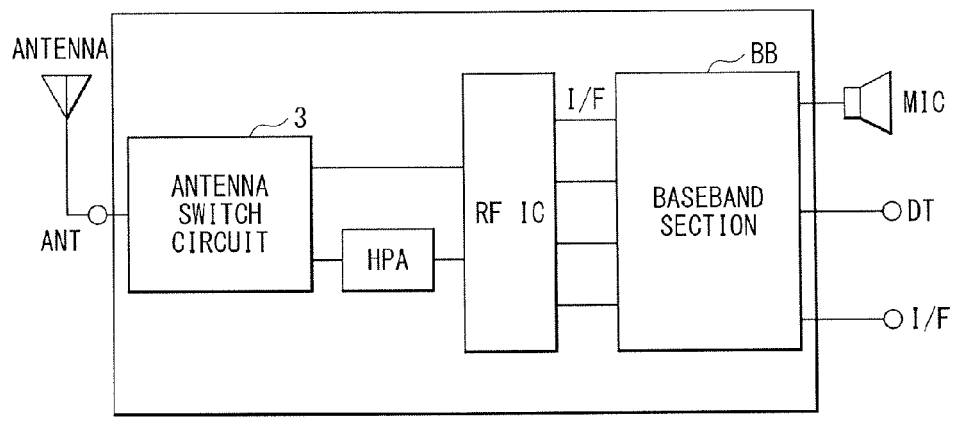

FIG. 63 is a schematic block diagram showing an example of a radio communication apparatus.

DETAILED DESCRIPTION

Hereinafter, some embodiments of the present technology are described with reference to the drawings in the order given below.
1. First Embodiment (an example where a second low-resistance region is provided on both sides of a first low-resistance region)
2. Second Embodiment (an example where the second low-resistance region is provided over a whole surface)
3. Third Embodiment (an example where the second low-resistance region is removed at a junction with a source electrode or a drain electrode)
4. Fourth Embodiment (an example where a high-resistance region is provided on top of the second low-resistance region)
5. Fifth Embodiment (an example where the second low-resistance region that is formed by impurity diffusion is provided)
6. Sixth Embodiment (an example where a cap layer is provided between a top barrier layer and the source electrode/drain electrode)
7. Seventh Embodiment (an example where the second low-resistance region is provided only on one side of the first low-resistance region)
8. Eighth Embodiment (an example where a source region and a drain region are provided)
9. Ninth Embodiment (an example where a multigate structure is used in the first embodiment; an example where the second low-resistance region is provided on both sides of the first low-resistance region)
10. Tenth Embodiment (an example where a multigate structure is used in the second embodiment; an example where the second low-resistance region is provided over a whole surface)
11. Eleventh Embodiment (an example where a multigate structure is used in the third embodiment; an example where the second low-resistance region is removed at a junction with a source electrode or a drain electrode)
12. Twelfth Embodiment (an example where a multigate structure is used in the fourth embodiment; an example where a high-resistance region is provided on top of the second low-resistance region)
13. Thirteenth Embodiment (an example where a multigate structure is used in the fifth embodiment; an example where the second low-resistance region that is formed by impurity diffusion is provided)
14. Fourteenth Embodiment (an example where a multigate structure is used in the sixth embodiment; an example where a cap layer is provided between a top barrier layer and the source electrode/drain electrode)
15. Fifteenth Embodiment (an example where a multigate structure is used; an example where the source electrode and the drain electrode are provided on the second low-resistance region)
16. Sixteenth Embodiment (an example where a multigate structure is used in the eighth embodiment; an example where a source region and a drain region are provided)
17. Modification Example 1 (an example where layers on top of a substrate are not lattice-matched between each other)
18. Modification Example 2 (JFET and MISJPHEMT)
19. Modification Example 3 (an example where a difference is made in device parameters between a folded-back part and a linear part)
20. Application Examples (antenna switch circuit and radio communication apparatus)

It is to be noted that any component parts which are in common in the above-described respective embodiments are denoted with the same reference numerals, and the overlapped descriptions are omitted as appropriate.

1. First Embodiment

Example where Second Low-Resistance Region is Provided on Both Sides of First Low-Resistance Region In this first embodiment, with reference to the related drawings, the description is provided on a configuration, a band structure, operation, a manufacturing method, and advantageous effects of a semiconductor device according to the first embodiment of the present technology in this order.
(Configuration of Semiconductor Device According to First Embodiment)

Figure 1:
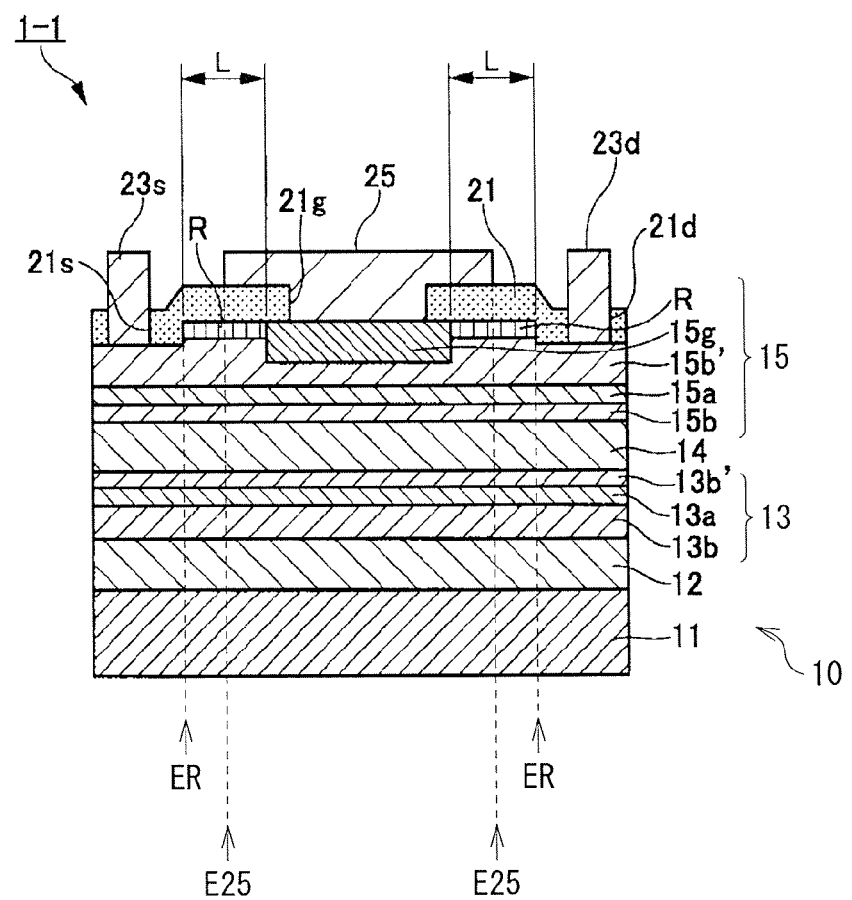
FIG. 1 is a cross-sectional view showing a configuration of a substantial part of a semiconductor device according to a first embodiment of the present technology.
Figure 2:
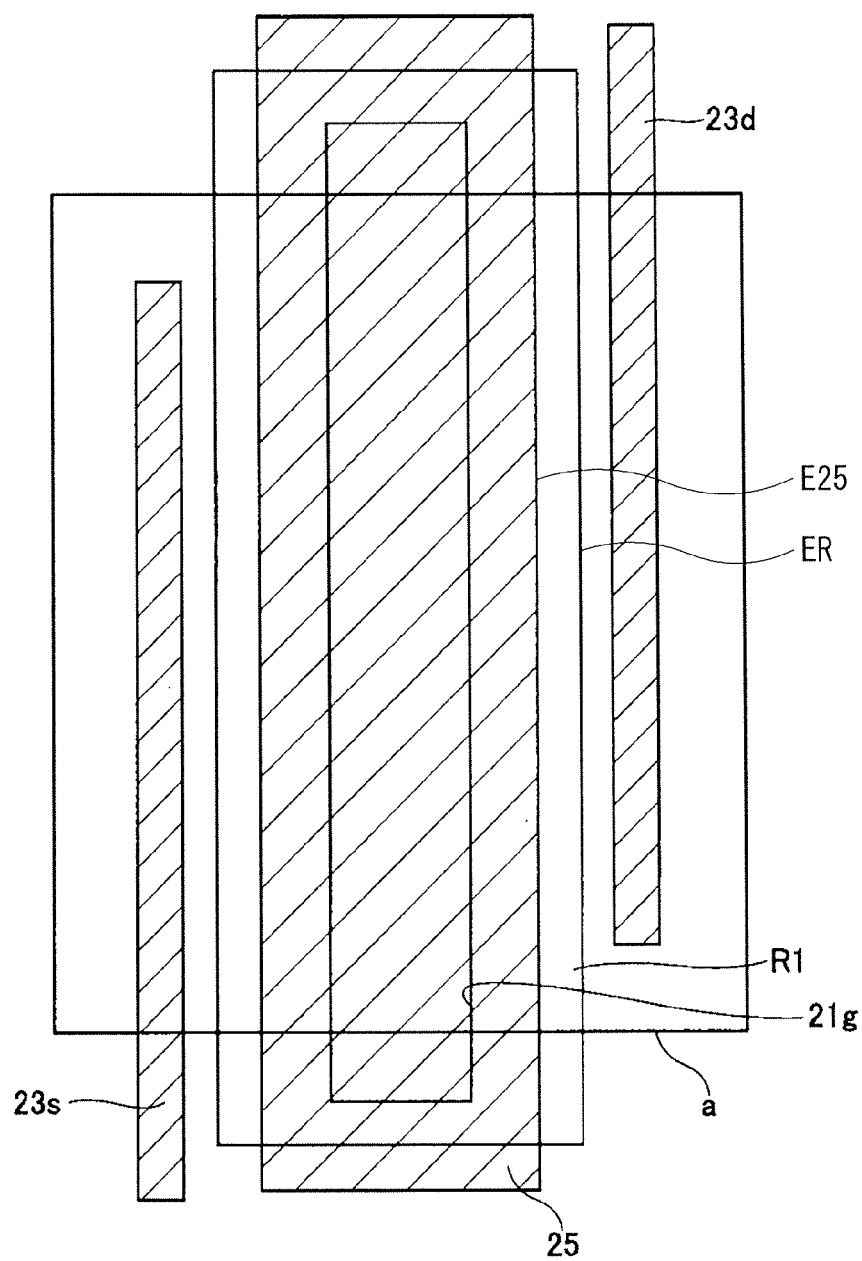
FIG. 2 is a schematic top view of the semiconductor device according to the first embodiment of the present technology.
Figure 3:
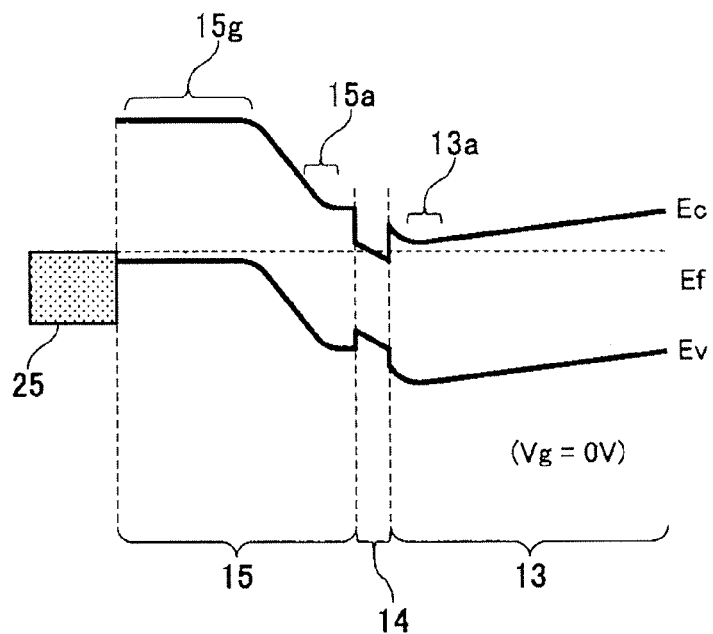
FIG. 3 is an energy band structure diagram in a junction state of the semiconductor device according to the first embodiment of the present technology.

FIG. 1 is a cross-sectional view showing a configuration of a substantial part of the semiconductor device according to the first embodiment of the present technology. FIG. 2 is a schematic top view of the semiconductor device according to the first embodiment of the present technology, and FIG. 3 is an energy band structure diagram in a junction state of such a semiconductor device. Hereinafter, with reference to these drawings, the description is provided on a detailed configuration of the semiconductor device according to the first embodiment of the present technology. It is to be noted that the description is hereinafter provided on the assumption that a first conductivity type is n type, and a second conductivity type is p type, although inversely a first conductivity type may be p type, and a second conductivity type may be n type.

The semiconductor device 1-1 according to the first embodiment of the present technology that is shown in FIG. 1 has a laminated body 10 including a channel layer 14 that is configured of a compound semiconductor, and a gate electrode 25 that is provided on the top surface side of the laminated body 10.

More specifically, the semiconductor device 1-1 is a so-called JPHEMT that includes a barrier layer 15 between the gate electrode 25 and the channel layer 14, as well as a first low-resistance region 15g of a reverse-conductivity type inside the barrier layer 15. In this semiconductor device 1-1, a buffer layer 12, a bottom barrier layer 13, the channel layer 14, and a top barrier layer 15 each of which is configured of a compound semiconductor material are laminated in this order on a substrate 11 that is configured of a compound semiconductor. Each layer from the buffer layer 12 up to the top barrier layer 15 configures the laminated body 10. A carrier supply region 13a is provided inside the bottom barrier layer 13, and a carrier supply region 15a is provided inside the top barrier layer 15. Further, a first low-resistance region 15g is provided on the top surface side of the top barrier layer 15, and a second low-resistance region R is provided on both sides of the first low-resistance region 15g.

On the laminated body including the above-described layers each of which is configured of a compound semiconductor material, there is provided an insulating film 21. This insulating film 21 is provided with source opening 21s/drain opening 21d, and a gate opening 21g that is interposed between the openings 21s and 21d. On such an insulating film 21, there are provided source electrode 23s/drain electrode 23d that are connected with the top barrier layer 15 via the source opening 21s and the drain opening 21d. Further, on the insulating film 21, there is provided a gate electrode 25 that is connected with the first low-resistance region 15g on the top barrier layer 15 via the gate opening 21g.

It is to be noted that FIG. 1 illustrates a case where an end ER of the second low-resistance region R is located on the outer side from an end E25 of the gate electrode 25. However, the end ER of the second low-resistance region R may not be necessarily located on the outer side from the end E25 of the gate electrode 25.

More specifically, the first low-resistance region 15g is provided at a region facing the gate opening 21g on the top surface side of the laminated body 10. However, the first low-resistance region 15g is not only provided at a region facing the gate opening 21g, but also may run over the region to be extended to a surrounding area thereof. The second low-resistance region R is extended on the top surface side of the laminated body 10, and is continuous with the first low-resistance region 15g.

Hereinafter, the description is provided on a detailed configuration of each of the above-described component parts that configure the semiconductor device 1-1 in order from the substrate 11 side.

[Substrate 11]

The substrate 11 is configured of a semi-insulating compound semiconductor material. Such a substrate 11 may be configured of, for example, a group-III-V compound semiconductor material, and examples of the substrate 11 may include a semi-insulating single-crystal GaAs substrate and an InP substrate.

[Buffer Layer 12]

The buffer layer 12 may be configured of, for example, a compound semiconductor layer that is subjected to epitaxial growth on the substrate 11, and may be configured of a compound semiconductor that is well lattice-matched to the substrate 11 and the bottom barrier layer 13. For example, when the substrate 11 is configured of a single-crystal GaAs substrate, an epitaxial growth layer of u-GaAs is not doped with any impurities ("u-" denotes undoped; the same applies hereinafter) may be used as an example of such a buffer layer 12.

[Bottom Barrier Layer 13]

The bottom barrier layer 13 may be configured of, for example, a group-III-V compound semiconductor that is well lattice-matched to the buffer layer 12 and the channel layer 14 on the upper part and that has a bandgap wider than that of a compound semiconductor material configuring the channel layer 14. As an example of such a bottom barrier layer 13, an epitaxial growth layer of an AlGaAs mixed crystal may be used. Here, in particular, it is assumed that the bottom barrier layer 13 is configured of an $Al_{0.2}Ga_{0.8}As$ mixed crystal in which a composition ratio of aluminum (Al) in group-III elements is 0.2.

Such a bottom barrier layer 13 has the carrier supply region 13a that includes impurities for supplying carriers. Here, it is assumed that electrons are used as the carriers, and the n-type carrier supply region 13a that includes n-type impurities as impurities for supplying the electrons is arranged at an intermediate portion in a film thickness direction of the bottom barrier layer 13. As the n-type impurities in the bottom barrier layer 13 that is configured of the $Al_{0.2}Ga_{0.8}As$ mixed crystal, silicon (Si) is used.

Further, any part in the film thickness direction other than the carrier supply region 13a in the bottom barrier layer 13 may be formed as high-resistance regions 13b and 13b' are non-doped or include low-concentrated n-type impurities or p-type impurities. Each of these high-resistance regions 13b and 13b' may desirably have an impurity concentration of about $1 \times 10^{17}$ pieces/$cm^3$ or less, and a specific resistance of about $1 \times 10^{-2}$ ohm cm or more.

One example of a specific configuration of the bottom barrier layer 13 as described above is as follows. The high-resistance region 13b that has a film thickness of about 200 nm and is undoped is provided on the buffer layer 12 side. On top of this high-resistance region 13b, the carrier supply region 13a is laminated that has a film thickness of about 4 nm and includes silicon (Si) of about $1.6 \times 10^{12}$ pieces/$cm^2$. Further, on top of the carrier supply region 13a, the high-resistance region 13b' is laminated that has a film thickness of about 2 nm and is undoped.

It is to be noted that the bottom barrier layer 13 may not include the high-resistance regions 13b and 13b', and a whole region thereof may be configured as the carrier supply region 13a.

[Channel Layer 14]

The channel layer 14, which serves as a current path between the source electrode 23s and the drain electrode 23d, is a layer on which carriers that are supplied from the carrier supply region 13a on the bottom barrier layer 13 and the carrier supply region 15a on the top barrier layer 15 to be hereinafter described are accumulated. Such a channel layer 14 is configured of a compound semiconductor that forms a heterojunction with the bottom barrier layer 13, and is well lattice-matched to the bottom barrier layer 13. Further, it is assumed that the channel layer 14 is configured of a compound semiconductor in which an energy band on the carrier-traveling side at the heterojunction with the bottom barrier layer 13 is closer to an intrinsic Fermi level within the channel layer than an energy band on the carrier-traveling side in a compound semiconductor material that configures an interface region of the bottom barrier layer 13. Accordingly, the bottom barrier layer 13 is configured of a compound semiconductor in which an energy band on the carrier-traveling side at a heterojunction with the channel layer 14 is farther from the intrinsic Fermi level within the channel layer as compared with the channel layer 14.

In other words, the channel layer 14 is configured of a compound semiconductor in which an energy band on the majority-carrier-traveling side at the heterojunction with the bottom barrier layer 13 is closer to an energy band on the minority-carrier-traveling side than an energy band on the majority-carrier-traveling side in a compound semiconductor material that configures an interface region of the bottom barrier layer 13. It is to be noted that the intrinsic Fermi level within the channel layer is located midway between the lowest energy at a conduction band of the channel layer 14 (hereinafter referred to as a conduction band energy Ec) and the highest energy at a valence band (hereinafter referred to as a valence band energy Ev).

Here, when the carriers are electrons, an energy band on the carrier-traveling side is a conduction band. Therefore, the channel layer 14 is configured of a group-III-V compound semiconductor material the conduction band energy Ec of which is at least lower than that of a compound semiconductor material configuring the bottom barrier layer 13 at a junction with the bottom barrier layer 13. For such a channel layer 14, it may be preferable that a difference in the conduction band energy Ec between the channel layer 14 and the bottom barrier layer 13 be larger at a junction with the bottom barrier layer 13.

On the other hand, when the carriers are holes, an energy band on the carrier-traveling side is a valence band (valence electron band). Therefore, the channel layer 14 is configured of a compound semiconductor material the valence band energy Ev of which is at least higher than that of a compound semiconductor material configuring the bottom barrier layer 13 at a junction with the bottom barrier layer 13. For such a channel layer 14, it may be preferable that a difference in the valence band energy Ev between the channel layer 14 and the bottom barrier layer 13 be larger at a junction with the bottom barrier layer 13. It is to be noted that the description is hereinafter provided by exemplifying a case where the carriers are electrons. However, when the carriers are holes, the description on the impurities and energy band may be considered as the description on those of reverse-conductivity type.

It is to be noted that, typically, such a channel layer 14 may be preferably configured of a group-III-V compound semiconductor material that is well lattice-matched to the bottom barrier layer 13 and that has a bandgap narrower than that of a compound semiconductor material configuring the bottom barrier layer 13. Further, for such a channel layer 14, it may be preferable that a difference in the bandgap between the channel layer 14 and the bottom barrier layer 13 be larger.

For example, when the bottom barrier layer 13 is configured of the $Al_{0.2}Ga_{0.8}As$ mixed crystal, the channel layer 14 as described above may be configured of an InGaAs mixed crystal. In this case, it is possible to narrow down a bandgap in the InGaAs mixed crystal with an increase in a composition ratio of indium (In), as well as to increase a difference in the conduction band energy Ec between the channel layer 14 and the bottom barrier layer 13 that is configured of the AlGaAs mixed crystal. Accordingly, for the InGaAs mixed crystal that configures the channel layer 14, a composition ratio of indium (In) in group-III elements may be about 0.1 or more.

As an example, such a channel layer 14 may be configured of an $In_{0.2}Ga_{0.8}As$ mixed crystal in which a composition ratio of indium (In) in group-III elements is about 0.2. This allows the channel layer 14 to ensure the lattice-matching to the bottom barrier layer 13, as well as a sufficiently significant difference in the conduction band energy Ec.

Further, such a channel layer 14 may be an u-InGaAs mixed crystal that is undoped. This makes it possible to suppress impurity scattering of the carriers, thereby allowing the carrier migration with the high carrier mobility to be achieved.

It is to be noted that the channel layer 14 may be an epitaxial growth layer that is formed with a film thickness of about 15 nm or less. This makes it possible to achieve the layer that ensures the crystallinity and the excellent carrier-traveling performance.

[Top Barrier Layer 15]

The top barrier layer 15 is well lattice-matched to the channel layer 14. This top barrier layer 15 is configured of a compound semiconductor in which an energy band on the carrier-traveling side at a junction with the channel layer 14 is farther from the intrinsic Fermi level within the channel layer than in a compound semiconductor material that configures the channel layer 14. In other words, the top barrier layer 15 is configured of a compound semiconductor in which an energy band on the majority-carrier-traveling side at the junction with the channel layer 14 is farther from the intrinsic Fermi level within the channel layer than the compound semiconductor material that configures the channel layer 14. When the carriers are electrons, the top barrier layer 15 is configured of a group-III-V compound semiconductor material the conduction band energy Ec of which is higher than that of the compound semiconductor material configuring the channel layer 14. For such a top barrier layer 15, it may be preferable that a difference in the conduction band energy Ec between the channel layer 14 and the top barrier layer 15 be larger at a junction with the channel layer 14.

The top barrier layer 15 as described above may be configured of, for example, an AlGaAs mixed crystal that is wider than the InGaAs mixed crystal in a bandgap if the channel layer 14 is configured of the InGaAs mixed crystal. In this case, it is possible to prevent an increase in a so-called source resistance by keeping a composition ratio of aluminum (Al) at a low value. Further, it is also possible to assure the controllability by reducing the diffusion speed in forming the first low-resistance region 15g to be described next using a diffusion technique. Therefore, for the AlGaAs mixed crystal that configures the top barrier layer 15, a composition ratio of aluminum (Al) in group-III elements may be about 0.25 or less.

As an example, such a top barrier layer 15 may be configured of an $Al_{0.2}Ga_{0.8}As$ mixed crystal in which a composition ratio of aluminum (Al) in group-III elements is about 0.2. This makes it possible to assure the lattice-matching to the channel layer 14. It is to be noted that the top barrier layer 15 may not have the same composition ratio as the bottom barrier layer 13. The bottom barrier layer 13 and the top barrier layer 15 may be configured of AlGaAs mixed crystals with respective suitable composition ratios. For example, a composition ratio of aluminum (Al) in the top barrier layer 15 may be set at a lower value as compared with that of the bottom barrier layer 13 that does not include the first low-resistance region 15g formed by the diffusion technique.

Such a top barrier layer 15 has the carrier supply region 15a that includes impurities for supplying carriers. Here, the n-type carrier supply region 15a that includes silicon (Si) as n-type impurities for supplying the electrons is arranged with a film thickness of about 4 nm at an intermediate portion in the film thickness direction of the top barrier layer 15.

Further, a region where the carrier supply region 15a is interposed between in the film thickness direction on the top barrier layer 15 may be formed as high-resistance regions 15b and 15b' that are non-doped or include low-concentrated impurities. When these high-resistance regions 15b and 15b' include impurities, the high-resistance region 15b on the channel layer 14 side includes n-type impurities or p-type impurities. On the other hand, the high-resistance region 15b' that is located on the opposite side of the channel layer 14 as a region configuring the surface side of the top barrier layer 15 includes n-type impurities. Each of these high-resistance regions 15b and 15b' may preferably have an impurity concentration of about $1\times10^{17}$ pieces/cm$^3$ or less, and a specific resistance of about $1\times10^{-2}$ ohm cm or more.

Further, on the surface side of the top barrier layer 15, there are provided the first low-resistance region 15g and the second low-resistance region R to be hereinafter described. The second low-resistance region R is provided at a portion where the surface on the opposite side of the channel layer 14 on the top barrier layer 15 is patterned, and the first low-resistance region 15g is provided at a patterned central portion. In other words, the top barrier layer 15 is convex on the opposite side of the channel layer 14 in correspondence with a portion where the second low-resistance region R is formed.

One example of a specific configuration of the top barrier layer 15 as described above is as follows. The high-resistance region 15b that has a film thickness of about 2 nm and is non-doped is provided on the channel layer 14 side. On top of this high-resistance region 15b, the carrier supply region 15a is laminated that has a film thickness of about 4 nm and includes silicon (Si) of about $1.6\times10^{12}$ pieces/cm$^2$. Further, on top of the carrier supply region 15a, the high-resistance region 15b' is laminated that has a film thickness of about 100 nm and is non-doped.

On top of the high-resistance region 15b', a portion is laminated that configures the second low-resistance region R in which a portion of a film thickness of about 30 nm is patterned. Further, the first low-resistance region 15g is provided in depth reaching the high-resistance region 15b' from the surface of the second low-resistance region R.

It is to be noted that when the channel layer 14 is configured of the InGaAs mixed crystal, a constitutional material for the top barrier layer 15 is not limited to the AlGaAs mixed crystal, and the top barrier layer 15 may be configured of an In(AlGa)AsP mixed crystal that is a group-III-V compound semiconductor. This makes it possible to increase a composition ratio of indium (In) in the channel layer 14 that is configured of the InGaAs mixed crystal, thereby allowing the carrier mobility in the channel layer 14 to be enhanced.

[First Low-Resistance Region 15g]

The first low-resistance region 15g is located inside the top barrier layer 15, and is provided at a spacing interval with respect to the carrier supply region 15a of the top barrier layer 15 at a shallow position on the surface side from the carrier supply region 15a on a surface layer on the opposite side of the channel layer 14. This first low-resistance region 15g includes impurities of the conductivity type reverse to that of carriers traveling in the channel layer 14, and is kept at a resistance lower than that of the surrounding high-resistance region 15b'. As a result, when the carriers are electrons, p-type impurities are diffused in the first low-resistance region 15g.

A thickness (depth) of the first low-resistance region 15g and a value of the p-type impurity concentration are determined by a threshold voltage of a transistor. More specifically, the threshold voltage is raised with an increase in thickness of the first low-resistance region 15g or the p-type impurity concentration. On the other hand, the threshold voltage is lowered with a decrease in thickness of the first low-resistance region 15g or the p-type impurity concentration.

As an example, the first low-resistance region 15g may include the p-type impurities of about $1\times10^{18}$ pieces/cm$^3$ or more, and one example may be about $1\times10^{19}$ pieces/cm$^3$. It is to be noted that carbon (C), zinc (Zn), and magnesium (Mg) are used as the p-type impurities in the top barrier layer 15 that is configured of the In(AlGa)AsP mixed crystal. These impurities are selected as appropriate to be used depending on a method of forming the first low-resistance region 15g.

[Second Low-Resistance Region R]

The second low-resistance region R is formed at a portion where a surface layer on the opposite side of the channel layer 14 on the top barrier layer 15 is patterned, and is provided from the first low-resistance region 15g toward the source electrode 23s/drain electrode 23d side.

Here, the laminated body 10 as far as the top barrier layer 15 that is formed on the substrate 11 is separated by a device isolation region that is omitted in illustration of the cross-sectional view. As shown in the schematic top view of FIG. 2, a top portion of the substrate 11 is separated into island-shaped active regions "a" by such a device isolation region, and a portion R1 where a surface layer of the top barrier layer 15 is patterned is provided to get across a center of this active region "a". The second low-resistance region R is provided at the active region "a" in this patterned portion R1.

The second low-resistance region R is configured as a p-type region that includes impurities of the conductivity type reverse to that of carriers traveling in the channel layer 14 (that is, p-type impurities here). It is important that the second low-resistance region R is formed as a region where the p-type charge amount in the whole region is smaller than that in the first low-resistance region 15g. It is assumed that the p-type charge amount in the second low-resistance region R is within the extent where holes inside the second low-resistance region R (charges of the conductivity type reverse to that of carriers traveling in the channel layer 14) are drained to be put in a depletion state at the time of off-operation during which a negative voltage is applied to the gate electrode 25. Further, the second low-resistance region R may be preferably smaller in the p-type charge amount per unit length (per unit transverse directional length of the drawing) than the first low-resistance region 15g. This makes it possible to ensure that the second low-resistance region R is smaller in the p-type charge amount than the first low-resistance region 15g even when a transverse directional length of the second low-resistance region R becomes excessively large.

Here, in particular, it is assumed that the second low-resistance region R is formed shallower than the first low-resistance region 15g, that is, the second low-resistance region R is formed with a film thickness smaller than that of the first low-resistance region 15g. This ensures that the p-type charge amount in the second low-resistance region R is kept to be smaller than the p-type charge amount in the first low-resistance region 15g. In this case, for example, the second low-resistance region R may include the p-type impurities of about $1\times10^{18}$ pieces/cm$^3$, and one example may be about $1\times10^{18}$ pieces/cm$^3$.

It is to be noted that the second low-resistance region R may be configured in the same degree of depth as the first low-resistance region 15g, that is, with the same degree of film thickness as the first low-resistance region 15g, as well as with the p-type impurity concentration lower than that in the first low-resistance region 15g.

As the p-type impurities that are included in the second low-resistance region R as described above, carbon (C), zinc (Zn), and magnesium (Mg) are used. These impurities are selected as appropriate to be used depending on a method of forming the second low-resistance region R.

Further, a projecting width L of the second low-resistance region R from the first low-resistance region 15g is to be large enough within a range where the second low-resistance region R does not reach the source electrode 23s/drain electrode 23d, and for example, L may be equal to about 0.8 µm.

It is to be noted that a carrier depletion region within the channel layer 14 to be hereinafter described is extended more easily by reducing the impurity concentration in the second low-resistance region R toward the channel layer 14 side, for example. On the other hand, it is less likely that the second low-resistance region R will be influenced by an interface trap by reducing the impurity concentration toward the surface side, and a depletion layer between the second low-resistance region R and the channel layer 14 is controlled more easily at the time of off-operation.

Further, the second low-resistance region R may be configured of a semiconductor material different from a constituent material for the high-resistance region 15b' if such a material is a compound semiconductor that is well lattice-matched to the high-resistance region 15b'.

[Insulating Film 21]

The insulating film 21 is provided in a state of covering a whole surface on the top barrier layer 15. This insulating film 21 is configured of a material having the insulation property against a compound semiconductor configuring the top barrier layer 15 and a function of protecting the surface of the top barrier layer 15 against impurities such as ion. The insulating film 21 may be configured of, for example, silicon nitride ($Si_3N_4$) with a thickness of about 200 nm.

The insulating film 21 is provided with the source opening 21s/the drain opening 21d that reach the high-resistance region 15b' of the top barrier layer 15 at a position that is not overlapped with the second low-resistance region R at a location where the second low-resistance region R is interposed between. Further, the gate opening 21g in the shape of exposing the first low-resistance region 15g is provided between the source opening 21s and the drain opening 21d on the insulating film 21.

Each of the source opening 21s, the drain opening 21d, and the gate opening 21g is provided on the insulating film 21 as an independent opening section, respectively.

[Source Electrode 23s/Drain Electrode 23d]

Each of the source electrode 23s and the drain electrode 23d is ohmic-bonded to the high-resistance region 15b' of the top barrier layer 15 with the source opening 21s and the drain opening 21d in between, respectively at a position where the first low-resistance region 15g and the second low-resistance region R are interposed between. Each of the source electrode 23s and the drain electrode 23d is configured in such a manner that gold-germanium (AuGe), nickel (Ni), and gold (Au) are laminated sequentially in this order from the top barrier layer 15 side, and an underlying compound semiconductor layer is alloyed. Each of the source electrode 23s and the drain electrode 23d may have a film thickness of about 1000 nm, for example.

[Gate Electrode 25]

The gate electrode 25 is provided on top of the first low-resistance region 15g. Here, the gate electrode 25 is provided in a state of embedding the gate opening 21g, and is provided on the first low-resistance region 15g over the whole area on the bottom of the gate opening 21g. The gate electrode 25 is configured in such a manner that nickel (Ni) and gold (Au) are laminated sequentially in this order from the substrate 11 side.

(Band Structure)

FIG. 3 is an energy band structure diagram on the lower side of the gate electrode 25 of the semiconductor device 1-1 that is configured in the above-described manner, and illustrates a junction state where a gate voltage Vg is not applied. It is to be noted that this energy band structure diagram shows a case where the bottom barrier layer 13, the channel layer 14, and the top barrier layer 15 are configured of the $Al_{0.2}Ga_{0.8}As$ mixed crystal, $In_{0.2}Ga_{0.8}As$ mixed crystal, and $Al_{0.2}Ga_{0.8}As$ mixed crystal, respectively.

As shown in FIG. 3, the semiconductor device 1-1 according to the first embodiment of the present technology is configured in such a manner that the channel layer 14 with a narrow bandgap is interposed between the bottom barrier layer 13 and the top barrier layer 15 each of which is wider in the bandgap and higher in the conduction band energy Ec than the channel layer 14. Therefore, when electrons are supplied as the carriers from the carrier supply regions 13a and 15a of the bottom barrier layer 13 and the top barrier layer 15 respectively, the channel layer 14 serves as a two-dimensional electron gas layer on which these electrons are accumulated.

Further, a discontinuous quantity $\Delta Ec$ of a conduction band at a heterojunction with the channel layer 14 and the top barrier layer 15 is sufficiently large (about 0.31 eV here). In addition, a difference between a minimum point of the conduction band energy Ec in the top barrier layer 15 and the conduction band energy Ec in the channel layer 14 is also configured to be sufficiently large (about 0.20 eV or more here), and the number of electrons that are distributed in the top barrier layer 15 is negligibly smaller than the number of electrons that are distributed in the channel layer 14.

(Operation of Semiconductor Device According to First Embodiment)

Figure 4:
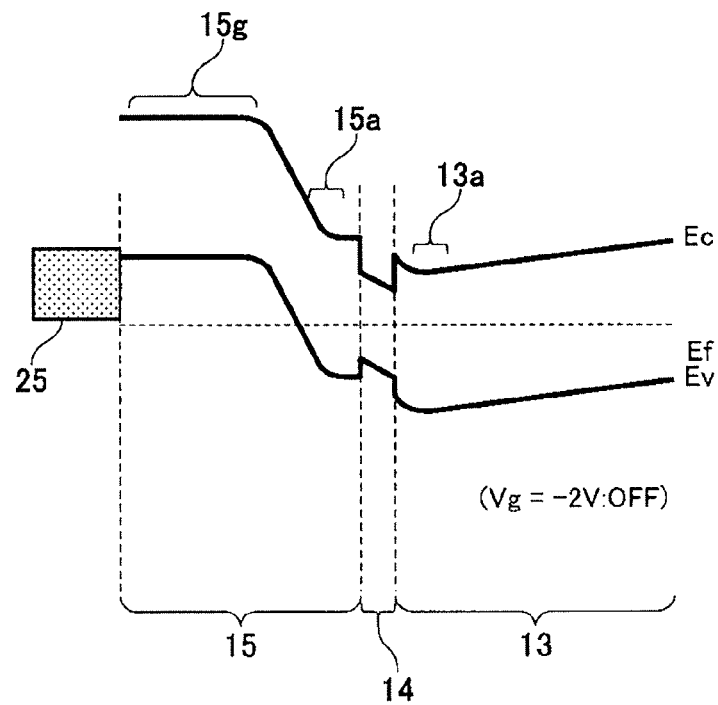
FIG. 4 is an energy band structure diagram at the time of off-operation of the semiconductor device according to the first embodiment of the present technology.
Figure 5:
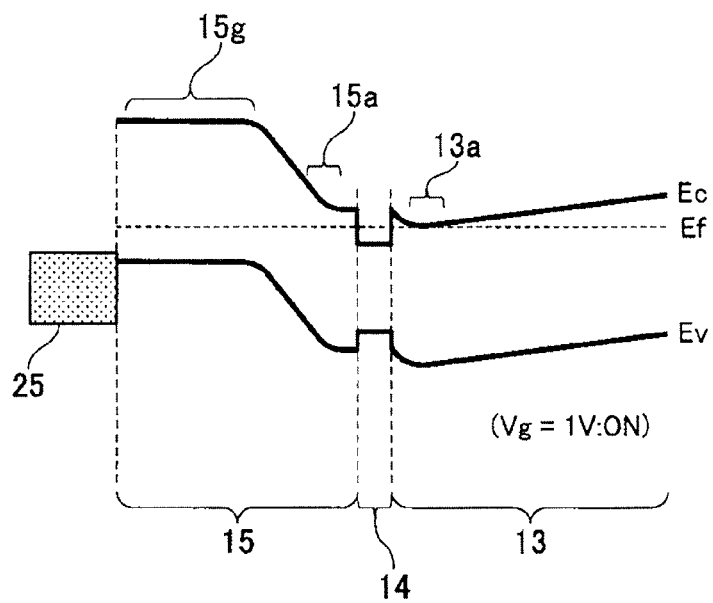
FIG. 5 is an energy band structure diagram at the time of on-operation of the semiconductor device according to the first embodiment of the present technology.
Figure 6:
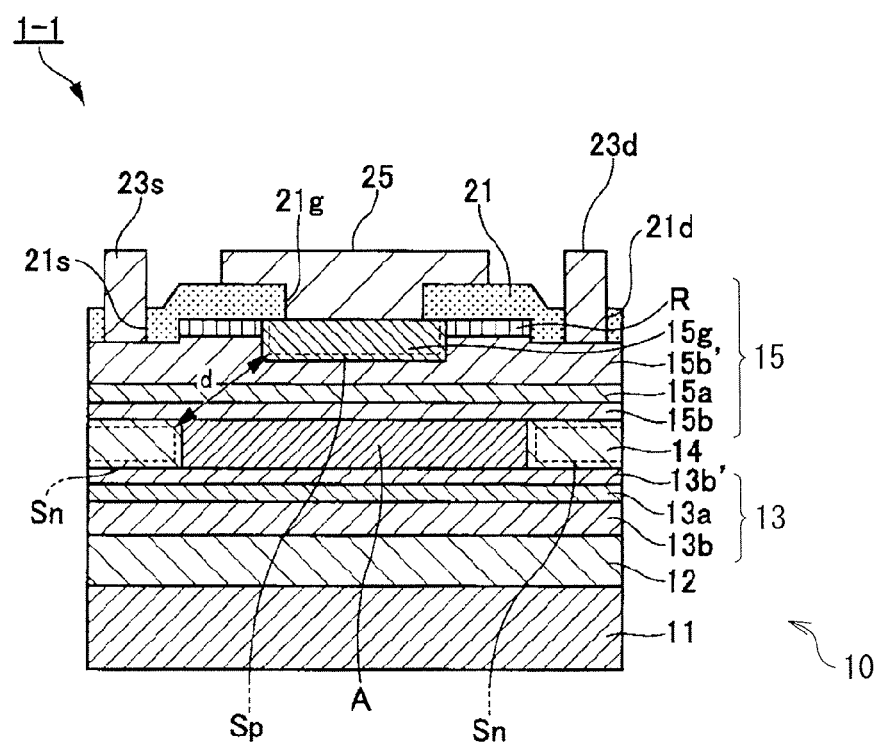
FIG. 6 is a cross-sectional view showing formation of a carrier depletion region at the time of off-operation of the semiconductor device according to the first embodiment of the present technology.

Next, the operation of the semiconductor device 1-1 adopting the above-described configuration that is mentioned using FIGS. 1 to 3 is described using energy band structure diagrams in FIG. 4 and FIG. 5, as well as a cross-sectional view of the semiconductor device 1-1 in FIG. 6 along with the foregoing FIG. 3. Here, the description is provided on the operation in a case where the semiconductor device 1-1 is a shallow depletion-type transistor having a threshold voltage of about −0.5 V.

FIG. 4 is an energy band structure diagram at the time of off-operation (Vg=about −2 V), and FIG. 5 is an energy band structure diagram at the time of on-operation (Vg=about 1 V). Further, as with FIG. 3, FIG. 4 and FIG. 5 show a case where each of the bottom barrier layer 13 and the top barrier layer 15 is configured of the $Al_{0.2}Ga_{0.8}As$ mixed crystal, and the channel layer 14 is configured of the $In_{0.2}Ga_{0.8}As$ mixed crystal.

Here, the semiconductor device 1-1 is a shallow depletion type. Accordingly, in a junction state (Vg=0) where no voltage is applied to the gate electrode 25, a carrier depletion region where electrons are depleted as compared with a surrounding area is formed at a region of the channel layer 14 that corresponds to an area directly beneath the p-type first low-resistance region 15g. An energy band structure at this time is as shown in FIG. 3 as described previously, and the channel layer 14 is put in a high-resistance state.

Here, a voltage nearly equal to the gate voltage at the time of off-operation (Vg=about −2 V) is applied to the gate electrode 25 to put the semiconductor device 1-1 in an off-operation state. It is to be noted that the voltage may be varied depending on a condition of the low-resistance region, and at least a voltage (Vg<about −2 V) lower than an off voltage (about −2 V) may be applied. In this case, as shown in a cross-sectional view in FIG. 6, a carrier depletion region A of the channel layer 14 that corresponds to an area directly beneath the p-type first low-resistance region 15g is placed in a depleted state with a further decrease in the number of carriers, and further extends as far as the channel layer 14 corresponding to an area directly beneath the second low-resistance region R. This causes a drain current Id to hardly flow. An energy band structure at this time is as shown in FIG. 4, and the conduction band energy Ec in the channel layer 14 becomes completely higher than the Fermi level Ef.

On the other hand, a voltage nearly equal to the gate voltage at the time of on-operation (Vg=about 1 V) is applied to the gate electrode 25 to put the semiconductor device 1-1 in an on-operation state. In this case, the carrier depletion region A illustrated in the cross-sectional view of FIG. 6 disappears, and the electrons in the channel layer 14 increase in number to cause the drain current Id to be modulated. An energy band structure at this time is as shown in FIG. 5, and the conduction band energy Ec in the channel layer 14 becomes lower than the Fermi level Ef.

(Method of Manufacturing Semiconductor Device According to First Embodiment)

Next, an example of a method of manufacturing the semiconductor device 1-1 adopting the above-described configuration is described with reference to cross-sectional process diagrams in FIG. 7 and FIG. 8.

[A of FIG. 7]

First, as shown in A of FIG. 7, the buffer layer 12 is formed by subjecting a non-doped u-GaAs layer to epitaxial growth on the substrate 11 that may be configured of, for example, GaAs. Subsequently, the bottom barrier layer 13 is formed by subjecting, for example, an AlGaAs ($Al_{0.2}Ga_{0.8}As$ mixed crystal) layer to epitaxial growth on the buffer layer 12. On this occasion, the high-resistance region 13b that may be configured of, for example, a non-doped u-AlGaAs layer, the carrier supply region 13a that may be configured of, for example, a silicon (Si)-doped n-type AlGaAs layer, and the high-resistance region 13b' that may be configured of, for example, a non-doped u-AlGaAs layer are sequentially subjected to epitaxial growth. Such a process completes the bottom barrier layer 13 that is provided with the n-type carrier supply region 13a at the center in the film thickness direction.

Thereafter, the channel layer 14 is formed by subjecting, for example, a non-doped u-InGaAs layer to epitaxial growth on the bottom barrier layer 13.

Subsequently, the top barrier layer 15 is formed by subjecting, for example, an AlGaAs ($Al_{0.2}Ga_{0.8}As$ mixed crystal) layer to epitaxial growth on the channel layer 14. On this occasion, the high-resistance region 15b that may be configured of, for example, a non-doped u-AlGaAs layer, the carrier supply region 15a that may be configured of, for example, a silicon (Si)-doped n-type AlGaAs layer, the high-resistance region 15b' that may be configured of, for example, a silicon (Si)-doped n-type AlGaAs layer, and the second low-resistance region R that may be configured of, for example, a carbon (C)-doped p-type AlGaAs layer are sequentially subjected to epitaxial growth. Such a process completes the top barrier layer 15 that is provided with the n-type carrier supply region 15a at the center in the film thickness direction and the second low-resistance region R at the uppermost part thereof.

Following the above processes, the device isolation region that is omitted in illustration of the drawing is formed. In this case, an inactive region that is increased in resistance by means of ion implantation of boron, for example, is formed as the device isolation region. By the use of this device isolation region, the active region "a" illustrated in FIG. 2 is separated in the island shape.

[B of FIG. 7]

Thereafter, as shown in B of FIG. 7, the second low-resistance region R is patterned in a shape of getting across a center of the active region that is separated by the device isolation region. On this occasion, the patterning is carried out by means of wet etching and the like using a photoresist as a mask. In this example, the second low-resistance region R is configured as a part of the top barrier layer 15 using the same semiconductor material as that for the regions below the high-resistance region 15b', and thus a surface layer of the high-resistance region 15b' is also etched in etching the second low-resistance region R. It is to be noted that, in an alternative, only the second low-resistance region R may be removed in such a manner that a semiconductor material for the second low-resistance region R is made different from that for the high-resistance region 15b', or an etching stop layer is formed between the second low-resistance region R and the high-resistance region 15b' using a semiconductor material that is different from that for each of these regions, improving an etch selectivity ratio of the second low-resistance region R against the high-resistance region 15b'.

[C of FIG. 8]

Subsequently, as shown in C of FIG. 8, the insulating film 21 that is configured of silicon nitride ($Si_3N_4$) is formed on the top barrier layer 15 using, for example, a CVD (Chemical Vapor Deposition) method. Thereafter, the gate opening 21g that exposes a central portion of the second low-resistance region R is formed by performing a pattern etching of the insulating film 21. This gate opening 21g is formed in a size large enough to get across a center of the active region.

In this state, by introducing p-type impurities from a surface layer of the top barrier layer 15 that is exposed on the bottom of the gate opening 21g, the first low-resistance region 15g is formed inside the top barrier layer 15. In this example, the first low-resistance region 15g is formed in a manner of diffusing zinc (Zn) as the p-type impurities in depth that exceeds a depth of the second low-resistance region R that configures the surface layer of the top barrier layer 15 and that does not reach the carrier supply region 15a. The diffusion of zinc (Zn) is carried out by means of vapor-phase diffusion using zinc compound gas at about 600 degrees centigrade, for example. As a result, the first low-resistance region 15g is formed on the bottom of the gate opening 21g in a self-alignment manner, and the second low-resistance region R is provided on both sides of the first low-resistance region 15g.

[D of FIG. 8]

Next, as shown in D of FIG. 8, the gate electrode 25 in the shape of embedding the gate opening 21g is formed on the first low-resistance region 15g. On this occasion, the gate electrode 25 is formed in a desired pattern by vapor deposition of titanium (Ti), platinum (Pt), and gold (Au) sequentially using a mask.

[FIG. 1]

Subsequently, as shown in FIG. 1, the source opening 21s and the drain opening 21d that expose the high-resistance region 15b' of the top barrier layer 15 at a position where the second low-resistance region R is interposed between are formed by performing a pattern etching of the insulating film 21.

Thereafter, the source electrode 23s and the drain electrode 23d are formed and ohmic-bonded to the high-resistance region 15b' of the top barrier layer 15 with the source opening 21s and the drain opening 21d in between. On this occasion, the source electrode 23s and the drain electrode 23d are formed by performing vapor deposition of gold-germanium (AuGe), nickel (Ni), and gold (Au) sequentially, patterning the deposited stack, and further forming a gold-based alloy by a heating treatment at about 400 degrees centigrade, for example, thereby bringing the semiconductor device 1-1 to completion.

The manufacturing method that is described thus far allows the semiconductor device 1-1 according to the first embodiment of the present technology to be fabricated. According to such a method, the gate electrode 25 is formed in a state of embedding the gate opening 21g after forming the first low-resistance region 15g by means of diffusion of the p-type impurities through the gate opening 21g that is formed on the insulating film 21. Therefore, the gate electrode 25 is formed on the first low-resistance region 15g in the self-alignment manner. As a result, it is possible to easily obtain the semiconductor device 1-1 according to the first embodiment of the present technology.

It is to be noted that formation of the gate opening 21g, the first low-resistance region 15g, and the gate electrode 25 may be carried out following formation of the source opening 21s, the drain opening 21d, the source electrode 23s, and the drain electrode 23d. Even in this case, the gate electrode 25 is formed in self-alignment with the first low-resistance region 15g, which makes it possible to easily obtain the semiconductor device 1-1 according to the first embodiment of the present technology.

(Advantageous Effects of Semiconductor Device According to First Embodiment)

The semiconductor device 1-1 that is described thus far adopts a JPHEMT structure in which the p-type first low-resistance region 15g is provided on the surface side of the top barrier layer 15 that is adjacent to the n-type channel layer 14, and the gate electrode 25 is provided on top of the p-type first low-resistance region 15g. Further, in particular, the second low-resistance region R that is smaller in the p-type charge amount than the first low-resistance region 15g is provided on both sides of the first low-resistance region 15g.

As shown in FIG. 6, the semiconductor device 1-1 that is configured in such a manner is put in the following state at the time of off-operation. More specifically, in the channel layer 14, a depletion layer extends over a P-N junction with the n-type channel layer 14 and the p-type first low-resistance region 15g as well as the p-type second low-resistance region R, resulting in the carrier depletion region A being formed. This causes an n-type region Sn inside the channel layer 14 to be retreated as far as the outside of the second low-resistance region R.

Further, in this case, the p-type second low-resistance region R is configured to be smaller in the p-type charge amount than the first low-resistance region 15g. Therefore, at the time of the off-operation as described above, the second low-resistance region R is depleted more easily by the P-N junction with the channel layer 14, and a p-type region Sp is retreated as far as the first low-resistance region 15g.

Consequently, in a configuration where the p-type second low-resistance region R is provided on both sides of the p-type first low-resistance region 15g, it is possible to enlarge a distance "d" between the n-type region Sn and the p-type region Sp at the time of the off-operation as compared with a configuration where the p-type second low-resistance region R is not provided. In other words, even when the carrier concentration of the channel layer 14 is increased to reduce the on-resistance Ron, it is possible to reduce the off-capacitance Coff by the degree to which the distance "d" between the n-type region Sn and the p-type region Sp at the time of the off-operation is enlarged.

On the contrary, in the JPHEMT structure in which the above-described second low-resistance region R is not provided, the carrier depletion region A that is formed on the channel layer 14 at the time of the off-operation is in such a degree that extends slightly in a transverse direction from the lower side of the first low-resistance region 15g. Therefore, the distance "d" between the n-type region Sn and the p-type region Sp becomes shorter as compared with the configuration where the p-type second low-resistance region R is provided.

Accordingly, by providing the second low-resistance region R that is smaller in the p-type charge amount than the first low-resistance region 15g on both sides of the first low-resistance region 15g in the JPHEMT structure, it is possible to reduce the off-capacitance Coff, which allows the transistor characteristics to be improved.

FIG. 9 shows a result of simulation for the gate voltage Vg versus the off-capacitance Coff that was carried out for the semiconductor device (1) according to the first embodiment of the present technology and a semiconductor device (2) according to a reference example that is not provided with the second low-resistance region R. As seen from this result, it is found that, in the semiconductor device (1) according to the first embodiment of the present technology, the off-capacitance Coff at the time of off-operation in which the gate voltage Vg is decreased is lower, and is kept at a stable value as compared with the semiconductor device (2) according to the reference example.

Also, rising of the off-capacitance Coff in the vicinity of a threshold voltage is steep. This indicates that the off-characteristics have been improved in the semiconductor device according to the first embodiment of the present technology. Here, there is a trade-off relationship between the on-resistance Ron and the off-capacitance Coff, and thus it is possible to improve the on-characteristics in a manner of raising the impurity concentration of the carrier supply regions 13a and 15a by the degree to which the off-characteristics are improved.

It is to be noted that, in the above-described first embodiment, the description is provided on a case where the semiconductor device 1-1 is a depletion type. However, the first embodiment is considered to be the case even when the semiconductor device 1-1 is an enhancement type, and the above description is applicable more appropriately.

2. Second Embodiment

Example where Second Low-Resistance Region is Provided Over Whole Surface

FIG. 10 is a cross-sectional view showing a configuration of a substantial part of a semiconductor device according to a second embodiment of the present technology. Hereinafter, with reference to this drawing, the description is provided on a configuration of the semiconductor device according to the second embodiment of the present technology.

(Configuration of Semiconductor Device According to Second Embodiment)

A semiconductor device 1-2 according to the second embodiment that is shown in FIG. 10 is different from the semiconductor device 1-1 according to the first embodiment that is described using FIG. 1 in that the second low-resistance region R is not patterned to be left over a whole surface of the top barrier layer 15. Otherwise, the configuration is similar to that in the first embodiment. Therefore, the same components as those in the first embodiment are denoted with the same reference numerals, and the detailed descriptions in the second embodiment are omitted as appropriate.

More specifically, on the top barrier layer 15 in the semiconductor device 1-2, a surface on the opposite side of the channel layer 14 is covered by the second low-resistance region R over a whole area excepting the first low-resistance region 15g. On the insulating film 21 on top of the top barrier layer 15 a surface of which is configured of the second low-resistance region R, the source opening 21s and the drain opening 21d are provided at a sufficient spacing interval with respect to the first low-resistance region 15g.

Each of the source electrode 23s and the drain electrode 23d is ohmic-bonded to the second low-resistance region R of the top barrier layer 15 with the source opening 21s and the drain opening 21d in between, respectively.

(Operation and Manufacturing Method of Semiconductor Device According to Second Embodiment)

The semiconductor device 1-2 having the configuration as described above operates in the same manner as with the semiconductor device 1-1 according to the first embodiment. Further, for the manufacturing of the semiconductor device 1-2, the process for patterning the second low-resistance region R may be omitted in the manufacturing procedures of the semiconductor device 1-1 according to the first embodiment.

(Advantageous Effects of Semiconductor Device According to Second Embodiment)

Also in the semiconductor device 1-2 that is configured as described above, it is possible to obtain the same effect as with the first embodiment by virtue of a configuration in which the second low-resistance region R that is smaller in the p-type charge amount than the first low-resistance region 15g is provided on both sides of the first low-resistance region 15g in the JPHEMT structure. In addition, the second low-resistance region R covers a wider area, and thus it is possible to achieve the effect of further enlarging a carrier depletion region that is formed on the channel layer 14 at the time of off-operation to further reduce the off-capacitance Coff. Moreover, it is possible to omit a patterning process for the second low-resistance region R, which allows the number of the manufacturing processes to be reduced as compared with the manufacturing of the semiconductor device 1-1 according to the first embodiment.

It is to be noted that, in the semiconductor device 1-2 according to the second embodiment, the source electrode 23s and the drain electrode 23d are ohmic-bonded to the second low-resistance region R, and thus there is a possibility that a contact resistance will increase slightly. However, it is possible to reduce the additional resistance by optimizing alloy conditions at the time of ohmic-bonding.

3. Third Embodiment

Example where Second Low-Resistance Region is Removed at Junction with Source Electrode/Drain Electrode FIG. 11 is a cross-sectional view showing a configuration of a substantial part of a semiconductor device according to a third embodiment of the present technology. Hereinafter, with reference to this drawing, the description is provided on a configuration of the semiconductor device according to the third embodiment of the present technology.

(Configuration of Semiconductor Device According to Third Embodiment)

A semiconductor device 1-3 according to the third embodiment that is shown in FIG. 11 is different from the semiconductor device 1-1 according to the first embodiment that is described using FIG. 1 in that the second low-resistance region R is removed only at a junction with the source electrode 23s or the drain electrode 23d. Otherwise, the configuration is similar to that in the first embodiment. Therefore, the same components as those in the first embodiment are denoted with the same reference numerals, and the detailed descriptions in the third embodiment are omitted as appropriate.

More specifically, the top barrier layer 15 in the semiconductor device 1-3 is configured in such a manner that a surface on the opposite side of the channel layer 14 is covered by the second low-resistance region R over almost a whole area thereof, and the second low-resistance region R is removed only at a junction with the source electrode 23s or the drain electrode 23d. On the insulating film 21 on top of the top barrier layer 15 a surface of which is configured of the second low-resistance region R, the source opening 21s and the drain opening 21d are provided at a sufficient spacing interval with respect to the first low-resistance region 15g.

A bottom of each of the source opening 21s and the drain opening 21d is put in a state where the second low-resistance region R is removed by means of isotropic etching by the use of the insulating film 21 as a mask with the high-resistance region 15b' exposed.

Each of the source electrode 23s and the drain electrode 23d is ohmic-bonded to the high-resistance region 15b' without coming in contact with the second low-resistance region R with the source opening 21s and the drain opening 21d in between, respectively.

(Operation and Manufacturing Method of Semiconductor Device According to Third Embodiment)

The semiconductor device 1-3 having the configuration as described above operates in the same manner as with the semiconductor device 1-1 according to the first embodiment. Further, the semiconductor device 1-3 is manufactured in the following manner.

[A of FIG. 12]

First, as shown in A of FIG. 12, on the substrate 11, each layer from the buffer layer 12 up to the second low-resistance region R is formed, and further the insulating film 21 is formed, and then the gate opening 21g is formed on the insulating film 21. Subsequently, the p-type first low-resistance region 15g that reaches the high-resistance region 15b' from the second low-resistance region R is formed by means of impurity diffusion through the gate opening 21g.

[B of FIG. 12]

Next, as shown in B of FIG. 12, the gate electrode 25 in the shape of embedding the gate opening 21g is formed on the first low-resistance region 15g.

For the processes that are described thus far, the process for patterning the second low-resistance region R may be omitted in the manufacturing procedures that are mentioned using A of FIG. 7 to D of FIG. 8 in the first embodiment.

[C of FIG. 13]

Subsequently, as shown in C of FIG. 13, the source opening 21s and the drain opening 21d that expose the second low-resistance region R at a position where the second low-resistance region R is interposed between are formed by performing a pattern etching of the insulating film 21. Afterward, the isotropic etching is carried out for the second low-resistance region R using the insulating film 21 on which the source opening 21s and the drain opening 21d are formed as a mask. Thus, the high-resistance region 15b' is exposed on the bottom of each of the source opening 21s and the drain opening 21d, causing the second low-resistance region R to be retreated from sidewalls of the source opening 21s and the drain opening 21d.

It is to be noted that, for the purpose of preventing unintended scraping of the high-resistance region 15b' in this etching process, the second low-resistance region R may be formed of a material different from that for the high-resistance region 15b', or an etching stop layer may be formed between the second low-resistance region R and the high-resistance region 15b' using a semiconductor material different from that for each of these regions.

[FIG. 11]

Thereafter, as shown in FIG. 11, the source electrode 23s and the drain electrode 23d are formed and ohmic-bonded to the high-resistance region 15b' of the top barrier layer 15 with the source opening 21s and the drain opening 21d in between, respectively. On this occasion, by sequentially performing the anisotropic vapor deposition of gold-germanium (AuGe), nickel (Ni), and gold (Au), a hollow portion G is left between a vapor-deposited material film and the second low-resistance region R. Subsequently, these material films are patterned, and further a gold-based alloy is formed by a heating treatment at about 400 degrees centigrade, for example, to form the source electrode 23s and the drain electrode 23d, thereby bringing the semiconductor device 1-3 to completion.

(Advantageous Effects of Semiconductor Device According to Third Embodiment)

In the semiconductor device 1-3 that is configured as described above, it is possible to obtain the same effect as with the first embodiment by virtue of a configuration in which the second low-resistance region R that is smaller in the p-type charge amount than the first low-resistance region 15g is provided on both sides of the first low-resistance region 15g in the JPHEMT structure. In addition, the second low-resistance region R covers a wider area, and thus it is possible to achieve the effect of further enlarging a carrier depletion region that is formed on the channel layer 14 at the time of off-operation to further reduce the off-capacitance Coff. Moreover, the semiconductor device 1-3 is configured to avoid a contact between the second low-resistance region R and the source electrode 23s or the drain electrode 23d by performing etching to partially remove the p-type second low-resistance region R, which also makes it possible to prevent an increase in the contact resistance.

Further, in the manufacturing of the semiconductor device 1-3, the second low-resistance region R is removed by performing isotropic etching in a wet process using the insulating film 21 on which the source opening 21s and the drain opening 21d are provided as a mask, and the anisotropic film formation is carried out in forming the source electrode 23s and the drain electrode 23d. As a result, the source electrode 23s and the drain electrode 23d that avoid a contact with the second low-resistance region R by the use of the hollow portion G are formed in the self-alignment manner. Therefore, it is possible to accurately form the source electrode 23s and the drain electrode 23d in the semiconductor device 1-3 that is configured as described above.

It is to be noted that, in the semiconductor device 1-3 that is configured in such a manner, by leaving the hollow portion G between the second low-resistance region R and the source electrode 23s or the drain electrode 23d, the insulation property between those is assured. However, the following process may be added for the purpose of preventing any foreign material from coming to be mixed in the hollow portion G in the course of the process. More specifically, in a state illustrated in C of FIG. 13 prior to the formation of the source electrode 23s and the drain electrode 23d, an insulating film is formed with a film thickness of embedding a portion of the second low-resistance region R that is retreated from the sidewalls of the source opening 21s and the drain opening 21d using, for example, an ALD (Atomic Layer Deposition) method and the like. Subsequently, the insulating film is etched in the wet process to expose the high-resistance region 15b' with a low damage. Thereafter, the formation of the source electrode 23s and the drain electrode 23d that is described previously is carried out. Such a process makes it possible to achieve the configuration that assures the insulation property between the second low-resistance region R and the source electrode 23s or the drain electrode 23d by means of the insulating film with the embedded hollow portion G, as well as to prevent an adverse influence of mixing of a foreign material in the hollow portion G on the device characteristics.

4. Fourth Embodiment

Example where High-Resistance Region is Provided on Top of Second Low-Resistance Region FIG. 14 is a cross-sectional view showing a configuration of a substantial part of a semiconductor device according to a fourth embodiment of the present technology. Hereinafter, with reference to this drawing, the description is provided on a configuration of the semiconductor device according to the fourth embodiment of the present technology.

(Configuration of Semiconductor Device According to Fourth Embodiment)

A semiconductor device 1-4 according to the fourth embodiment that is shown in FIG. 14 is different from the semiconductor device 1-1 according to the first embodiment that is described using FIG. 1 in that a high-resistance region 16 is formed on the p-type second low-resistance region R. Otherwise, the configuration is similar to that in the first embodiment. Therefore, the same components as those in the first embodiment are denoted with the same reference numerals, and the detailed descriptions in the fourth embodiment are omitted as appropriate.

More specifically, the top barrier layer 15 in the semiconductor device 1-4 is configured in such a manner that the second low-resistance region R which configures a surface layer on the opposite side of the channel layer 14 is patterned, and the high-resistance region 16 is layered on this patterned part. The p-type first low-resistance region 15g is provided in depth reaching the second low-resistance region R and the high-resistance region 15b' in the top barrier layer 15 from the high-resistance region 16.

The high-resistance region 16 that is arranged on top of the second low-resistance region R may be small in film thickness. This high-resistance region 16 may be configured of a semiconductor material different from that for the second low-resistance region R as long as such a compound semiconductor is well lattice-matched to the second low-resistance region R. Further, the high-resistance region 16 may include impurities, or may be non-doped. If impurities are included, the high-resistance region 16 may include either p-type impurities or n-type impurities. As the p-type impurities to be included in the high-resistance region 16, carbon (C), zinc (Zn), and magnesium (Mg) are used. As the n-type impurities, silicon (Si) is used. These impurities are selected as appropriate to be used depending on a method of forming the high-resistance region 16.

(Operation and Manufacturing Method of Semiconductor Device According to Fourth Embodiment)

The semiconductor device 1-4 having the configuration as described above operates in the same manner as with the semiconductor device 1-1 according to the first embodiment. Further, for the manufacturing of the semiconductor device 1-4, a layer configuring the high-resistance region 16 may be formed beforehand on the p-type second low-resistance region R in the manufacturing procedures of the semiconductor device 1-1 according to the first embodiment, and the high-resistance region 16 and the p-type second low-resistance region R may be patterned using the same mask.

(Advantageous Effects of Semiconductor Device According to Fourth Embodiment)

In the semiconductor device 1-4 that is configured as described above, it is possible to obtain the same effect as with the first embodiment by virtue of a configuration in which the second low-resistance region R that is smaller in the p-type charge amount than the first low-resistance region 15g is provided on both sides of the first low-resistance region 15g in the JPHEMT structure. In addition, because the high-resistance region 16 is formed on the second low-resistance region R, it is less likely that the second low-resistance region R will be influenced by an interface trap, and a depletion layer between the second low-resistance region R and the channel layer 14 is controlled more easily at the time of off-operation. This makes it possible to surely control the retreating amount of the n-type region Sn and the p-type region Sp at the time of off-operation that is described using FIG. 6 in the effects of the first embodiment, enabling the desired operation with ease.

It is to be noted that the fourth embodiment is not limited to application to the first embodiment, and may be combined with the second and the third embodiments. This makes it possible to also obtain the effects of the second and the third embodiments in conjunction with the effects of the fourth embodiment.

5. Fifth Embodiment

Example where Second Low-Resistance Region that is Formed by Impurity Diffusion is Provided FIG. 15 is a cross-sectional view showing a configuration of a substantial part of a semiconductor device according to a fifth embodiment of the present technology. Hereinafter, with reference to this drawing, the description is provided on a configuration of the semiconductor device according to the fifth embodiment of the present technology.

(Configuration of Semiconductor Device According to Fifth Embodiment)

A semiconductor device 1-5 according to the fifth embodiment that is shown in FIG. 15 is different from the semiconductor device 1-1 according to the first embodiment that is described using FIG. 1 in that the second low-resistance region R is formed by impurity diffusion. Otherwise, the configuration is similar to that in the first embodiment. Therefore, the same components as those in the first embodiment are denoted with the same reference numerals, and the detailed descriptions in the fifth embodiment are omitted as appropriate.

More specifically, the top barrier layer 15 in the semiconductor device 1-5 is configured in such a manner that a surface layer on the opposite side of the channel layer 14 is configured of the high-resistance region 15b', and the first low-resistance region 15g and the second low-resistance region R are formed on a surface layer of this high-resistance region 15b' by means of impurity diffusion.

(Operation and Manufacturing Method of Semiconductor Device According to Fifth Embodiment)

The semiconductor device 1-5 having the configuration as described above operates in the same manner as with the semiconductor device 1-1 according to the first embodiment. Further, the semiconductor device 1-5 is manufactured in the following manner.

[A of FIG. 16]

First, as shown in A of FIG. 16, on the substrate 11, each layer from the buffer layer 12 up to the high-resistance region 15b' is formed. For such processes, the process for forming the second low-resistance region R may be omitted in the manufacturing procedures that are described using A of FIG. 7 in the first embodiment.

[B of FIG. 16]

Next, as shown in B of FIG. 16, a mask 30 that may be configured of, for example, silicon nitride is formed on the high-resistance region 15b'. By means of the impurity diffusion through the mask 30, p-type impurities for forming the second low-resistance region R on the surface layer of the high-resistance region 15b' are diffused. On this occasion, by diffusing, for example, zinc (Zn) as the p-type impurities, a diffusion depth is controlled accurately. The diffusion of zinc (Zn) is carried out in the same manner as with the formation of the first low-resistance region 15g in the first embodiment. At the end of the diffusion, the mask 30 is removed.

[C of FIG. 17]

Subsequently, as shown in C of FIG. 17, the insulating film 21 is formed on the high-resistance region 15b' on which the second low-resistance region R is formed, and the gate opening 21g is formed on the insulating film 21. Afterward, by means of the impurity diffusion through the gate opening 21g, the p-type impurities for forming the first low-resistance region 15g in depth reaching the high-resistance region 15b' are diffused at a center of the second low-resistance region R.

[D of FIG. 17]

Thereafter, as shown in D of FIG. 17, the gate electrode 25 in the shape of embedding the gate opening 21g is formed on the first low-resistance region 15g.

[FIG. 15]

Afterward, as shown in FIG. 15, the source opening 21s and the drain opening 21d that expose the high-resistance region 15b' are formed on the insulating film 21. Thereafter, the source electrode 23s and the drain electrode 23d t are formed and ohmic-bonded to the high-resistance region 15b' with the source opening 21s and the drain opening 21d in between respectively, thereby bringing the semiconductor device 1-5 to completion. The processes described above following on the process shown in C of FIG. 17 may be carried out in the same manner as the processes described following on the process shown in C of FIG. 8 in the first embodiment.

(Advantageous Effects of Semiconductor Device According to Fifth Embodiment)

In the semiconductor device 1-5 that is configured as described above, it is possible to obtain the same effect as with the first embodiment by virtue of a configuration in which the second low-resistance region R that is smaller in the p-type charge amount than the first low-resistance region 15g is provided on both sides of the first low-resistance region 15g in the JPHEMT structure. In addition, the second low-resistance region R is formed by means of the diffusion, and thus a process for removing the second low-resistance region R using a wet etching may be eliminated.

Further, as well as assuring the controllability of patterning of each component part on the top barrier layer 15 has a substantially flat surface, the source electrode 23s and the drain electrode 23d are ohmic-bonded to the high-resistance region 15b' while avoiding contact with the second low-resistance region R. Thus, it is possible to also reduce a contact resistance.

6. Sixth Embodiment

Example where Cap Layer is Provided Between Top Barrier Layer and Source Electrode/Drain Electrode FIG. 18 is a cross-sectional view showing a configuration of a substantial part of a semiconductor device according to a sixth embodiment of the present technology. Hereinafter, with reference to this drawing, the description is provided on a configuration of the semiconductor device according to the sixth embodiment of the present technology.

(Configuration of Semiconductor Device According to Sixth Embodiment)

A semiconductor device 1-6 according to the sixth embodiment that is shown in FIG. 18 is different from the semiconductor device 1-1 according to the first embodiment that is described using FIG. 1 in that a cap layer 33 is provided between the top barrier layer 15 and the source electrode 23s or the drain electrode 23d. Otherwise, the configuration is similar to that in the first embodiment. Therefore, the same components as those in the first embodiment are denoted with the same reference numerals, and the detailed descriptions in the sixth embodiment are omitted as appropriate.

More specifically, the cap layer 33 is provided between the top barrier layer 15 and the source electrode 23s or the drain electrode 23d as a layer including impurities (n-type impurities in this case) that are reverse to the first low-resistance region 15g and are the same as the channel layer 14 in conductivity type. This cap layer 33 is configured as a low-resistance region including a certain amount of n-type impurities.

Further, the cap layer 33 is provided in a state of being patterned as a foundation for the source electrode 23s and the drain electrode 23d, and is provided on the second low-resistance region R that is patterned in the same shape as an example in this case. In such a case, a portion of the second low-resistance region R that serves as a foundation for the cap layer 33 is separated from the second low-resistance region R that is provided from the first low-resistance region 15g.

The cap layer 33 as described above may be configured of a compound semiconductor material that is lattice-matched to a portion of the top barrier layer 15 that serves as a foundation, and may not be matched to the top barrier layer 15 in a bandgap. However, if the cap layer 33 is different from the top barrier layer 15 that serves as a foundation in the bandgap, a barrier of a potential is formed at a junction, and thus there is a possibility that a resistance at an ohmic junction could rise. Therefore, the bandgap of the cap layer 33 is to be matched to the bandgap of the top barrier layer 15 that serves as a foundation to the extent that the characteristics of the semiconductor device 1-6 are not influenced. When a surface layer (second low-resistance region R in this case) of the top barrier layer 15 is configured of an AlGaAs mixed crystal, the cap layer 33 as described above is configured of, for example, GaAs including n-type impurities.

(Operation and Manufacturing Method of Semiconductor Device According to Sixth Embodiment)

The semiconductor device 1-6 having the configuration as described above operates in the same manner as with the semiconductor device 1-1 according to the first embodiment. Further, the semiconductor device 1-6 is manufactured in the following manner.

[A of FIG. 19]

First, as shown in A of FIG. 19, on the substrate 11, each layer from the buffer layer 12 up to the second low-resistance region R is formed, thereby the top barrier layer 15 is formed. Such processes may be carried out in the same manner as with the manufacturing procedures described using A of FIG. 7 in the first embodiment. Next, following the formation of the top barrier layer 15, a process for subjecting an n-type GaAs layer to be used as the cap layer 33 to epitaxial growth is performed, and subsequently a device isolation region that is omitted in illustration of the drawing is formed by ion implantation of boron.

[B of FIG. 19]

Next, as shown in B of FIG. 19, the cap layer 33 is patterned to expose the second low-resistance region R. Thereafter, an exposed circumferential portion of the second low-resistance region R is removed with a desired pattern, and the second low-resistance region R that is exposed from the cap layer 33 and the second low-resistance region R below the cap layer 33 are separated from each other.

[C of FIG. 20]

Subsequently, as shown in C of FIG. 20, the insulating film 21 is formed on the top barrier layer 15 in a state of covering the cap layer 33, and the gate opening 21g is formed on the insulating film 21. Afterward, by means of the impurity diffusion through the gate opening 21g, the p-type impurities for forming the first low-resistance region 15g in depth reaching the high-resistance region 15b' are diffused at a center of the second low-resistance region R that is exposed from the cap layer 33.

[D of FIG. 20]

Thereafter, as shown in D of FIG. 20, the gate electrode 25 in the shape of embedding the gate opening 21g is formed on the first low-resistance region 15g.

[FIG. 18]

Afterward, as shown in FIG. 18, the source opening 21s and the drain opening 21d that expose the cap layer 33 are formed on the insulating film 21, and the source electrode 23s and the drain electrode 23d are formed and ohmic-bonded to the cap layer 33 with the source opening 21s and the drain opening 21d in between respectively, thereby bringing the semiconductor device 1-6 to completion. The processes described above following on the process shown in C of FIG. 20 may be carried out in the same manner as the processes described following on the process shown in C of FIG. 8 in the first embodiment.

(Advantageous Effects of Semiconductor Device According to Sixth Embodiment)

In the semiconductor device 1-6 that is configured as described above, it is possible to obtain the same effect as with the first embodiment by virtue of a configuration in which the second low-resistance region R that is smaller in the p-type charge amount than the first low-resistance region 15g is provided on both sides of the first low-resistance region 15g in the JPHEMT structure. In addition, the semiconductor device 1-6 is configured in such a manner that the n-type cap layer 33 that is the same as the channel layer 14 in conductivity type is provided between the top barrier layer 15 and the source electrode 23s or the drain electrode 23d. Consequently, the cap layer 33 serves as a carrier supply source for the channel layer 14, which makes it possible to increase the sheet carrier concentration of the channel layer 14 directly beneath the cap layer 33, reducing a channel resistance and an access resistance. As a result, it is possible to further reduce the on-resistance Ron, and thus the effect of increasing the maximum drain current Idmax is also expected.

It is to be noted that the sixth embodiment is not limited to application to the first embodiment, and may be combined with the second to the fifth embodiments. This makes it possible to also obtain the effects of the respective combined embodiments in conjunction with the effects of the sixth embodiment.

7. Seventh Embodiment (Example where Second Low-Resistance Region is Provided Only on One Side of First Low-Resistance Region)

FIG. 21 is a cross-sectional view showing a configuration of a substantial part of a semiconductor device according to a seventh embodiment of the present technology. Hereinafter, with reference to this drawing, the description is provided on a configuration of the semiconductor device according to the seventh embodiment of the present technology.

(Configuration of Semiconductor Device According to Seventh Embodiment)

A semiconductor device 1-7 according to the seventh embodiment that is shown in FIG. 21 is different from the semiconductor device 1-1 according to the first embodiment that is described using FIG. 1 in that the second low-resistance region R is provided only on one side of the first low-resistance region 15g. Otherwise, the configuration is similar to that in the first embodiment. Therefore, the same components as those in the first embodiment are denoted with the same reference numerals, and the detailed descriptions in the seventh embodiment are omitted as appropriate.

More specifically, the top barrier layer 15 in the semiconductor device 1-7 is configured in such a manner that the second low-resistance region R is provided only on either one side of the first low-resistance region 15g either toward the source electrode 23s or toward the drain electrode 23d.

(Operation and Manufacturing Method of Semiconductor Device According to Seventh Embodiment)

The semiconductor device 1-7 having the configuration as described above operates in the same manner as with the semiconductor device 1-1 according to the first embodiment. Further, for the manufacturing of the semiconductor device 1-7, the patterning of the second low-resistance region R may be in the shape of being provided only on one side of the first low-resistance region 15g in the manufacturing procedures of the semiconductor device 1-1 described in the first embodiment.

(Advantageous Effects of Semiconductor Device According to Seventh Embodiment)

In the semiconductor device 1-7 that is configured as described above, the second low-resistance region R that is smaller in the p-type charge amount than the first low-resistance region 15g is provided on one side of the first low-resistance region 15g in the JPHEMT structure. Therefore, although the effect is lower as compared with the first embodiment, it is possible to obtain the effect of reducing the off-capacitance Coff, which allows the on-resistance Ron to be reduced accordingly.

Further, in such a configuration of the semiconductor device 1-7 according to the seventh embodiment, for example, in a case of an application where a high voltage is applied only to the drain electrode 23d, it is possible to shorten a distance between the source electrode 23s and the gate electrode 25 in such a manner that the second low-resistance region R is provided only on the drain electrode 23d side.

It is to be noted that the seventh embodiment is not limited to application to the first embodiment, and may be combined with the fourth to the sixth embodiments. This makes it possible to also obtain the effects of the respective combined embodiments in conjunction with the effects of the seventh embodiment.

8. Eighth Embodiment

Example where Source Region and Drain Region are Provided

FIG. 22 is a cross-sectional view showing a configuration of a substantial part of a semiconductor device according to an eighth embodiment of the present technology. Hereinafter, with reference to this drawing, the description is provided on a configuration of the semiconductor device according to the eighth embodiment of the present technology.

(Configuration of Semiconductor Device According to Eighth Embodiment)

A semiconductor device 1-8 according to the eighth embodiment that is shown in FIG. 22 is different from the semiconductor device 1-1 according to the first embodiment that is described using FIG. 1 in that a source region 35s and a drain region 35d are provided in depth reaching the buffer layer 12 from the top barrier layer 15. Otherwise, the configuration is similar to that in the first embodiment. Therefore, the same components as those in the first embodiment are denoted with the same reference numerals, and the detailed descriptions in the eighth embodiment are omitted as appropriate.

More specifically, the source region 35s and the drain region 35d that are provided on the semiconductor device 1-8 are formed as impurity regions in depth reaching the buffer layer 12 from the top barrier layer 15 and reaching at least the channel layer 14 at the outside of the patterned second low-resistance region R. Each of these source region 35s and the drain region 35d includes impurities that are the same as those of the channel layer 14 in conductivity type, and is configured as the n-type impurity region in this case.

The source electrode 23s and the drain electrode 23d are ohmic-bonded to these source region 35s and the drain region 35d, respectively.

(Operation and Manufacturing Method of Semiconductor Device According to Eighth Embodiment)

The semiconductor device 1-8 having the configuration as described above operates in the same manner as with the semiconductor device 1-1 according to the first embodiment. Further, for the manufacturing of the semiconductor device 1-8, as described using B of FIG. 7 in the manufacturing procedures of the semiconductor device 1-1 according to the first embodiment, a process in which the source region 35s and the drain region 35d are formed in a manner of diffusing the n-type impurities in the ion implantation method after patterning of the second low-resistance region R may be added.

(Advantageous Effects of Semiconductor Device According to Eighth Embodiment)

In the semiconductor device 1-8 that is configured as described above, it is possible to obtain the same effect as with the first embodiment by virtue of a configuration in which the second low-resistance region R that is smaller in the p-type charge amount than the first low-resistance region 15g is provided on both sides of the first low-resistance region 15g in the JPHEMT structure. In addition, the n-type source region 35s and the drain region 35d in depth reaching the channel layer 14 are provided in a state where the second low-resistance region R is interposed between. Thus, it is possible to raise the sheet carrier concentration on both sides of the channel layer 14 directly beneath the second low-resistance region R. Further, it is also possible to reduce a contact resistance of the source electrode 23s or the drain electrode 23d to the top barrier layer 15, which allows a channel resistance and an access resistance to be reduced. This makes it possible to further reduce the on-resistance Ron, as well as to increase the maximum drain current Idmax.

It is to be noted that the eighth embodiment is not limited to application to the first embodiment, and may be combined with the second to the seventh embodiments. This makes it possible to also obtain the effects of the respective combined embodiments in conjunction with the effects of the eighth embodiment.

9. Ninth Embodiment

Multigate Structure

FIG. 23 is a cross-sectional view showing a configuration of a substantial part of a semiconductor device according to a ninth embodiment of the present technology. Hereinafter, with reference to this drawing, the description is provided on a configuration of a semiconductor device 2-1 according to the ninth embodiment of the present technology.

(Configuration of Semiconductor Device According to Ninth Embodiment)

The semiconductor device 2-1 has the same configuration, function, and effects as with the semiconductor device 1-1 according to the first embodiment with the exception of having a multigate structure (dual-gate structure) in which two gate electrodes 25 are provided between the source electrode 23s and the drain electrode 23d. Therefore, corresponding components are denoted with the same reference numerals for description. It is to be noted that, in the following drawings and descriptions, a case where two gate electrodes 25 are provided between the source electrode 23s and the drain electrode 23d is illustrated and mentioned. However, it is also possible to provide three or more gate electrodes 25 to achieve the intended power durability.

The semiconductor device 2-1 has the laminated body 10 including the channel layer 14 that is configured of a compound semiconductor, and the gate electrode 25 that is provided on the top surface side of the laminated body 10. More specifically, as with the first embodiment, the semiconductor device 2-1 is a so-called JPHEMT that includes the barrier layer 15 between the gate electrode 25 and the channel layer 14, as well as the first low-resistance region 15g of the reverse-conductivity type inside the barrier layer 15. As with the first embodiment, the semiconductor device 2-1 has a configuration where, for example, the buffer layer 2-1, the bottom barrier layer 13, the channel layer 14, and the top barrier layer 15 each of which is configured of a compound semiconductor material may be laminated in this order on the substrate 11 that is configured of a compound semiconductor. Each layer from the buffer layer 12 up to the top barrier layer 15 configures the laminated body 10.

The substrate 11, the buffer layer 12, the bottom barrier layer 13, the channel layer 14, and the top barrier layer 15 are configured in the same manner as with the first embodiment.

On the laminated body 10, as with the first embodiment, the source electrode 23s and the drain electrode 23d, and the gate electrode 25 are provided with the insulating film 21 interposed between.

The insulating film 21, the source electrode 23s, the drain electrode 23d, and the gate electrode 25 are configured in the same manner as with the first embodiment.

Further, in this semiconductor device 2-1, the laminated body 10 has the first low-resistance region 15g that is provided on the top surface side of the laminated body 10 and faces the gate electrode 25, and a second low-resistance region R that is provided externally of the first low-resistance region 15g and is continuous with the first low-resistance region 15g. This makes it possible to reduce the off-capacitance in the semiconductor device 2-1.

It is to be noted that FIG. 22 illustrates a case where the end ER of the second low-resistance region R is located on the outer side from the end E25 of the gate electrode 25. However, the end ER of the second low-resistance region R may not be necessarily located on the outer side from the end E25 of the gate electrode 25.

To be more specific, the first low-resistance region 15g is provided at a region facing the gate opening 21g on the top surface side of the laminated body 10. However, the first low-resistance region 15g is not only provided at a region facing the gate opening 21g, but also may run over the region to be extended to a surrounding area thereof. The second low-resistance region R is extended on the top surface side of the laminated body 10, and is continuous with the first low-resistance region 15g.

[First Low-Resistance Region 15g]

As with the first embodiment, the first low-resistance region 15g is located inside the top barrier layer 15, and is provided at a spacing interval with respect to the carrier supply region 15a of the top barrier layer 15 at a shallow position on the surface side from the carrier supply region 15a on a surface layer on the opposite side of the channel layer 14. As with the first embodiment, the first low-resistance region 15g includes impurities of the conductivity type reverse to that of carriers traveling in the channel layer 14, and is kept at a resistance lower than that of the surrounding high-resistance region 15b'. As a result, when the carriers are electrons, p-type impurities are diffused in the first low-resistance region 15g.

A thickness (depth) of the first low-resistance region 15g and a value of the p-type impurity concentration are determined by a threshold voltage of a transistor, as with the first embodiment. More specifically, the threshold voltage is raised with an increase in thickness of the first low-resistance region 15g or the p-type impurity concentration. On the other hand, the threshold voltage is lowered with a decrease in thickness of the first low-resistance region 15g or the p-type impurity concentration.

As with the first embodiment, as an example, the first low-resistance region 15g may include the p-type impurities of about $1 \times 10^{18}$ pieces/cm$^3$ or more, and one example may be about $1 \times 10^{19}$ pieces/cm$^3$. It is to be noted that carbon (C), zinc (Zn), and magnesium (Mg) are used as the p-type impurities in the top barrier layer 15 that is configured of In(AlGa)AsP mixed crystal. These impurities are selected as appropriate to be used depending on a method of forming the first low-resistance region 15g.

[Second Low-Resistance Region R]

As with the first embodiment, the second low-resistance region R is formed at a portion where a surface layer on the opposite side of the channel layer 14 on the top barrier layer 15 is patterned, and is provided on both sides of each of the first low-resistance regions 15g (both of the source electrode 23s side and the drain electrode 23d side). As with the first embodiment, the second low-resistance region R is configured as a p-type region that includes impurities of the conductivity type reverse to that of carriers traveling in the channel layer 14 (that is, p-type impurities here). As with the first embodiment, the second low-resistance region R may be preferably smaller in the reverse-conductivity type charge amount than the first low-resistance region 15g. Further, the second low-resistance region R may be preferably smaller in the p-type charge amount per unit length (per unit transverse directional length of the drawing) than the first low-resistance region 15g. This makes it possible to ensure that the second low-resistance region R is smaller in the p-type charge amount than the first low-resistance region 15g even when a transverse directional length of the second low-resistance region R becomes excessively large. As with the first embodiment, the p-type charge amount in the second low-resistance region R is to be within the extent where holes inside the second low-resistance region R (charges of the conductivity type reverse to that of carriers traveling in the channel layer 14) are drained to be put in a depletion state at the time of off-operation during which a negative voltage is applied to the gate electrode 25.

Further, the second low-resistance region R may be desirably formed shallower than the first low-resistance region 15g. That is, the second low-resistance region R may be preferably smaller in thickness than the first low-resistance region 15g. This ensures that the p-type charge amount in the second low-resistance region R is kept to be smaller than the p-type charge amount in the first low-resistance region 15g.

The second low-resistance region R may be preferably lower in the impurity concentration of the above-described reverse conductivity type than the first low-resistance region 15g. As with the first embodiment, for example, the second low-resistance region R may include the p-type impurities of about $1 \times 10^{18}$ pieces/cm$^3$, and one example may be about $1 \times 10^{18}$ pieces/cm$^3$.

It is to be noted that the second low-resistance region R may be configured in the same degree of depth as the first low-resistance region 15g, that is, with the same degree of film thickness as the first low-resistance region 15g, as well as with the p-type impurity concentration lower than that in the first low-resistance region 15g.

As the p-type impurities that are included in the second low-resistance region R as described above, carbon (C), zinc (Zn), and magnesium (Mg) are used. These impurities are selected as appropriate to be used depending on a method of forming the second low-resistance region R.

It is to be noted that a carrier depletion region within the channel layer 14 to be hereinafter described is extended more easily by reducing the impurity concentration in the second low-resistance region R toward the channel layer 14 side, for example. On the other hand, it is less likely that the second low-resistance region R will be influenced by an interface trap by reducing the impurity concentration toward the surface side, and a depletion layer between the second low-resistance region R and the channel layer 14 is controlled more easily at the time of off-operation.

Further, the second low-resistance region R may be configured of a semiconductor material different from a constituent material for the high-resistance region 15b' if such a material is a compound semiconductor that is well lattice-matched to the high-resistance region 15b'.

It is to be noted that, as a matter of course, the above description is applicable to not only the semiconductor device 2-1, but also the semiconductor devices 1-1 to 1-8 according to the first to the eighth embodiments that are different from the semiconductor device 2-1 only in the number of the gate electrodes 25.

Moreover, as described previously, the semiconductor device 2-1 has the dual-gate structure in which two gate electrodes 25 are provided between the source electrode 23s and the drain electrode 23d. In this case, a projecting width L1 of the second low-resistance region R from the first low-resistance region 15g to the source electrode 23s side or the drain electrode 23d side may be preferably larger than a projecting width L2 of the second low-resistance region R from the first low-resistance region 15g to the gate electrode 25 side.

More specifically, the projecting width L1 may be preferably sufficiently large to the extent that the second low-resistance region R does not reach the source electrode 23s or the drain electrode 23d, and may be preferably in the order of about 0.8 μm, for example. On the other hand, the projecting width L2 may be preferably large to the extent that a space (Lgg−2*L2) between the second low-resistance regions R is allowed to be processed by etching, and may be preferably in the order of about 0.5 μm when Lgg is about 1.5 μm and a minimum etching process size is about 0.5 μm, for example.

It is to be noted that when three or more gate electrodes 25 are provided between the source electrode 23s and the drain electrode 23d, the second low-resistance region R on both sides of the gate electrode 25 that is interposed between the two gate electrodes 25 is provided with the projecting width L2.

FIG. 24 shows a planar configuration of the semiconductor device 2-1 illustrated in FIG. 23 that is viewed from the top side (gate electrode 25 side).

Each of the source electrode 23s and the drain electrode 23d has a comb-like shape. The source electrode 23s and the drain electrode 23d are interdigitated with a clearance in a planar shape. Each of the two gate electrodes 25 is shaped to meander through the clearance between the source electrode 23s and the drain electrode 23d in a planar shape.

Each of the two gate electrodes 25 has a folded-back part 25A along a front edge of each of combtooth portions of the source electrode 23s and the drain electrode 23d, and a linear part 25B that is interposed between combtooth portions of the source electrode 23s and the drain electrode 23d. The folded-back part 25A may preferably have a planar shape including curves. This makes it possible to reduce electric field concentration. The curvature of the folded-back part 25A is not limited specifically, and may be a semicircular arc as shown in FIG. 24 for example. It is to be noted that the folded-back part 25A may have a planar shape of bending back and forth in a rectangular form.

The laminated body 10 is separated by a device isolation region that is omitted in illustration of the cross-sectional view in FIG. 23. As shown in FIG. 24, a top portion of the substrate 11 is separated into island-shaped active regions "a" by such a device isolation region. In this active region "a", a portion R1 where a surface layer of the top barrier layer 15 is patterned is provided in a meandering shape to get across the active region "a" at both ends. The second low-resistance region R is provided at the active region "a" in this patterned portion R1.

It is to be noted that FIG. 24 shows a case where both ends of the patterned portion R1 are each in a linear shape to intersect with long sides of the active region "a". However, both ends of the patterned portion R1 may bend to intersect with short sides of the active region "a". In this case, both ends of the patterned portion R1 in a bending form may take a planar shape including curves similar to those of the folded-back part 25A illustrated in FIG. 24, or may take a planar shape of bending back and forth in a rectangular form.

(Band Structure)

An energy band structure on the lower side of the gate electrode 25 of the semiconductor device 2-1 is the same as the energy band structure described with reference to FIG. 3 in the first embodiment.

That is, as shown in FIG. 3, the semiconductor device 2-1 is configured in such a manner that the channel layer 14 with a narrow bandgap is interposed between the bottom barrier layer 13 and the top barrier layer 15 each of which is wider in the bandgap and higher in the conduction band energy Ec than the channel layer 14. Therefore, when electrons are supplied as the carriers from the carrier supply regions 13$a$ and 15$a$ of the bottom barrier layer 13 and the top barrier layer 15 respectively, the channel layer 14 serves as a two-dimensional electron gas layer on which these electrons are accumulated.

Further, a discontinuous quantity ΔEc of a conduction band at a heterojunction with the channel layer 14 and the top barrier layer 15 is sufficiently large (about 0.31 eV here). In addition, a difference between a minimum point of the conduction band energy Ec in the top barrier layer 15 and the conduction band energy Ec in the channel layer 14 is also configured to be sufficiently large (about 0.20 eV or more here), and the number of electrons that are distributed in the top barrier layer 15 is negligibly smaller than the number of electrons that are distributed in the channel layer 14.

(Operation of Semiconductor Device According to Ninth Embodiment)

Next, the operation of the semiconductor device 2-1 is described using the energy band structure diagrams in FIG. 4 and FIG. 5, as well as a cross-sectional view of the semiconductor device 2-1 in FIG. 25 along with the foregoing FIG. 3. Here, the description is provided on the operation in a case where the semiconductor device 2-1 is a shallow depletion-type transistor having a threshold voltage of about −0.5 V.

In a junction state (Vg=0) where no voltage is applied to the gate electrode 25, a carrier depletion region where electrons are depleted as compared with a surrounding area is formed at a region of the channel layer 14 that corresponds to an area directly beneath the p-type first low-resistance region 15$g$. An energy band structure at this time is as shown in FIG. 3 as described previously, and the channel layer 14 is put in a high-resistance state.

Here, a voltage nearly equal to the gate voltage at the time of off-operation (Vg=about −2 V) is applied to the gate electrode 25 to put the semiconductor device 2-1 in an off-operation state. It is to be noted that the voltage may be varied depending on a condition of the low-resistance region, and at least a voltage (Vg<about −2 V) lower than an off voltage (about −2 V) may be applied. In this case, as shown in a cross-sectional view in FIG. 25, a carrier depletion region A of the channel layer 14 that corresponds to an area directly beneath the p-type first low-resistance region 15$g$ is placed in a depleted state with a further decrease in the number of carriers, and further extends as far as the channel layer 14 corresponding to an area directly beneath the second low-resistance region R. This causes a drain current Id to hardly flow. An energy band structure at this time is as shown in FIG. 4, and the conduction band energy Ec in the channel layer 14 becomes completely higher than the Fermi level Ef.

On the other hand, a voltage nearly equal to the gate voltage at the time of on-operation (Vg=about 1 V) is applied to the gate electrode 25 to put the semiconductor device 2-1 in an on-operation state. In this case, the carrier depletion region A illustrated in the cross-sectional view of FIG. 25 disappears, and the electrons in the channel layer 14 increase in number to cause the drain current Id to be modulated. An energy band structure at this time is as shown in FIG. 5, and the conduction band energy Ec in the channel layer 14 becomes lower than the Fermi level Ef.

(Method of Manufacturing Semiconductor Device According to Ninth Embodiment)

Next, an example of a method of manufacturing the semiconductor device 2-1 adopting the above-described configuration is described with reference to cross-sectional process diagrams in FIG. 26 to FIG. 29.

[FIG. 26]

First, as shown in FIG. 26, the buffer layer 12 is formed by subjecting a non-doped u-GaAs layer to epitaxial growth on the substrate 11 that may be configured of, for example, GaAs. Subsequently, the bottom barrier layer 13 is formed by subjecting, for example, an AlGaAs ($Al_{0.2}Ga_{0.8}As$ mixed crystal) layer to epitaxial growth on the buffer layer 12. On this occasion, the high-resistance region 13$b$ that may be configured of, for example, a non-doped u-AlGaAs layer, the carrier supply region 13$a$ that may be configured of, for example, a silicon (Si)-doped n-type AlGaAs layer, and the high-resistance region 13$b'$ that may be configured of, for example, the non-doped u-AlGaAs layer are sequentially subjected to epitaxial growth. Such a process completes the bottom barrier layer 13 that is provided with the n-type carrier supply region 13$a$ at the center in the film thickness direction.

Thereafter, the channel layer 14 is formed by subjecting, for example, a non-doped u-InGaAs layer to epitaxial growth on the bottom barrier layer 13.

Subsequently, the top barrier layer 15 is formed by subjecting, for example, an AlGaAs ($Al_{0.2}Ga_{0.8}As$ mixed crystal) layer to epitaxial growth on the channel layer 14. On this occasion, the high-resistance region 15$b$ that may be configured of, for example, a non-doped u-AlGaAs layer, the carrier supply region 15$a$ that may be configured of, for example, a silicon (Si)-doped n-type AlGaAs layer, the high-resistance region 15$b'$ that may be configured of, for example, the silicon (Si)-doped n-type AlGaAs layer, and the second low-resistance region R that may be configured of, for example, a carbon (C)-doped p-type AlGaAs layer are sequentially subjected to epitaxial growth. Such a process completes the top barrier layer 15 that is provided with the n-type carrier supply region 15a at the center in the film thickness direction and the second low-resistance region R at the uppermost part thereof.

Following the above processes, the device isolation region that is omitted in illustration of the drawing is formed. In this case, an inactive region that is increased in resistance by means of ion implantation of boron, for example, is formed as the device isolation region. By the use of this device isolation region, the active region "a" illustrated in FIG. 24 is separated in the island shape.

[FIG. 27]

Thereafter, as shown in FIG. 27, the second low-resistance region R is patterned in the meandering shape inside the active region "a" that is separated by the device isolation region and in the shape of getting across the active region at both ends. On this occasion, the patterning is carried out by means of wet etching, dry etching, and the like using a photoresist as a mask. In this example, the second low-resistance region R is configured as a part of the top barrier layer 15 using the same semiconductor material as that for the regions below the high-resistance region 15b', and thus a surface layer of the high-resistance region 15b' is also etched in etching the second low-resistance region R. It is to be noted that, in an alternative, only the second low-resistance region R may be removed in such a manner that a semiconductor material for the second low-resistance region R is made different from that for the high-resistance region 15b', or an etching stop layer is formed between the second low-resistance region R and the high-resistance region 15b' using a semiconductor material that is different from that for each of these regions, improving the etch selectivity ratio of the second low-resistance region R against the high-resistance region 15 b'.

[FIG. 28]

Subsequently, as shown in FIG. 28, the insulating film 21 that is configured of silicon nitride ($Si_3N_4$) is formed on the top barrier layer 15 using, for example, a CVD method. Thereafter, the gate opening 21g that exposes a central portion of the second low-resistance region R is formed by performing a pattern etching of the insulating film 21. This gate opening 21g is formed in the meandering shape inside the active region and in a size large enough to get across the active region at both ends.

In this state, by introducing p-type impurities into a surface layer of the top barrier layer 15 that is exposed on the bottom of the gate opening 21g, the first low-resistance region 15g is formed inside the top barrier layer 15. In this example, the first low-resistance region 15g is formed in a manner of diffusing zinc (Zn) as the p-type impurities in depth that exceeds a depth of the second low-resistance region R that configures the surface layer of the top barrier layer 15 and that does not reach the carrier supply region 15a. The diffusion of zinc (Zn) is carried out by means of vapor-phase diffusion using zinc compound gas at about 600 degrees centigrade, for example. As a result, the first low-resistance region 15g is formed on the bottom of the gate opening 21g in a self-alignment manner, and the second low-resistance region R is provided on both sides of the first low-resistance region 15g.

[FIG. 29]

Next, as shown in FIG. 29, the gate electrode 25 in the shape of embedding the gate opening 21g is formed on the first low-resistance region 15g. On this occasion, the gate electrode 25 is formed in a desired pattern by vapor deposition of titanium (Ti), platinum (Pt), and gold (Au) sequentially using a mask.

[FIG. 23]

Subsequently, as shown in FIG. 23, the source opening 21s and the drain opening 21d that expose the high-resistance region 15b' of the top barrier layer 15 at a position where the two or more second low-resistance regions R are interposed between are formed by performing a pattern etching of the insulating film 21.

Thereafter, the source electrode 23s and the drain electrode 23d are formed and ohmic-bonded to the high-resistance region 15b' of the top barrier layer 15 with the source opening 21s and the drain opening 21d in between. On this occasion, the source electrode 23s and the drain electrode 23d are formed by performing vapor deposition of gold-germanium (AuGe), nickel (Ni), and gold (Au) sequentially, patterning the deposited stack, and further forming a gold-based alloy by a heating treatment at about 400 degrees centigrade, for example, thereby bringing the semiconductor device 2-1 to completion.

The manufacturing method that is described thus far allows the semiconductor device 2-1 according to the ninth embodiment to be fabricated. According to such a method, the gate electrode 25 is formed in a state of embedding the gate opening 21g after forming the first low-resistance region 15g by means of diffusion of the p-type impurities through the gate opening 21g that is formed on the insulating film 21. Therefore, the gate electrode 25 is formed on the first low-resistance region 15g in the self-alignment manner. As a result, it is possible to easily obtain the semiconductor device 2-1 according to the ninth embodiment.

It is to be noted that formation of the gate opening 21g, the first low-resistance region 15g, and the gate electrode 25 may be carried out following formation of the source opening 21s, the drain opening 21d, the source electrode 23s, and the drain electrode 23d. Even in this case, the gate electrode 25 is formed in self-alignment with the first low-resistance region 15g, which makes it possible to easily obtain the semiconductor device 2-1 according to the ninth embodiment.

(Advantageous Effects of Semiconductor Device According to Ninth Embodiment)

The semiconductor device 2-1 that is described thus far adopts a JPHEMT structure in which the two or more p-type first low-resistance regions 15g are provided on the surface side of the top barrier layer 15 that is adjacent to the n-type channel layer 14, and the gate electrodes 25 are provided on top of the p-type first low-resistance regions 15g. Further, the second low-resistance region R that is smaller in the p-type charge amount than the first low-resistance region 15g is provided on both sides of the first low-resistance region 15g.

As shown in FIG. 25, the semiconductor device 2-1 that is configured in such a manner is put in the following state at the time of off-operation. More specifically, in the channel layer 14, a depletion layer extends over a P-N junction with the n-type channel layer 14 and the p-type first low-resistance region 15g as well as the p-type second low-resistance region R, resulting in the carrier depletion region A being formed. This causes an n-type region Sn inside the channel layer 14 to be retreated as far as the outside of the second low-resistance region R.

Further, in this case, the p-type second low-resistance region R is configured to be smaller in the p-type charge amount than the first low-resistance region 15g. Therefore, at the time of the off-operation as described above, the second low-resistance region R is depleted more easily by the P-N junction with the channel layer 14, and a p-type region Sp is retreated as far as the first low-resistance region 15g.

Consequently, in a configuration where the p-type second low-resistance region R is provided on both sides of the p-type first low-resistance region 15g, it is possible to enlarge distances d1 and d2 between the n-type region Sn and the p-type region Sp at the time of the off-operation as compared with a configuration where the p-type second low-resistance region R is not provided. In other words, even when the carrier concentration of the channel layer 14 is increased to reduce the on-resistance Ron, it is possible to reduce the off-capacitance Coff by the degree to which the distances d1 and d2 between the n-type region Sn and the p-type region Sp at the time of the off-operation is enlarged.

On the other hand, FIG. 30 and FIG. 31 show a cross-sectional configuration and a planar configuration of a semiconductor device 2-1R according to a reference example 1 where the second low-resistance region R is not provided, respectively. In the reference example 1, the carrier depletion region A that is formed on the channel layer 14 at the time of the off-operation is in such a degree that extends slightly in a transverse direction from the lower side of the first low-resistance region 15g. Therefore, the distance d (not illustrated in FIG. 30) between the n-type region Sn (not illustrated in FIG. 30) and the p-type region Sp (not illustrated in FIG. 30) becomes shorter as compared with the configuration where the p-type second low-resistance region R is provided.

Accordingly, by providing the second low-resistance region R that is smaller in the p-type charge amount than the first low-resistance region 15g on both sides of the first low-resistance region 15g in the JPHEMT structure, it is possible to reduce the off-capacitance Coff, which allows the transistor characteristics to be improved.

FIG. 32 and FIG. 33 show calculation results of the off-capacitance Coff inside the semiconductor device in varying device parameters for the semiconductor device 2-1 according to the ninth embodiment and the semiconductor device 2-1R according to the reference example 1 where the second low-resistance region R is not provided, respectively. As seen from these results, it is found that, in the semiconductor device 2-1 according to the ninth embodiment, the off-capacitance Coff is kept at a lower value irrespectively of device parameters as compared with the semiconductor device 2-1R according to the reference example 1.

FIG. 34 shows a calculation result of the on-resistance Ron in varying device parameters for the semiconductor device 2-1R according to the reference example 1. It is assumed that each of the semiconductor device 2-1 according to the ninth embodiment and the semiconductor device 2-1R according to the reference example 1 has the same degree of on-resistance Ron. FIG. 35 and FIG. 36 show calculation results of Ron*Coff in varying device parameters for the semiconductor device 2-1 according to the ninth embodiment and the semiconductor device 2-1R according to the reference example 1 where the second low-resistance region R is not provided, respectively. In the semiconductor device 2-1R according to the reference example 1, Ron*Coff varies significantly with variation in the device parameters, whereas the variation is reduced in the semiconductor device 2-1 according to the ninth embodiment. In other words, the semiconductor device 2-1 according to this embodiment is less influenced by variations in device parameters in forming the device.

It is to be noted that, in the above-described ninth embodiment, the description is provided on a case where the semiconductor device 2-1 is a depletion type. However, the ninth embodiment is considered to be the case even when the semiconductor device 2-1 is an enhancement type, and the above description is applicable more appropriately.

10. Tenth Embodiment

Example where Second Low-Resistance Region is Provided Over Whole Region Excluding First Low-Resistance Region on Top Surface of Laminated Body FIG. 37 is a cross-sectional view showing a configuration of a substantial part of a semiconductor device according to a tenth embodiment of the present technology. Hereinafter, with reference to this drawing, the description is provided on a configuration of a semiconductor device 2-2 according to the tenth embodiment of the present technology.
(Configuration of Semiconductor Device According to Tenth Embodiment)

The semiconductor device 2-2 according to the tenth embodiment that is shown in FIG. 37 is different from the semiconductor device 2-1 according to the ninth embodiment that is described using FIG. 23 in that the second low-resistance region R is not patterned to be left over a whole region excluding the first low-resistance region 15g on the top surface of the laminated body 10. Otherwise, the configuration is similar to that in the ninth embodiment. Therefore, the same components as those in the ninth embodiment are denoted with the same reference numerals, and the detailed descriptions in this embodiment are omitted as appropriate.

More specifically, in the semiconductor device 2-2, the second low-resistance region R is provided over a whole region excluding the first low-resistance region 15g on the top surface of the laminated body 10 (the surface on the opposite side of the channel layer 14 on the top barrier layer 15). On the insulating film 21, the source opening 21s and the drain opening 21d are provided at a sufficient spacing interval with respect to the first low-resistance region 15g.

Each of the source electrode 23s and the drain electrode 23d is ohmic-bonded to the second low-resistance region R of the top barrier layer 15 with the source opening 21s and the drain opening 21d in between, respectively.
(Operation and Manufacturing Method of Semiconductor Device According to Tenth Embodiment)

The semiconductor device 2-2 having the configuration as described above operates in the same manner as with the semiconductor device 2-1 according to the ninth embodiment. Further, for the manufacturing of the semiconductor device 2-2, the process for patterning the second low-resistance region R may be omitted in the manufacturing procedures of the semiconductor device 2-1 according to the ninth embodiment.
(Advantageous Effects of Semiconductor Device According to Tenth Embodiment)

In the semiconductor device 2-2 that is configured as described above, it is possible to obtain the same effect as with the ninth embodiment by virtue of a configuration in which the second low-resistance region R that is smaller in the p-type charge amount than the first low-resistance region 15g is provided on both sides of the first low-resistance region 15g in the JPHEMT structure. In addition, the second low-resistance region R covers a wider area, and thus it is possible to obtain the effect of further enlarging a carrier depletion region that is formed on the channel layer 14 at the time of off-operation to further reduce the off-capacitance Coff. Moreover, it is possible to omit a patterning process for the second low-resistance region R, which allows the number of the manufacturing processes to be reduced as compared with the manufacturing of the semiconductor device 2-1 according to the ninth embodiment.

It is to be noted that, in the semiconductor device 2-2 according to the tenth embodiment, the source electrode 23s and the drain electrode 23d are ohmic-bonded to the second low-resistance region R, and thus there is a possibility that a contact resistance will increase slightly. However, it is possible to reduce the additional resistance by optimizing alloy conditions at the time of ohmic-bonding.

11. Eleventh Embodiment

Example where Second Low-Resistance Region is Removed at Junction with Source Electrode/Drain Electrode FIG. 38 shows a cross-sectional configuration of a substantial part of a semiconductor device according to an eleventh embodiment of the present technology. Hereinafter, with reference to this drawing, the description is provided on a configuration of a semiconductor device 2-3 according to the eleventh embodiment.
(Configuration of Semiconductor Device According to Eleventh Embodiment)

The semiconductor device 2-3 according to the eleventh embodiment that is shown in FIG. 38 is different from the semiconductor device 2-1 according to the ninth embodiment that is described using FIG. 23 in that the second low-resistance region R is removed only at a junction with the source electrode 23s or the drain electrode 23d. The second low-resistance region R is provided continuously among two or more gate electrodes 25. Otherwise, the configuration is similar to that in the ninth embodiment. Therefore, the same components as those in the ninth embodiment are denoted with the same reference numerals, and the detailed descriptions in this embodiment are omitted as appropriate.

More specifically, in the semiconductor device 2-3, the second low-resistance region R is provided over an almost whole region of the top surface of the laminated body 10 (surface on the opposite side of the channel layer 14 on the top barrier layer 15), and is removed only at a junction with the source electrode 23s or the drain electrode 23d. On the insulating film 21, the source opening 21s and the drain opening 21d are provided at a sufficient spacing interval with respect to the first low-resistance region 15g.

A bottom of each of the source opening 21s and the drain opening 21d is put in a state where the second low-resistance region R is removed by means of isotropic etching by the use of the insulating film 21 as a mask with the high-resistance region 15b' exposed.

Each of the source electrode 23s and the drain electrode 23d is ohmic-bonded to the high-resistance region 15b' without coming in contact with the second low-resistance region R with the source opening 21s and the drain opening 21d in between, respectively.
(Operation and Manufacturing Method of Semiconductor Device According to Eleventh Embodiment)

The semiconductor device 2-3 having the configuration as described above operates in the same manner as with the semiconductor device 2-1 according to the ninth embodiment. Further, the semiconductor device 2-3 is manufactured in the following manner.

[FIG. 39]

First, as shown in FIG. 39, on the substrate 11, each layer from the buffer layer 12 up to the second low-resistance region R is formed, and further the insulating film 21 is formed, and then the gate opening 21g is formed on the insulating film 21. Subsequently, the p-type first low-resistance region 15g that reaches the high-resistance region 15b' from the second low-resistance region R is formed by means of impurity diffusion through the gate opening 21g.
[FIG. 40]

Next, as shown in FIG. 40, the gate electrode 25 in the shape of embedding the gate opening 21g is formed on the first low-resistance region 15g.

For the processes that are described thus far, the process for patterning the second low-resistance region R may be omitted in the manufacturing procedures that are mentioned using FIG. 26 to FIG. 29 in the ninth embodiment.
[FIG. 41]

Subsequently, as shown in FIG. 41, the source opening 21s and the drain opening 21d that expose the second low-resistance region R at a position where the second low-resistance region R is interposed between are formed by performing a pattern etching of the insulating film 21. Afterward, the isotropic etching is carried out for the second low-resistance region R using the insulating film 21 on which the source opening 21s and the drain opening 21d are formed as a mask. Thereby, the high-resistance region 15b' is exposed on the bottom of each of the source opening 21s and the drain opening 21d, causing the second low-resistance region R to be retreated from sidewalls of the source opening 21s and the drain opening 21d.

It is to be noted that, for the purpose of preventing unintended scraping of the high-resistance region 15b' in this etching process, the second low-resistance region R may be formed using a material different from that for the high-resistance region 15b', or an etching stop layer may be formed between the second low-resistance region R and the high-resistance region 15b' using a semiconductor material different from that for each of these regions.
[FIG. 38]

Thereafter, as shown in FIG. 38, the source electrode 23s and the drain electrode 23d are formed and ohmic-bonded to the high-resistance region 15b' of the top barrier layer 15 with the source opening 21s and the drain opening 21d in between, respectively. On this occasion, by sequentially performing the anisotropic vapor deposition of gold-germanium (AuGe), nickel (Ni), and gold (Au), a hollow portion G is left between a vapor-deposited material film and the second low-resistance region R. Subsequently, these material films are patterned, and further a gold-based alloy is formed by a heating treatment at about 400 degrees centigrade, for example, to form the source electrode 23s and the drain electrode 23d, thereby bringing the semiconductor device 2-3 to completion.
(Advantageous Effects of Semiconductor Device According to Eleventh Embodiment)

In the semiconductor device 2-3 that is configured as described above, it is possible to obtain the same effect as with the ninth embodiment by virtue of a configuration in which the second low-resistance region R that is smaller in the p-type charge amount than the first low-resistance region 15g is provided on both sides of the first low-resistance region 15g in the JPHEMT structure. In addition, the second low-resistance region R covers a wider area, and thus it is possible to achieve the effect of further enlarging a carrier depletion region that is formed on the channel layer 14 at the time of off-operation to further reduce the off-capacitance Coff. Moreover, the semiconductor device 2-3 is configured to avoid a contact between the second low-resistance region R and the source electrode 23s or the drain electrode 23d by etching to partially remove the p-type second low-resistance region R, which also makes it possible to prevent an increase in the contact resistance.

Further, in the manufacturing of the semiconductor device 2-3, the second low-resistance region R is removed by performing isotropic etching in a wet process using the insulating film 21 on which the source opening 21s and the drain opening 21d are provided as a mask, and the anisotropic film formation is carried out in forming the source electrode 23s and the drain electrode 23d. As a result, the source electrode 23s and the drain electrode 23d that avoid a contact with the second low-resistance region R by the use of the hollow portion G are formed in the self-alignment manner. Therefore, it is possible to accurately form the source electrode 23s and the drain electrode 23d in the semiconductor device 2-3 that is configured as described above.

It is to be noted that, in the semiconductor device 2-3 that is configured in such a manner, by leaving the hollow portion G between the second low-resistance region R and the source electrode 23s or the drain electrode 23d, the insulation property between those is assured. However, the following process may be added for the purpose of preventing any foreign material from coming to be mixed in the hollow portion G in the course of the process. More specifically, in a state illustrated in FIG. 41 prior to the formation of the source electrode 23s and the drain electrode 23d, an insulating film is formed with a film thickness of embedding a portion of the second low-resistance region R that is retreated from the sidewalls of the source opening 21s and the drain opening 21d using, for example, the ALD method and the like. Subsequently, the insulating film is etched in the wet process to expose the high-resistance region 15b' with a low damage. Thereafter, the formation of the source electrode 23s and the drain electrode 23d that is described previously is carried out. Such a process makes it possible to achieve the configuration that assures the insulation property between the second low-resistance region R and the source electrode 23s or the drain electrode 23d by means of the insulating film with the embedded hollow portion G, as well as to prevent an adverse influence of mixing of a foreign material in the hollow portion G on the device characteristics.

12. Twelfth Embodiment

Example where High-Resistance Region is Provided on Top of Second Low-Resistance Region FIG. 42 is a cross-sectional view showing a configuration of a substantial part of a semiconductor device according to a twelfth embodiment of the present technology. Hereinafter, with reference to this drawing, the description is provided on a configuration of a semiconductor device 2-4 according to the twelfth embodiment.

(Configuration of Semiconductor Device According to Twelfth Embodiment)

The semiconductor device 2-4 according to the twelfth embodiment that is shown in FIG. 42 is different from the semiconductor device 2-1 according to the ninth embodiment that is described using FIG. 23 in that a high-resistance region 16 is formed on the p-type second low-resistance region R. Otherwise, the configuration is similar to that in the ninth embodiment. Therefore, the same components as those in the ninth embodiment are denoted with the same reference numerals, and the detailed descriptions in this embodiment are omitted as appropriate.

More specifically, the top barrier layer 15 in the semiconductor device 2-4 is configured in such a manner that the second low-resistance region R which configures a surface layer on the opposite side of the channel layer 14 is patterned, and the high-resistance region 16 is layered on this patterned part. The p-type first low-resistance region 15g is provided in depth reaching the second low-resistance region R and the high-resistance region 15b' in the top barrier layer 15 from the high-resistance region 16.

The high-resistance region 16 that is arranged on top of the second low-resistance region R may be small in film thickness. This high-resistance region 16 may be configured of a semiconductor material different from that for the second low-resistance region R as long as such a compound semiconductor is well lattice-matched to the second low-resistance region R. Further, the high-resistance region 16 may include impurities, or may be non-doped. If impurities are included, the high-resistance region 16 may include either p-type impurities or n-type impurities. As the p-type impurities to be included in the high-resistance region 16, carbon (C), zinc (Zn), and magnesium (Mg) are used. As the n-type impurities, silicon (Si) is used. These impurities are selected as appropriate to be used depending on a method of forming the high-resistance region 16.

(Operation and Manufacturing Method of Semiconductor Device According to Twelfth Embodiment)

The semiconductor device 2-4 having the configuration as described above operates in the same manner as with the semiconductor device 2-1 according to the ninth embodiment. Further, for the manufacturing of the semiconductor device 2-4, a layer configuring the high-resistance region 16 may be formed beforehand on the p-type second low-resistance region R in the manufacturing procedures of the semiconductor device 2-1 according to the ninth embodiment, and the high-resistance region 16 and the p-type second low-resistance region R may be patterned using the same mask.

(Advantageous Effects of Semiconductor Device According to Twelfth Embodiment)

In the semiconductor device 2-4 that is configured as described above, it is possible to obtain the same effect as with the first embodiment by virtue of a configuration in which the second low-resistance region R that is smaller in the p-type charge amount than the first low-resistance region 15g is provided on both sides of the first low-resistance region 15g in the JPHEMT structure. In addition, because the high-resistance region 16 is formed on the second low-resistance region R, it is less likely that the second low-resistance region R will be influenced by an interface trap, and a depletion layer between the second low-resistance region R and the channel layer 14 is controlled more easily at the time of off-operation. This makes it possible to surely control the retreating amount of the n-type region Sn and the p-type region Sp at the time of off-operation that is described using FIG. 25 in the effects of the ninth embodiment, resulting in the desired operation being achieved with ease.

It is to be noted that the twelfth embodiment is not limited to application to the ninth embodiment, and may be combined with the tenth or the eleventh embodiment. This makes it possible to also obtain the effects of the tenth or the eleventh embodiment in conjunction with the effects of this embodiment.

13. Thirteenth Embodiment

Example where Second Low-Resistance Region that is Formed by Impurity Diffusion is Provided FIG. 43 is a cross-sectional view showing a configuration of a substantial part of a semiconductor device according to a thirteenth embodiment of the present technology. Hereinafter, with reference to this drawing, the description is provided on a configuration of a semiconductor device 2-5 according to the thirteenth embodiment.
(Configuration of Semiconductor Device According to Thirteenth Embodiment)

The semiconductor device 2-5 according to the thirteenth embodiment that is shown in FIG. 43 is different from the semiconductor device 2-1 according to the ninth embodiment that is described using FIG. 23 in that the second low-resistance region R is formed by impurity diffusion. Otherwise, the configuration is similar to that in the ninth embodiment. Therefore, the same components as those in the ninth embodiment are denoted with the same reference numerals, and the detailed descriptions in this embodiment are omitted as appropriate.

More specifically, the top barrier layer 15 in the semiconductor device 2-5 is configured in such a manner that a surface layer on the opposite side of the channel layer 14 is configured of the high-resistance region 15b', and the first low-resistance region 15g and the second low-resistance region R are formed on a surface layer of this high-resistance region 15b' by means of impurity diffusion.
(Operation and Manufacturing Method of Semiconductor Device According to Thirteenth Embodiment)

The semiconductor device 2-5 having the configuration as described above operates in the same manner as with the semiconductor device 2-1 according to the ninth embodiment. Further, the semiconductor device 2-5 is manufactured in the following manner.

[FIG. 44]

First, as shown in FIG. 44, on the substrate 11, each layer from the buffer layer 12 up to the high-resistance region 15b' is formed. For such processes, the process for forming the second low-resistance region R may be omitted in the manufacturing procedures that are described using FIG. 26 in the ninth embodiment.

[FIG. 45]

Next, as shown in FIG. 45, a mask 30 that may be configured of, for example, silicon nitride is formed on the high-resistance region 15b'. By means of the impurity diffusion through the mask 30, p-type impurities for forming the second low-resistance region R on the surface layer of the high-resistance region 15b' are diffused. On this occasion, by diffusing, for example, zinc (Zn) as the p-type impurities, a diffusion depth is controlled accurately. The diffusion of zinc (Zn) is carried out in the same manner as with the formation of the first low-resistance region 15g in the ninth embodiment. At the end of the diffusion, the mask 30 is removed.

[FIG. 46]

Subsequently, as shown in FIG. 46, the insulating film 21 is formed on the high-resistance region 15b' on which the second low-resistance region R is formed, and the gate opening 21g is formed on the insulating film 21. Afterward, by means of the impurity diffusion through the gate opening 21g, the p-type impurities for forming the first low-resistance region 15g in depth reaching the high-resistance region 15b' are diffused at a center of the second low-resistance region R.

[FIG. 47]

Thereafter, as shown in FIG. 47, the gate electrode 25 in the shape of embedding the gate opening 21g is formed on the first low-resistance region 15g.

[FIG. 43]

Afterward, as shown in FIG. 43, the source opening 21s and the drain opening 21d that expose the high-resistance region 15b' are formed on the insulating film 21, and the source electrode 23s and the drain electrode 23d are formed and ohmic-bonded to the high-resistance region 15b' with the source opening 21s and the drain opening 21d in between respectively, thereby bringing the semiconductor device 2-5 to completion. The processes described above following on the process shown in FIG. 47 may be carried out in the same manner as the processes described following on the process shown in FIG. 28 in the ninth embodiment.
(Advantageous Effects of Semiconductor Device According to Thirteenth Embodiment)

In the semiconductor device 2-5 that is configured as described above, it is possible to obtain the same effect as with the ninth embodiment by virtue of a configuration in which the second low-resistance region R that is smaller in the p-type charge amount than the first low-resistance region 15g is provided on both sides of the first low-resistance region 15g in the JPHEMT structure. In addition, the second low-resistance region R is formed by means of the diffusion, and thus a process for removing the second low-resistance region R using wet etching may be eliminated.

Further, as well as assuring the controllability of patterning of each component part on the top barrier layer 15 that has a substantially flat surface, the source electrode 23s and the drain electrode 23d are ohmic-bonded to the high-resistance region 15b' while avoiding contact with the second low-resistance region R. Thus, it is possible to also reduce a contact resistance.

14. Fourteenth Embodiment

Example where Cap Layer is Provided Between Top Barrier Layer and Source Electrode/Drain Electrode FIG. 48 is a cross-sectional view showing a configuration of a substantial part of a semiconductor device according to a fourteenth embodiment of the present technology. Hereinafter, with reference to this drawing, the description is provided on a configuration of a semiconductor device 2-6 according to the fourteenth embodiment.
(Configuration of Semiconductor Device According to Fourteenth Embodiment)

The semiconductor device 2-6 according to the fourteenth embodiment that is shown in FIG. 48 is different from the semiconductor device 2-1 according to the ninth embodiment that is described using FIG. 23 in that a cap layer 33 is provided between the top barrier layer 15 and the source electrode 23s or the drain electrode 23d. Otherwise, the configuration is similar to that in the ninth embodiment. Therefore, the same components as those in the ninth embodiment are denoted with the same reference numerals, and the detailed descriptions in this embodiment are omitted as appropriate.

More specifically, the cap layer 33 is provided between the top barrier layer 15 and the source electrode 23s or the drain electrode 23d as a layer including impurities (n-type impurities in this case) that are reverse to the first low-resistance region 15g and are the same as the channel layer 14 in conductivity type. This cap layer 33 is configured as a low-resistance region including a certain amount of n-type impurities.

Further, the cap layer 33 is provided in a state of being patterned as a foundation for the source electrode 23s and the drain electrode 23d, and is provided on the second low-resistance region R that is patterned in the same shape as an example in this case. In such a case, a portion of the second low-resistance region R that serves as a foundation for the cap layer 33 is separated from the second low-resistance region R that is provided from the first low-resistance region 15g.

The cap layer 33 as described above may be configured of a compound semiconductor material that is lattice-matched to a portion of the top barrier layer 15 serves as a foundation, and may not be matched to the top barrier layer 15 in a bandgap. However, if the cap layer 33 is different from the top barrier layer 15 that serves as a foundation in the bandgap, a barrier of a potential is formed at a junction, and thus there is a possibility that a resistance at an ohmic junction could rise. Therefore, the bandgap of the cap layer 33 is to be matched to the bandgap of the top barrier layer 15 that serves as a foundation to the extent that the characteristics of the semiconductor device 2-6 are not influenced. When a surface layer (second low-resistance region R in this case) of the top barrier layer 15 is configured of an AlGaAs mixed crystal, the cap layer 33 as described above is configured of, for example, GaAs including n-type impurities.

(Operation and Manufacturing Method of Semiconductor Device According to Fourteenth Embodiment)

The semiconductor device 2-6 having the configuration as described above operates in the same manner as with the semiconductor device 2-1 according to the ninth embodiment. Further, the semiconductor device 2-6 is manufactured in the following manner.

[FIG. 49]

First, as shown in FIG. 49, on the substrate 11, each layer from the buffer layer 12 up to the second low-resistance region R is formed, thereby the top barrier layer 15 is formed. Such processes may be carried out in the same manner as with the manufacturing procedures described using FIG. 26 in the ninth embodiment. Next, following the formation of the top barrier layer 15, a process for subjecting an n-type GaAs layer to be used as the cap layer 33 to epitaxial growth is performed, and subsequently a device isolation region that is omitted in illustration of the drawing is formed by ion implantation of boron.

[FIG. 50]

Next, as shown in FIG. 50, the cap layer 33 is patterned to expose the second low-resistance region R. Thereafter, an exposed circumferential portion of the second low-resistance region R is removed with a desired pattern, and the second low-resistance region R that is exposed from the cap layer 33 and the second low-resistance region R below the cap layer 33 are separated from each other.

[FIG. 51]

Subsequently, as shown in FIG. 51, the insulating film 21 is formed on the top barrier layer 15 in a state of covering the cap layer 33, and the gate opening 21g is formed on the insulating film 21. Afterward, by means of the impurity diffusion through the gate opening 21g, the p-type impurities for forming the first low-resistance region 15g in depth reaching the high-resistance region 15b' are diffused at a center of the second low-resistance region R that is exposed from the cap layer 33.

[FIG. 52]

Thereafter, as shown in FIG. 52, the gate electrode 25 in the shape of embedding the gate opening 21g is formed on the first low-resistance region 15g.

[FIG. 48]

Afterward, as shown in FIG. 48, the source opening 21s and the drain opening 21d that expose the cap layer 33 are formed on the insulating film 21, and the source electrode 23s and the drain electrode 23d are formed and ohmic-bonded to the cap layer 33 with the source opening 21s and the drain opening 21d in between respectively, thereby bringing the semiconductor device 2-6 to completion. The processes described above following on the process shown in FIG. 51 may be carried out in the same manner as the processes described following on the process shown in FIG. 28 in the ninth embodiment.

(Advantageous Effects of Semiconductor Device According to Fourteenth Embodiment)

In the semiconductor device 2-6 that is configured as described above, it is possible to obtain the same effect as with the ninth embodiment by virtue of a configuration in which the second low-resistance region R that is smaller in the p-type charge amount than the first low-resistance region 15g is provided on both sides of the first low-resistance region 15g in the JPHEMT structure. In addition, the semiconductor device 2-6 is configured in such a manner that the n-type cap layer 33 that is the same as the channel layer 14 in conductivity type is provided between the top barrier layer 15 and the source electrode 23s or the drain electrode 23d. Consequently, the cap layer 33 serves as a carrier supply source for the channel layer 14, which makes it possible to increase the sheet carrier concentration of the channel layer 14 directly beneath the cap layer 33, reducing a channel resistance and an access resistance. As a result, it is possible to further reduce the on-resistance Ron, and thus the effect of increasing the maximum drain current Idmax is also expected.

It is to be noted that the fourteenth embodiment is not limited to application to the ninth embodiment, and may be combined with the tenth to the thirteenth embodiments. This makes it possible to also obtain the effects of the respective combined embodiments in conjunction with the effects of this embodiment.

15. Fifteenth Embodiment

Example where Source Electrode and Drain Electrode are Provided on Second Low-Resistance Region FIG. 53 is a cross-sectional view showing a configuration of a substantial part of a semiconductor device according to a fifteenth embodiment of the present technology. Hereinafter, with reference to this drawing, the description is provided on a configuration of a semiconductor device 2-7 according to the fifteenth embodiment.

(Configuration of Semiconductor Device According to Fifteenth Embodiment)

The semiconductor device 2-7 according to the fifteenth embodiment that is shown in FIG. 53 is different from the semiconductor device 2-1 according to the ninth embodiment that is described using FIG. 23 in that the source electrode 23s and the drain electrode 23d are formed on the second low-resistance region R. Otherwise, the configuration is similar to that in the ninth embodiment. Therefore, the same components as those in the ninth embodiment are denoted with the same reference numerals, and the detailed descriptions in this embodiment are omitted as appropriate.

More specifically, on the top barrier layer 15 in the semiconductor device 2-7, the second low-resistance region R is left below the source electrode 23s and the drain electrode 23d.

(Operation and Manufacturing Method of Semiconductor Device According to Fifteenth Embodiment)

The semiconductor device 2-7 having the configuration as described above operates in the same manner as with the semiconductor device 2-1 according to the ninth embodiment. Further, for the manufacturing of the semiconductor device 2-7, the patterning of the second low-resistance region R may be in the shape in which the second low-resistance region R is left below the source electrode 23s and the drain electrode 23d in the manufacturing procedures of the semiconductor device 2-1 described in the ninth embodiment.

(Advantageous Effects of Semiconductor Device According to Fifteenth Embodiment)

In the semiconductor device 2-7 that is configured as described above, the second low-resistance region R that is smaller in the p-type charge amount than the first low-resistance region 15g is provided over a whole region of the first low-resistance region 15g in the JPHEMT structure. In addition, the second low-resistance region R covers a wider area, and thus it is possible to obtain the effect of further enlarging a carrier depletion region A that is formed on the channel layer 14 at the time of off-operation to further reduce the off-capacitance Coff. Therefore, the effect of reducing the off-capacitance Coff is greater as compared with the ninth embodiment.

It is to be noted that, in the semiconductor device 2-7 according to this embodiment, the source electrode 23s and the drain electrode 23d are ohmic-bonded to the second low-resistance region R, and thus there is a possibility that a contact resistance will increase slightly. However, it is possible to reduce the additional resistance by optimizing alloy conditions at the time of ohmic-bonding.

It is to be noted that the fifteenth embodiment is not limited to application to the ninth embodiment, and may be combined with the tenth to the fourteenth embodiments. This makes it possible to also obtain the effects of the respective combined embodiments in conjunction with the effects of this embodiment.

16. Sixteenth Embodiment

Example where Source Region and Drain Region are Provided in Laminated Body

FIG. 54 is a cross-sectional view showing a configuration of a substantial part of a semiconductor device according to a sixteenth embodiment of the present technology. Hereinafter, with reference to this drawing, the description is provided on a configuration of a semiconductor device 2-8 according to the sixteenth embodiment.

(Configuration of Semiconductor Device According to Sixteenth Embodiment)

The semiconductor device 2-8 according to the sixteenth embodiment that is shown in FIG. 54 is different from the semiconductor device 2-1 according to the ninth embodiment that is described using FIG. 23 in that a source region 35s and a drain region 35d are provided in depth reaching the buffer layer 12 from the top barrier layer 15. Otherwise, the configuration is similar to that in the ninth embodiment. Therefore, the same components as those in the ninth embodiment are denoted with the same reference numerals, and the detailed descriptions in this embodiment are omitted as appropriate.

More specifically, in the semiconductor device 2-8, the source region 35s is provided in the laminated body 10 below the source electrode 23s, and the drain region 35d is provided in the laminated body 10 below the drain electrode 23d. The source region 35s and the drain region 35d are provided as impurity regions in depth reaching the buffer layer 12 from the top barrier layer 15 and reaching at least the channel layer 14 at the outside of the patterned second low-resistance region R. Each of the source region 35s and the drain region 35d includes impurities that are the same as those of the channel layer 14 in conductivity type, and is configured as the n-type impurity region in this case.

The source electrode 23s and the drain electrode 23d are ohmic-bonded to the source region 35s and the drain region 35d, respectively.

(Operation and Manufacturing Method of Semiconductor Device According to Sixteenth Embodiment)

The semiconductor device 2-8 as described above operates in the same manner as with the semiconductor device 2-1 according to the ninth embodiment. Further, for the manufacturing of the semiconductor device 2-8 after patterning of the second low-resistance region R, as described using FIG. 27 in the manufacturing procedures of the semiconductor device 2-1 according to the ninth embodiment, a process in which the source region 35s and the drain region 35d are formed by diffusing the n-type impurities in the ion implantation method may be added.

(Advantageous Effects of Semiconductor Device According to Sixteenth Embodiment)

In the semiconductor device 2-8 that is configured as described above, it is possible to obtain the same effect as with the ninth embodiment by virtue of a configuration in which the second low-resistance region R that is smaller in the p-type charge amount than the first low-resistance region 15g is provided on both sides of the first low-resistance region 15g in the JPHEMT structure. In addition, the n-type source region 35s and the drain region 35d in depth reaching the channel layer 14 are provided in a state where the second low-resistance region R is interposed between, which makes it possible to raise the sheet carrier concentration on both sides of the channel layer 14 directly beneath the second low-resistance region R. Further, it is also possible to reduce a contact resistance of the source electrode 23s or the drain electrode 23d to the top barrier layer 15, which allows a channel resistance and an access resistance to be reduced. This makes it possible to further reduce the on-resistance Ron, as well as to increase the maximum drain current Idmax.

It is to be noted that the sixteenth embodiment is not limited to application to the ninth embodiment, and may be combined with the tenth to the fifteenth embodiments. This makes it possible to also obtain the effects of the respective combined embodiments in conjunction with the effects of the sixteenth embodiment.

17. Modification Example 1

In the first to the sixteenth embodiments that are described thus far, it is assumed that each layer made of a compound semiconductor that is formed on top of the substrate 11 is lattice-matched between each layer. However, the present technology is not limited to such a configuration, and each layer made of a compound semiconductor that is formed on top of the substrate 11 may be configured of a compound semiconductor layer that is grown by a pseudomorphic technique or a compound semiconductor layer with a different lattice constant that is grown by a metamorphic technique. For example, on the substrate 11 that is configured of GaAs, a layer that is formed in a manner of subjecting a compound semiconductor that is different from GaAs in the lattice constant to metamorphic growth may be used as the channel layer 14.

18. Modification Example 2

Further, in the above-described first to the sixteenth embodiments, the description is provided on the semiconductor devices 1-1 to 1-8 and 2-1 to 2-8 each of which adopts a so-called JPHEMT structure where the first low-resistance region 15g of a reverse-conductivity type is provided inside the top barrier layer 15. However, if it is possible to modulate a band of the second low-resistance region R, other configurations may be adopted. For example, the present technology is not limited to the JPHEMT structure, and may be applicable to a semiconductor device having other configurations, such as JFET (Junction FET) that uses an impurity layer as a channel and MISJPHEMT (Metal-Insulator-Semiconductor JPHEMT) that includes an insulating film between a top barrier layer and a gate electrode.

FIG. 55 shows a cross-sectional configuration of a substantial part of a semiconductor device having a JFET structure. This semiconductor device 1-9 has the laminated body 10 including the channel layer 14 that is configured of a compound semiconductor, and the gate electrode 25 that is provided on the top surface side of the laminated body 10.

More specifically, in the semiconductor device 1-9, the buffer layer 12 and the channel layer 14 each of which is configured of a compound semiconductor material are laminated in this order on the substrate 11 that is configured of a compound semiconductor. The buffer layer 12 and the channel layer 14 configure the laminated body 10. On the laminated body 10, as with the first embodiment, the source electrode 23s, the drain electrode 23d, and the gate electrode 25 are provided with the insulating film 21 interposed between.

Further, in this semiconductor device 1-9, the laminated body 10 has the first low-resistance region 15g that is provided on the top surface side of the laminated body 10 and faces the gate electrode 25, and the second low-resistance region R that is provided externally of the first low-resistance region 15g and is continuous with the first low-resistance region 15g. This makes it possible to reduce the off-capacitance in the semiconductor device 1-9.

It is to be noted that FIG. 55 illustrates a case where the end ER of the second low-resistance region R is located on the outer side from the end E25 of the gate electrode 25. However, the end ER of the second low-resistance region R may not be necessarily located on the outer side from the end E25 of the gate electrode 25.

The channel layer 14 may be, for example, an n-type impurity region, and each of the first low-resistance region 15g and the second low-resistance region R may be, for example, a p-type impurity region. It is to be noted that a conductivity type of the channel layer 14 may be reverse to a conductivity type each of the first low-resistance region 15g and the second low-resistance region R.

FIG. 56 shows a cross-sectional configuration of a substantial part of a semiconductor device having an MIS-JPHEMT structure. This semiconductor device 1-10 has the laminated body 10 including the channel layer 14 that is configured of a compound semiconductor, and the gate electrode 25 that is provided on the top surface side of the laminated body 10.

More specifically, in the semiconductor device 1-10, the buffer layer 12, the bottom barrier layer 13, the channel layer 14, and the top barrier layer 15 each of which is configured of a compound semiconductor material are laminated in this order on the substrate 11 that is configured of a compound semiconductor. Each layer from the buffer layer 12 up to the top barrier layer 15 configures the laminated body 10. On the laminated body 10, as with the first embodiment, the source electrode 23s, the drain electrode 23d and the gate electrode 25 are provided with the insulating film 21 interposed between. A gate insulating film 26 is provided between the top barrier layer 15 and the gate electrode 25.

Further, in this semiconductor device 1-10, the laminated body 10 has the first low-resistance region 15g that is provided on the top surface side of the laminated body 10 and faces the gate electrode 25, and the second low-resistance region R that is provided externally of the first low-resistance region 15g and is continuous with the first low-resistance region 15g. This makes it possible to reduce the off-capacitance in the semiconductor device 1-10.

It is to be noted that FIG. 55 or FIG. 56 illustrates a case where a single gate electrode 25 is provided between the source electrode 23s and the drain electrode 23d. However, as with the ninth to the sixteenth embodiments, this modification example is also applicable to a multigate structure in which two or more gate electrodes 25 are provided between the source electrode 23s and the drain electrode 23d.

19. Modification Example 3

Further, in the above-described ninth embodiment, as shown in FIG. 57 as an enlarged view, the description is provided on a case where device parameters (Lgs, Lgd, and Lgg) at the folded-back part 25A are the same as those at the linear part 25B. However, the device parameters at the folded-back part 25A may be different from those at the linear part 25B. For example, as shown in FIG. 58, it is also possible to make device parameters LgsA, LgdA, and LggA at the folded-back part 25A wider than device parameters LgsB, LgdB, and LggB at the linear part 25B. The folded-back part 25A has an insignificant influence on the on-resistance Ron, but has a certain degree of influence on the off-capacitance Coff. Therefore, by making the device parameters LgsA, LgdA, and LggA at the folded-back part 25A wider than the device parameters LgsB, LgdB, and LggB at the linear part 25B, as shown in FIG. 35, it is possible to reduce the off-capacitance Coff, as well as to reduce Ron*Coff. It is to be noted that each of FIG. 57 and FIG. 58 shows a case where three gate electrodes 25 are provided between the source electrode 23s and the drain electrode 23d.

20. Application Examples

Antenna Switch Circuit and Radio Communication Apparatus

The semiconductor devices described thus far in the respective embodiments may be used in, for example, a radio communication apparatus in a mobile communication system and the like, and specifically may be used as an antenna switch for such an apparatus. The above-described semiconductor devices are particularly effective for such a radio communication apparatus with the communication frequencies at UHF (Ultra High Frequency) band or higher.

More specifically, when any of the semiconductor devices described in the first to the sixteenth embodiments that have the low off-capacitance Coff and superior harmonic distortion characteristics is used for the antenna switch in the radio communication apparatus, it is possible to achieve reduction in size and power consumption of the radio communication apparatus. In particular, in a mobile communication terminal, operation time duration is lengthened because of reduction in size and power consumption of the apparatus, which allows the portability to be improved.

FIG. 59 shows an example of an antenna switch circuit. This antenna switch circuit 3-1, which is used for a mobile communication system such as a mobile phone, may have, for example, a first terminal IN, a second terminal IO, a third terminal OUT, a first switching device SW1, and a second switching device SW2.

The first terminal IN receives a transmitting signal as an input. The second terminal IO is connected with an antenna. The third terminal OUT outputs a receiving signal that is received at the antenna. The first switching device SW1 is connected between the first terminal IN and the second terminal IO. The second switching device SW2 is connected between the second terminal IO and the third terminal OUT. One or both of the first switching device SW1 and the second switching device SW2 are configured of any of the semiconductor devices 1-1 to 1-8 according to the first to the eighth embodiments.

A third switching device SW3 is connected between the first terminal IN and a power supply (a ground in this example). A fourth switching device SW4 is connected between the third terminal OUT and the power supply (the ground in this example). One or both of the third switching device SW3 and the fourth switching device SW4 are configured of any of the semiconductor devices 1-1 to 1-8 according to the first to the eighth embodiments.

In this antenna switch circuit 3-1, at the time of signal transmission, that is, when a transmitting signal is output from a transmitting system of the radio communication apparatus to the antenna, the first switching device SW1 and the fourth switching device SW4 are put in a conduction state, and the second switching device SW2 and the third switching device SW3 are put in a non-conduction state. At this time, a transmitting signal is input from the first terminal IN, and is output to the second terminal IO via the first switching device SW1.

At the time of signal reception, that is, when a signal received at the antenna is input to a receiving system of the radio communication apparatus, the first switching device SW1 and the fourth switching device SW4 are put in a non-conduction state, and the second switching device SW2 and the third switching device SW3 are put in a conduction state. At this time, a receiving signal received at the antenna is input from the second terminal IO, and is output to the third terminal OUT via the second switching device SW2.

FIG. 60 shows another example of the antenna switch circuit. In this antenna switch circuit 3-2, at least one of the first to the fourth switching devices SW1 to SW4 is configured of, for example, any of the semiconductor devices 1-1 to 1-8 according to the first to the eighth embodiments that are multistage connected (for example, two-stage connected in FIG. 60). This allows the power durability to be improved in the antenna switch circuit 3-2.

More specifically, the first switching device SW1 is configured in such a manner that a plurality of any of the semiconductor devices 1-1 to 1-8 each of which has a single gate electrode 25 between the source electrode 23s and the drain electrode 23d are connected in series. The first switching device SW1 has a stack structure in which the source electrode 23s, the gate electrode 25, the drain electrode 23d, the source electrode 23s, the gate electrode 25, and the drain electrode 23d are arranged in this order. The same is true for the second to the fourth switching devices SW2 to SW4.

FIG. 61 shows still another example of the antenna switch circuit. In this antenna switch circuit 3-3, at least one of the first to the fourth switching devices SW1 to SW4 is configured of any of the semiconductor devices 2-1 to 2-8 according to the ninth to the sixteenth embodiments. This allows the power durability to be improved in the antenna switch circuit 3-3.

FIG. 62 shows further still another example of the antenna switch circuit. In this antenna switch circuit 3-4, at least one of the first to the fourth switching devices SW1 to SW4 is configured of, for example, any of the semiconductor devices 2-1 to 2-8 according to the ninth to the sixteenth embodiments that are multistage connected (for example, two-stage connected in FIG. 62). This allows the power durability to be further improved in the antenna switch circuit 3-4.

More specifically, the first switching device SW1 is configured in such a manner that a plurality of any of the semiconductor devices 2-1 to 2-8 each of which has two or more gate electrodes 25 between the source electrode 23s and the drain electrode 23d are connected in series. The first switching device SW1 has a stack structure in which the source electrode 23s, the gate electrode 25, the gate electrode 25, the drain electrode 23d, the source electrode 23s, the gate electrode 25, the gate electrode 25, and the drain electrode 23d are arranged in this order. The same is true for the second to the fourth switching devices SW2 to SW4.

FIG. 63 shows an example of the radio communication apparatus. This radio communication apparatus 4-1 is a mobile phone system having multiple functions including, for example, voice and data communication and LAN communication. The radio communication apparatus 4-1 may have, for example, an antenna ANT, an antenna switch circuit 3, a high-power amplifier HPA, a high-frequency integrated circuit RFIC (Radio Frequency Integrated Circuit), a baseband section BB, a voice output section MIC, a data output section DT, and an interface section I/F (for example, wireless LAN (W-LAN: Wireless Local Area Network), Bluetooth (registered trademark), and the like). The antenna switch circuit 3 is configured of any of the antenna switch circuits 3-1 to 3-4 illustrated in FIG. 59 to FIG. 62. The high-frequency integrated circuit RFIC and the baseband section BB are connected with each other via the interface section I/F.

In this radio communication apparatus 4-1, at the time of signal transmission, that is, when a transmitting signal is output from a transmitting system of the radio communication apparatus 4-1 to the antenna ANT, a transmitting signal that is output from the baseband section BB is output to the antenna ANT via the high-frequency integrated circuit RFIC, the high-power amplifier HPA, and the antenna switch circuit 3.

At the time of signal reception, that is, when a signal received at the antenna ANT is input to a receiving system of the radio communication apparatus 4-1, a receiving signal is input to the baseband section BB via the antenna switch circuit 3 and the high-frequency integrated circuit RFIC. The signal that is processed in the baseband section BB is output from the output sections, such as the voice output section MIC, the data output section DT, and the interface section I/F.

The present technology is described thus far with reference to some embodiments. However, the present technology is not limited to the above-described embodiments and the like, and various modifications may be made.

For example, in the above-described embodiments, the description is provided specifically on the configurations of the semiconductor devices 1-1 to 1-8 and 2-1 to 2-8, the antenna switch circuits 3-1 to 3-4, and the radio communication apparatus 4-1. However, the semiconductor devices 1-1 to 1-8 and 2-1 to 2-8, the antenna switch circuits 3-1 to 3-4, and the radio communication apparatus 4-1 are not limited to those that are provided with all of the component parts illustrated in the drawings. Further, some component parts may be replaced with any other component parts.

Further, materials and thicknesses of respective layers, or film-forming methods, film-forming conditions described in the above-described embodiments are not limited. Other materials and thicknesses may be used, or other film-forming methods and film-forming conditions may be permitted.

It is possible to achieve at least the following configurations from the above-described example embodiments of the disclosure.

(1) A semiconductor device including:
a laminated body including a channel layer that is configured of a compound semiconductor; and
at least one gate electrode that is provided on a top surface side of the laminated body,
wherein the laminated body includes
a first low-resistance region that is provided on the top surface side of the laminated body, the first low-resistance region facing the at least one gate electrode, and
a second low-resistance region that is provided externally of the first low resistance region on the top surface side of the laminated body, the second low-resistance region being continuous with the first low-resistance region.

(2) The semiconductor device according to (1), wherein the first low-resistance region includes an impurity of a second conductivity type reverse to a first conductivity type of a carrier traveling in the channel layer, and
the second low-resistance region is smaller than the first low-resistance region in a charge amount per unit length of the second conductivity type.

(3) The semiconductor device according to (2), wherein the second low-resistance region is lower than the first low-resistance region in an impurity concentration of the second conductivity type.

(4) The semiconductor device according to (2) or (3), wherein the second low-resistance region is smaller than the first low-resistance region in thickness.

(5) The semiconductor device according to any one of (1) to (4), further including a source electrode and a drain electrode provided on the top surface side of the laminated body, wherein
the at least one gate electrodes includes two or more gate electrodes, and
the two or more gate electrodes are provided between the source electrode and the drain electrode.

(6) The semiconductor device according to (5), wherein each of the source electrode and the drain electrode has a comb-like shape,
the source electrode and the drain electrode are interdigitated with a clearance in a planar shape, and
each of the two or more gate electrodes is shaped to meander through the clearance in a planar shape.

(7) The semiconductor device according to (6), wherein the source electrode and the drain electrode each include a plurality of combtooth portions,
each of the two or more gate electrodes has a folded-back part along a front edge of each of the plurality of combtooth portions, and
the folded-back part has a planar shape including curves.

(8) The semiconductor device according to any one of (5) to (7), wherein the second low-resistance region is provided continuously among the two or more gate electrodes.

(9) The semiconductor device according to any one of (1) to (8), wherein
the laminated body includes the channel layer and a barrier layer provided on a top side of the channel layer, and
the barrier layer is configured of a compound semiconductor in which an energy band on a carrier-traveling side at a junction with the channel layer is farther from an intrinsic Fermi level within the channel layer than the channel layer.

(10) The semiconductor device according to (9), further including a barrier layer provided on a bottom side of the channel layer, wherein
the barrier layer is configured of a compound semiconductor in which an energy band on a carrier-traveling side at a junction with the channel layer is farther from an intrinsic Fermi level within the channel layer than the channel layer.

(11) The semiconductor device according to (9) or (10), wherein
the channel layer is configured of an InGaAs mixed crystal that is a group-III-V compound semiconductor, and
the barrier layer is configured of an In(AlGa)AsP mixed crystal that is a group-III-V compound semiconductor.

(12) The semiconductor device according to any one of (1) to (11), wherein the second low-resistance region is provided in a region excluding the first low-resistance region of a top surface of the laminated body.

(13) The semiconductor device according to any one of (1) to (12), further including a high-resistance region provided on the second low-resistance region.

(14) The semiconductor device according to any one of (1) to (13), wherein in an off-state where a voltage is applied to the at least one gate electrode, a carrier inside the channel layer beneath the second low-resistance region and a charge of a conductivity type reverse to a conductivity type of a carrier inside the second low-resistance region are depleted.

(15) The semiconductor device according to any one of (1) to (14), wherein the channel layer is provided on a substrate that is configured of GaAs.

(16) The semiconductor device according to (15), wherein the channel layer is formed by subjecting a compound semiconductor that is different from GaAs in a lattice constant to metamorphic growth on the substrate.

(17) An antenna switch circuit including:
a first terminal configured to receive a transmission signal as an input;
a second terminal that is connected with an antenna;
a third terminal configured to output a receiving signal that is received at the antenna;
a first switching device that is connected between the first terminal and the second terminal; and
a second switching device that is connected between the second terminal and the third terminal, wherein
the first switching device is put in a condition state and the second switching device is put in a non-conduction state at the time of signal transmission, while the first switching device is put in a non-conduction state and the second switching device is put in a conduction state at the time of signal reception, and one or both of the first switching device and the second switching device include a laminated body including a channel layer that is configured of a compound semiconductor, and at least one gate electrode that is provided on a top surface side of the laminated body, wherein the laminated body includes a first low-resistance region that is provided on the top surface side of the laminated body, the first low-resistance region facing the at least one gate electrode, and a second low-resistance region that is provided externally of the first low resistance region on the top surface side of the laminated body, the second low-resistance region being continuous with the first low-resistance region.

(18) The antenna switch circuit according to (17), wherein one or both of the first switching device and the second switching device have a multigate structure.

(19) The antenna switch circuit according to (17) or (18), wherein one or both of the first switching device and the second switching device are configured by a plurality of switching devices that are multistage connected.

(20) A radio communication apparatus provided with an antenna and an antenna switch circuit configured to perform switching of input of a transmitting signal to the antenna or output of a receiving signal that is received at the antenna, the antenna switch circuit including:

a first terminal configured to receive a transmission signal as an input;

a second terminal that is connected with an antenna;

a third terminal configured to output a receiving signal that is received at the antenna;

a first switching device that is connected between the first terminal and the second terminal; and a second switching device that is connected between the second terminal and the third terminal, wherein the first switching device is put in a condition state and the second switching device is put in a non-conduction state at the time of signal transmission, while the first switching device is put in a non-conduction state and the second switching device is put in a conduction state at the time of signal reception, and one or both of the first switching device and the second switching device include a laminated body including a channel layer that is configured of a compound semiconductor, and at least one gate electrode that is provided on a top surface side of the laminated body, wherein the laminated body includes a first low-resistance region that is provided on the top surface side of the laminated body, the first low-resistance region facing the at least one gate electrode, and a second low-resistance region that is provided externally of the first low resistance region on the top surface side of the laminated body, the second low-resistance region being continuous with the first low-resistance region.

(21) A method of manufacturing semiconductor device, the method including:

forming a laminated body including a channel layer that is configured of a compound semiconductor; and forming at least one gate electrode that is provided on a top surface side of the laminated body, wherein a first top-surface region and a second top-surface region are provided on the top surface side of the laminated body, the first top-surface region facing the at least one gate electrode, and the second top-surface region being a region excluding the first top-surface region of a top surface of the laminated body, and a first low-resistance region is provided in the first top-surface region and a second low-resistance region is provided in at least part of the second top-surface region.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a laminated body with a high resistance layer at a top surface side thereof;
   at least one gate electrode;
   a first low-resistance region at a top surface side of the high resistance layer, the first low-resistance region overlapped by the gate electrode,
   a second low-resistance region laterally disposed from and external to the first low resistance region and at the top surface side of the high resistance layer; and
   a channel layer, the high resistance layer being between the channel layer and the at least one gate electrode, the first low-resistance region being between the channel layer and the at least one gate electrode.

2. The semiconductor device according to claim 1, wherein:
   the laminated body includes a channel layer;
   the first low-resistance region includes an impurity of a second conductivity type reverse to a first conductivity type of a carrier traveling in the channel layer; and
   the second low-resistance region is smaller than the first low-resistance region in a charge amount per unit length of the second conductivity type.

3. The semiconductor device according to claim 2, wherein the second low-resistance region has an impurity concentration of the second conductivity type that is lower than that of the of the first low-resistance region.

4. The semiconductor device according to claim 2, wherein the second low-resistance region is thinner than the first low-resistance region in a lamination direction of the laminated body.

5. The semiconductor device according to claim 1, further comprising a source electrode and a drain electrode on the top surface side of the laminated body, wherein:
   the at least one gate electrode includes two or more gate electrodes, and
   the two or more gate electrodes are between the source electrode and the drain electrode.

6. The semiconductor device according to claim 5, wherein:
   each of the source electrode and the drain electrode has a comb-like shape,
   the source electrode and the drain electrode are interdigitated with a clearance in a planar shape, and
   each of the two or more gate electrodes is shaped to meander through the clearance in a planar shape.

7. The semiconductor device according to claim 6, wherein:
   the source electrode and the drain electrode each include a plurality of comb tooth portions, each of the two or more gate electrodes has a folded-back part along a front edge of each of the plurality of combtooth portions, and each folded-back part has a planar shape including curves.

8. The semiconductor device according to claim 5, wherein the first low-resistance region is continuous under the two or more gate electrodes.

9. The semiconductor device according to claim 1, wherein the second low-resistance region is overlapped by the at least one gate electrode.

10. The semiconductor device according to claim 1, wherein, in cross section, the second low-resistance region is comprised of two regions, and the first low-resistance layer is between the two regions of the second low-resistance region.

11. The semiconductor device according to claim 1, wherein in an off-state where a voltage is applied to the at least one gate electrode, a carrier inside the channel layer beneath the second low-resistance region and a charge of a conductivity type reverse to a conductivity type of a carrier inside the second low-resistance region are depleted.

12. The semiconductor device according to claim 1, wherein the channel layer is on a substrate that is composed of GaAs.

13. The semiconductor device according to claim 12, wherein the channel layer is formed by subjecting a compound semiconductor that is different from GaAs in a lattice constant to metamorphic growth on the substrate.

14. The semiconductor device of claim 1, wherein the first and second low-resistance regions are in contact with each other.

15. A semiconductor device comprising:
a laminated body with a high resistance layer at a top surface side thereof;
at least one gate electrode;
a first low-resistance region at a top surface side of the high resistance layer, the first low-resistance region overlapped by the gate electrode;
a second low-resistance region laterally disposed from and external to the first low resistance region and at the top surface side of the high resistance layer;
a channel layer; and
a barrier layer between the at least one gate electrode and the channel layer,
wherein,
the barrier layer is composed of a compound semiconductor in which an energy band on a carrier-traveling side at a junction with the channel layer is farther from an intrinsic Fermi level within the channel layer than is that of the channel layer.

16. The semiconductor device according to claim 15, further comprising a second barrier layer with the channel layer between the first and second barrier layers, wherein the second barrier layer is composed of a compound semiconductor in which an energy band on a carrier-traveling side at a junction with the channel layer is farther from an intrinsic Fermi level within the channel layer than is that of the channel layer.

17. The semiconductor device according to claim 15, wherein:
the channel layer is composed of an InGaAs mixed crystal that is a group-III-V compound semiconductor, and
the barrier layer is composed of an In(AlGa)AsP mixed crystal that is a group-III-V compound semiconductor.

18. An antenna switch circuit comprising:
a first terminal configured to receive a transmission signal as an input;
a second terminal connected with an antenna;
a third terminal configured to output a receiving signal that is received at the antenna;
a first switching device connected between the first terminal and the second terminal; and
a second switching device connected between the second terminal and the third terminal,
wherein,
the first switching device is put in a conduction state and the second switching device is put in a non-conduction state at the time of signal transmission, while the first switching device is put in a non-conduction state and the second switching device is put in a conduction state at the time of signal reception, and
the first switching device, the second switching device, or each includes (a) a laminated body with a high resistance layer at a top surface side thereof, and (b) at least one gate electrode, and
each laminated body includes (a) a first low-resistance region at the top surface side of the high resistance layer, the first low-resistance region overlapped by the gate electrode, (b) a second low-resistance region laterally disposed from and external to the first low resistance region and at the top surface side of the high resistance layer, and (c) a channel layer, the high resistance layer being between the channel layer and the at least one gate electrode, the first low-resistance region being between the channel layer and the at least one gate electrode.

19. The antenna switch circuit according to claim 18, wherein the first switching device, the second switching device or each has a multigate structure.

20. The antenna switch circuit according to claim 18, wherein the first switching device, the second switching device or each includes a plurality of switching devices that are multistage connected.

21. A radio communication apparatus with an antenna and an antenna switch circuit configured to perform switching of input of a transmitting signal to the antenna or output of a receiving signal that is received by the antenna, the antenna switch circuit comprising:
a first terminal configured to receive a transmission signal as an input;
a second terminal connected with an antenna;
a third terminal configured to output a receiving signal that is received at the antenna;
a first switching device connected between the first terminal and the second terminal; and
a second switching device connected between the second terminal and the third terminal,
wherein,
the first switching device is in a conduction state and the second switching device is in a non-conduction state at the time of signal transmission, while the first switching device is in a non-conduction state and the second switching device is in a conduction state at the time of signal reception,
the first switching device, the second switching device, or each includes (a) a laminated body with a high resistance layer at a top surface side thereof, and (b) at least one gate electrode, and
each laminated body includes (a) a first low-resistance region at a top surface side of the high resistance layer, the first low-resistance region overlapped by the gate electrode, (b) a second low-resistance region laterally disposed from and external to the first low resistance region and at the top surface side of the high resistance layer, and (c) a channel layer, the high resistance layer being between the channel layer and the at least one gate electrode, the first low-resistance region being between the channel layer and the at least one gate electrode.

\* \* \* \* \*